(12) United States Patent
Takahashi

(10) Patent No.: US 8,742,559 B2
(45) Date of Patent: Jun. 3, 2014

(54) MANUFACTURING METHOD OF SEMICONDUCTOR DEVICE, AND SEMICONDUCTOR DEVICE

(75) Inventor: Noriyuki Takahashi, Nanae (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 13/419,899

(22) Filed: Mar. 14, 2012

(65) Prior Publication Data
US 2012/0235308 A1  Sep. 20, 2012

(30) Foreign Application Priority Data

Mar. 16, 2011  (JP) ................. 2011-057832

(51) Int. Cl.
*H01L 23/02* (2006.01)
*H01L 23/495* (2006.01)
*H01L 31/048* (2014.01)
*H01L 23/40* (2006.01)

(52) U.S. Cl.
CPC ....... *H01L 31/048* (2013.01); *H01L 2023/4031* (2013.01); *H01L 2225/06582* (2013.01)
USPC .............. 257/678; 257/80; 257/81; 257/82; 257/419; 257/434; 257/667; 257/690; 257/696; 257/698; 257/700; 257/705; 257/708; 257/711; 257/777; 257/790; 438/15; 438/26; 438/51; 438/64; 438/106; 438/108; 438/112; 438/116; 438/119; 438/123; 438/127

(58) Field of Classification Search
CPC ..................... H01L 31/048; H01L 2023/4031; H01L 2225/06582
USPC .............. 257/80–82, 99, 419, 434, 734, 666, 257/677, 678, 684, 680, 686–690, 696–698, 257/699, 700–705, 708–711, 777–790, 257/692–694, 795, E27.161, E23.039, 257/E23.04, E23.06, E23.063, E23.169, 257/E23.178, E21.503, E21.511, E23.038, 257/E29.324, E23.174, E23.181, E21.499; 438/15, 25, 26, 51, 64, 106, 108, 112, 438/116, 119, 121, 123–127
See application file for complete search history.

(56) References Cited

U.S. PATENT DOCUMENTS

| | | | |
|---|---|---|---|
| 4,831,212 A * | 5/1989 | Ogata et al. | 174/546 |
| 5,317,107 A * | 5/1994 | Osorio | 257/659 |
| 2005/0062067 A1* | 3/2005 | Kunda et al. | 257/202 |
| 2006/0001893 A1 | 1/2006 | Liang | |

(Continued)

FOREIGN PATENT DOCUMENTS

| | | |
|---|---|---|
| JP | 2006-023740 A | 1/2006 |
| JP | 2007-019154 A | 1/2007 |

*Primary Examiner* — Jae Lee
*Assistant Examiner* — Junaiden Mirsalahuddin
(74) *Attorney, Agent, or Firm* — Mattingly & Malur, PC

(57) ABSTRACT

To suppress the reduction in reliability of a resin-sealed semiconductor device. A first cap (member) and a second cap (member) with a cavity (space formation portion) are superimposed and bonded together to form a sealed space. A semiconductor including a sensor chip (semiconductor chip) and wires inside the space is manufactured in the following way. In a sealing step of sealing a joint part between the caps, a sealing member is formed of resin such that an entirety of an upper surface of the second cap and an entirety of a lower surface of the first cap are respectively exposed. Thus, in the sealing step, the pressure acting in the direction of crushing the second cap can be decreased.

10 Claims, 56 Drawing Sheets

(56) References Cited

U.S. PATENT DOCUMENTS

| | | | |
|---|---|---|---|
| 2008/0017940 A1* | 1/2008 | Yang | 257/432 |
| 2008/0099891 A1* | 5/2008 | Kato et al. | 257/666 |
| 2009/0159997 A1* | 6/2009 | Okudo et al. | 257/415 |
| 2009/0230487 A1 | 9/2009 | Saitoh et al. | |
| 2010/0224945 A1* | 9/2010 | Takahata et al. | 257/415 |
| 2011/0084118 A1* | 4/2011 | Wada et al. | 228/175 |

* cited by examiner

MANUFACTURING METHOD OF SEMICONDUCTOR DEVICE, AND SEMICONDUCTOR DEVICE

CROSS-REFERENCE TO RELATED APPLICATIONS

The disclosure of Japanese Patent Application No. 2011-57832 filed on Mar. 16, 2011 including the specification, drawings and abstract is incorporated herein by reference in its entirety.

BACKGROUND

The present invention relates to semiconductor devices and manufacturing techniques thereof, and more particularly, to a technique effectively applied to a semiconductor device including a sensor chip covered with a sealing member formed of resin.

Japanese Unexamined Patent Publication No. 2006-237405 (Patent Document 1) discloses an electronic component including a dam arranged to enclose an element functional portion, a cap joined to the dam to form a void therein, and a sealing resin for sealing the surroundings of the dam and the cap.

Japanese Unexamined Patent Publication No. 2007-19154 (Patent Document 2) discloses a semiconductor device including a sound pressure sensor chip (semiconductor chip). As disclosed in Patent Document 1, a semiconductor chip mounted on a stage is covered with a chip cover, and is arranged in the void inside the chip cover. The chip cover is covered with a resin mold portion, so that the stage is integrally fixed to the chip cover. At this time, a part of the chip cover is exposed from the resin mold portion.

RELATED ART DOCUMENTS

Patent Documents

[Patent Document 1]
Japanese Unexamined Patent Publication No. 2006-237405
[Patent Document 2]
Japanese Unexamined Patent Publication No. 2007-19154

SUMMARY

Some packages for semiconductor devices include a semiconductor chip, such as a sensor chip, arranged in a space formed in a sealing member. Such a package generally uses the so-called ceramic package, which uses ceramic as the sealing member. The inventors in the present application have studied resin-sealed semiconductor devices (plastic packages) which uses resin, such as a resin plastic, as the sealing member in order to reduce the manufacturing cost of the semiconductor device as compared to a ceramic package, and then as a result found the following problems.

In the resin-sealed semiconductor device, the semiconductor chip as a sensor chip is mounted in the sealing member. In this case, when the sealing member is brought into contact with the sensor chip, the stress generated by the sealing member affects the sensor chip depending on usage environment, which would degrade the reliability (sensing characteristics and electric characteristics) of the sensor chip and the semiconductor. As disclosed in the above patent documents 1 and 2, a method is effective which involves forming a cavity inside a sealing member by a cap material, and mounting a sensor chip in the cavity.

In the structure disclosed in Patent Documents 1 and 2, in a sealing step of forming the sealing member using resin, the cap would be crushed under pressure from the resin (supplied pressure or pressure for removing voids) in the direction of the space enclosed by the cap. The cap is crushed into contact with the sensor chip or the wire coupled to the sensor chip, which reduces the reliability (sensing characteristics and electric characteristics) of the sensor chip and the semiconductor device. Even when the sensor chip is not brought into contact with the cap, the deformation of the cap degrades the sealing properties of the space inside the sealing member, causing a part of the sealing member to intrude into the space and to be brought into contact with the sensor chip. That is, it has been found that the reduction in reliability of the sensor chip and the semiconductor device cannot be suppressed sufficiently.

The inventors of the present application have also studied a structure including a thick cap so as to improve the strength of the cap. In this case, however, it is difficult to process the cap. Thickening the cap makes it difficult to meet the recent requirements for thinned semiconductor devices.

The present invention has been made in view of the above foregoing problems, and it is an object of the present invention to provide a technique for suppressing the reduction in reliability of the resin-sealed semiconductor device.

The above and other objects and the novel features of the invention will become apparent from the description of the present specification and the accompanying drawings.

The outline of representative aspects of the invention disclosed in the present application will be briefly described below.

That is, a manufacturing method of a semiconductor device according to one aspect of the invention in the present application includes the following steps. The manufacturing method includes the step of (a) providing a first member having a first upper surface, and a first lower surface opposite to the first upper surface. The method also includes the step of (b) mounting a semiconductor chip having a front surface, a plurality of electrode pads formed at the front surface, and a back surface opposite to the front surface. The method further includes the step of (c) electrically connecting the electrode pads of the semiconductor chip with a plurality of terminals arranged over the first upper surface of the first member via a plurality of wires. The method further includes the step of (d) after the step (c), arranging a second member having a second upper surface, a second lower surface opposite to the second upper surface, and a space formation portion formed on the second lower surface side, over the first upper surface of the first member such that the semiconductor chip and the wires are positioned within the space formation portion, and bonding the first upper surface of the first member to an adhesive surface provided at outside the space formation portion of the second member via a sealing. The method further includes the step of (e) after the step (d), sealing a joint part between the first member and the second member such that an entirety of the second upper surface of the second member and an entirety of the first lower surface of the first member are respectively exposed.

Effects of the representative aspects of the invention disclosed in the present application will be briefly described as follows.

That is, according to one aspect of the invention in the present application, the reduction in reliability of the resin-sealed semiconductor device can be suppressed.

DETAILED DESCRIPTION OF THE PREFERRED EMBODIMENTS

Figure 1:
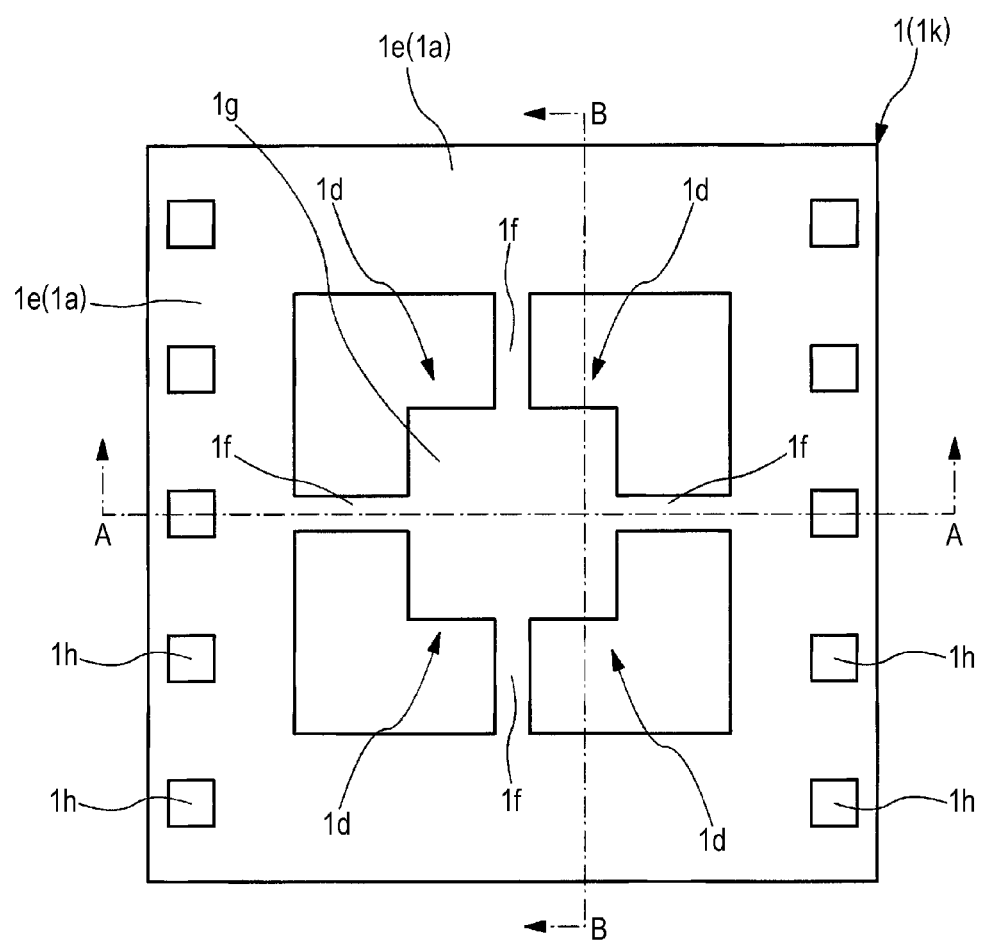
FIG. 1 is a plan view showing a front surface side of a sensor chip included in a semiconductor device according to one embodiment of the invention.

Explanation of Format of Description, and Meanings and Usage of Basic Terms in Present Application The following preferred embodiments in this patent application will be described below by being divided into a plurality of sections or the like for convenience, if necessary, which are not independent from each other unless otherwise specified. Regardless of the order of the description, each section corresponds to each part of a single example, or one of the sections is a detailed part of the other, or a part or all of a modified example, or the like. A repeated description of the same part will be omitted below in principle. Each component of the embodiments is not essential, unless otherwise specified, except when definitely limited to the specific number in theory, and unless otherwise directed from the context.

Likewise, in the description of the embodiments, the phrase "X comprised of A" as to material, composition, and the like does not exclude a material containing an element other than the element "A" unless otherwise specified, and unless otherwise directed from the context. For example, the phrase "X comprised of A" as to the component means "X containing the element "A" as a principal component". For example, the term "silicon member" or the like is not limited to pure silicon. It is apparent that the term "silicon member" means a member containing a SiGe (silicon and germanium) alloy, or other multicomponent alloys containing silicon as a principal component, and other additives. Gold plating, a Cu layer, nickel plating, and the like mean not only a member formed of pure material described above, but also a member containing gold, Cu, nickel, and the like, respectively, as a principal component, unless otherwise specified.

When referring to a specific numeral value or amount, a numeral value exceeding the specific numeral value, or a numeral value below the specific numeral value may be applied unless otherwise specified, except when definitely limited to the specific number in theory, and unless otherwise directed from the context.

In each drawing of the embodiments, the same or like parts are designated by the same or similar reference characters or numerals, and a description thereof will not be repeated in principle.

In the accompanying drawings, hatching or the like for the cross-section may be omitted when the hatching makes the cross-section complicated, or when the cross-section is clearly distinguished from a void. In this context, a background outline of even a hole closed in a planar manner may often be omitted when clearly understood from the description or the like. Further, hatching or dot patterns may be provided even in a diagram which is not the cross-sectional view, in order to clearly show that the part of interest in the drawing is not the cavity, or to clearly show the boundary between regions.

First Embodiment

This embodiment will describe the following semiconductor device as one example of a semiconductor device including a semiconductor chip arranged in a space formed in a sealing member. The semiconductor device has a sensor chip (semiconductor sensor chip) mounted thereon, and which is formed using a semiconductor microprocessing technique called "micro electro mechanical systems (MEMS)" in the space formed in the sealing member.

Structure of Semiconductor Chip (Semiconductor Sensor Chip)

Figure 2:
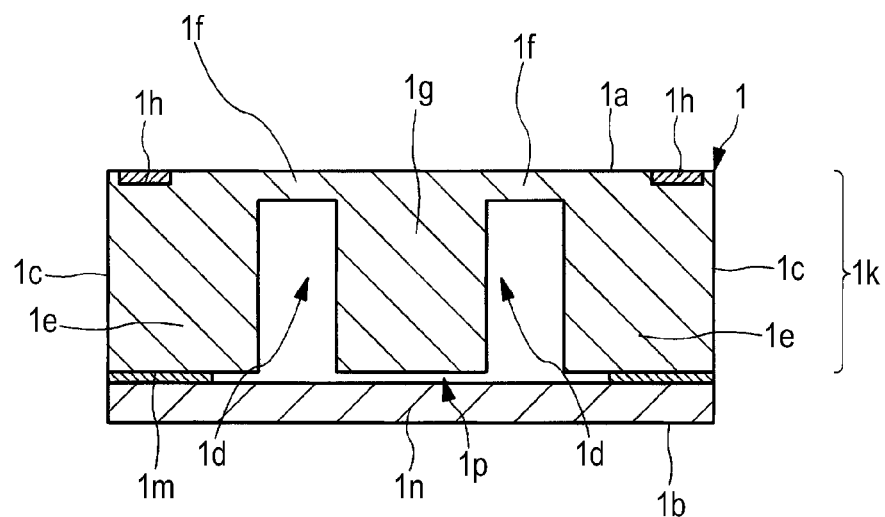
FIG. 2 is a cross-sectional view taken along the line A-A of FIG. 1.
Figure 3:
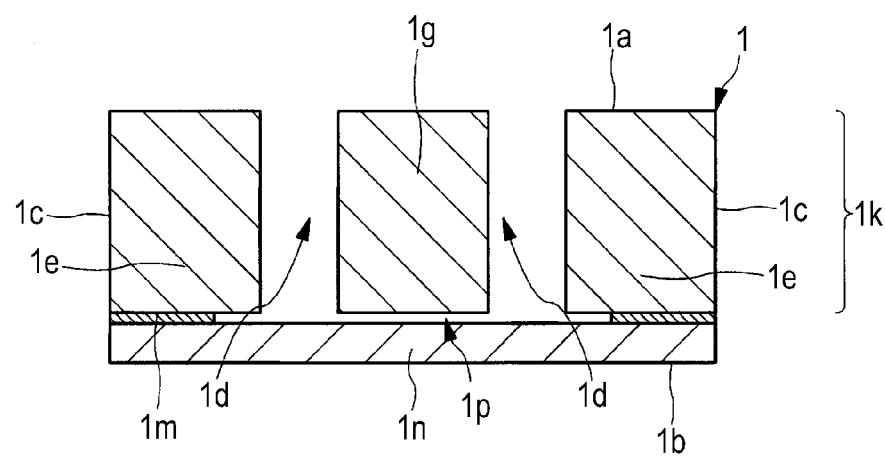
FIG. 3 is a cross-sectional view taken along the line B-B of FIG. 1.

The structure of a semiconductor chip (sensor chip) included in the semiconductor device of this embodiment will be described below using FIGS. 1 to 3. FIG. 1 shows a plan view of a front surface side of the sensor chip included in the semiconductor device of this embodiment. FIG. 2 shows a cross-sectional view taken along the line A-A of FIG. 1, and FIG. 3 shows a cross-sectional view taken along the line B-B of FIG. 1.

The semiconductor chip of this embodiment is a sensor chip 1 formed by the MEMS technique. The sensor chip 1 formed by the MEMS technique includes a movable part, and an electric circuit (sensor circuit) for converting the movement of the movable portion into an electric signal and transmitting the electric signal. The sensor chip 1 can be used for various applications, for example, such as an acceleration sensor or an angular velocity sensor. In this embodiment, a piezoresistive acceleration sensor will be described below as one example of the sensor chip. The sensor chip 1 is formed, for example, by the microprocessing technique, which is to be used when manufacturing the semiconductor integrated circuit device by the photolithography or etching. Thus, the sensor chip 1 has an advantage that the size of the sensor including the movable portion capable of being mechanically moved can be reduced. For example, the sensor chip 1 of this embodiment has its front surface 1a whose planar shape is rectangular, and the length of each side is, for example, in a range of about 1 to 10 mm.

The sensor chip (semiconductor chip) 1 of this embodiment includes a front surface (main surface) 1a, a back surface (main surface) 1b positioned opposite to the front surface 1a, and sides 1c positioned between the front surface 1a and the back surface 1b. In detail, the sensor chip 1 includes a main body 1k, and a cover 1n arranged at a back surface 1m of the main body 1k. The back surface of the cover 1n becomes the back surface 1b of the sensor chip 1. The main body 1k of the sensor chip 1 includes openings 1d penetrating from the front surface 1a to the back surface 1m, a support member (frame part) 1e arranged around the openings 1d, and a plumb part (movable portion) 1g arranged in the opening 1d and supported by the support member 1e via a plurality of beam parts (beams) 1f.

The main body 1k of the sensor chip 1 is made of, for example, silicon, and the support members 1e, the beam parts 1f, and the plumb part 1g are integrally formed. A plurality of beam parts 1f for supporting the plumb part 1g are flexible. When the external force of interest to be sensed by the sensor chip 1 (for example, inertia force or gravity) is applied to the beam parts 1f to move the plumb part 1g, the beam parts 1f are bent (elastically deformed). The piezoresistive element is arranged over each of the beam parts 1f. Each piezoresistive element is electrically connected with each of a plurality of pads (electrode pads, or bonding pads) 1h formed at the front surface 1a via wirings (not shown) formed in the sensor chip 1. The piezoresistive element is a resistance element whose resistance changes according to the stress. That is, the sensor chip 1 is an acceleration sensor which uses a change in resistance of the piezoresistive element arranged at each beam part 1f due to the bending of the beam parts 1f to convert the change in resistance into an electric signal, and then takes the electric signal from the pad 1h. As mentioned above, the sensor chip 1 includes the movable portion (plumb part 1g)

mechanically operating according to the external force of interest to be sensed, an electric circuit (piezoresistive element in the beam part 1f) for converting the operation of the movable portion into an electric signal, and another electric circuit (wiring (not shown) or pad 1h formed in the support member 1e) for transmitting the converted electric signal.

The sensor chip 1 is arranged on the lower surface 1m side of the main portion 1k, and is provided with the cover 1n that covers the opening 1d from the back surface 1b side. The cover 1n has a function of preventing or suppressing the influence of an adhesive (die bonding material) on the main portion after die bonding of the sensor chip 1. The cover in is arranged to cover the opening 1d, that is, the main portion 1k from the back surface 1b side which is an adhesive (mounting) side of the sensor chip 1. The cover 1n has a gap 1p in an area opposed to the opening 1d. The formation of the gap 1p in the sensor chip 1 ensures the space where the plumb part 1g is movable. The sensor chip in a modified example has the structure in which the opening 1d is not exposed on the adhesive surface side (for example, in which the main portion 1k and the cover 1n are integrally formed). In this case, the cover in may not be provided.

The sensor chip 1 detects the operation of the movable portion as the electric signal as mentioned above. From the viewpoint of the reliability of the sensor, it is important to dispose the plumb part 1g in a predetermined position (reference position) without bending the beam part 1f when the external force of interest to be sensed is not applied to the sensor. From this standpoint, preferably, the semiconductor device (semiconductor package) incorporating therein the sensor chip 1 reduces other external forces applied to the main portion 1k of the sensor chip 1 other than the external force of interest to be sensed when possible. Thus, in this embodiment, as shown in FIGS. 2 and 3, the cover 1n is not arranged over the front surface 1a with the beam parts 1f arranged thereon in the main portion 1k. As described in the following, a space is formed inside the sealing member of the semiconductor device, and the sensor chip 1 is arranged in the space.

Schematic Structure of Semiconductor Device

Figure 4:
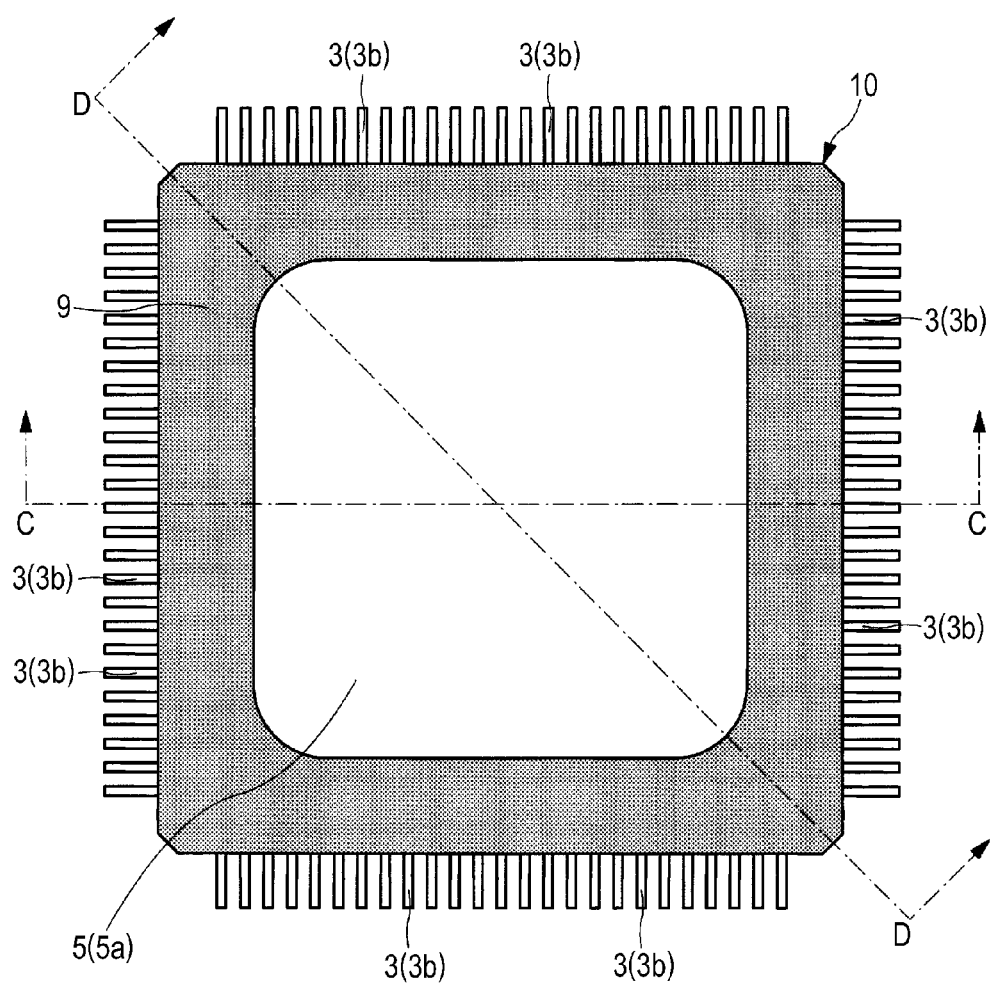
FIG. 4 is a plan view showing an upper surface side of the semiconductor device in the one embodiment of the invention.
Figure 5:
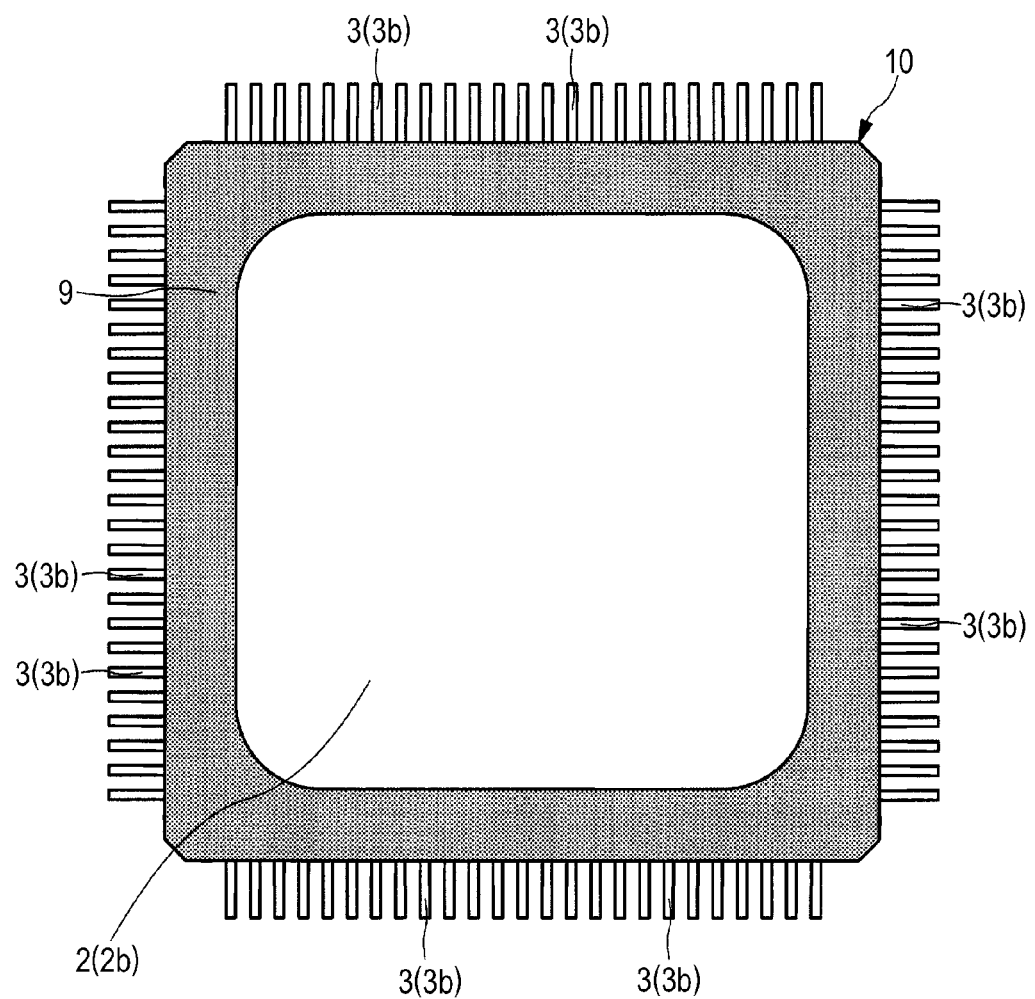
FIG. 5 is a plan view showing a lower surface side of the semiconductor device shown in FIG. 4.
Figure 6:
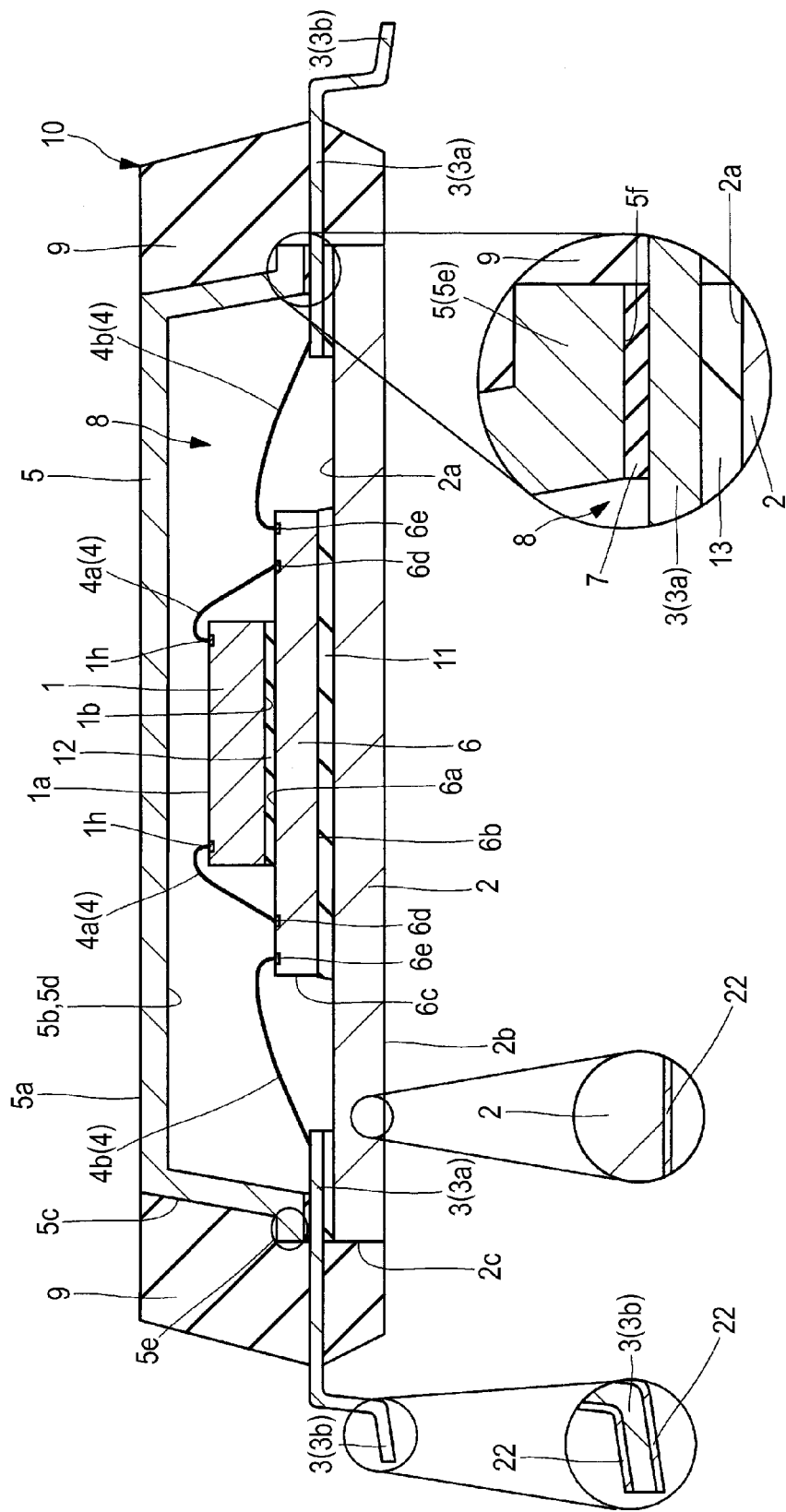
FIG. 6 is a cross-sectional view taken along the line C-C of FIG. 4.
Figure 7:
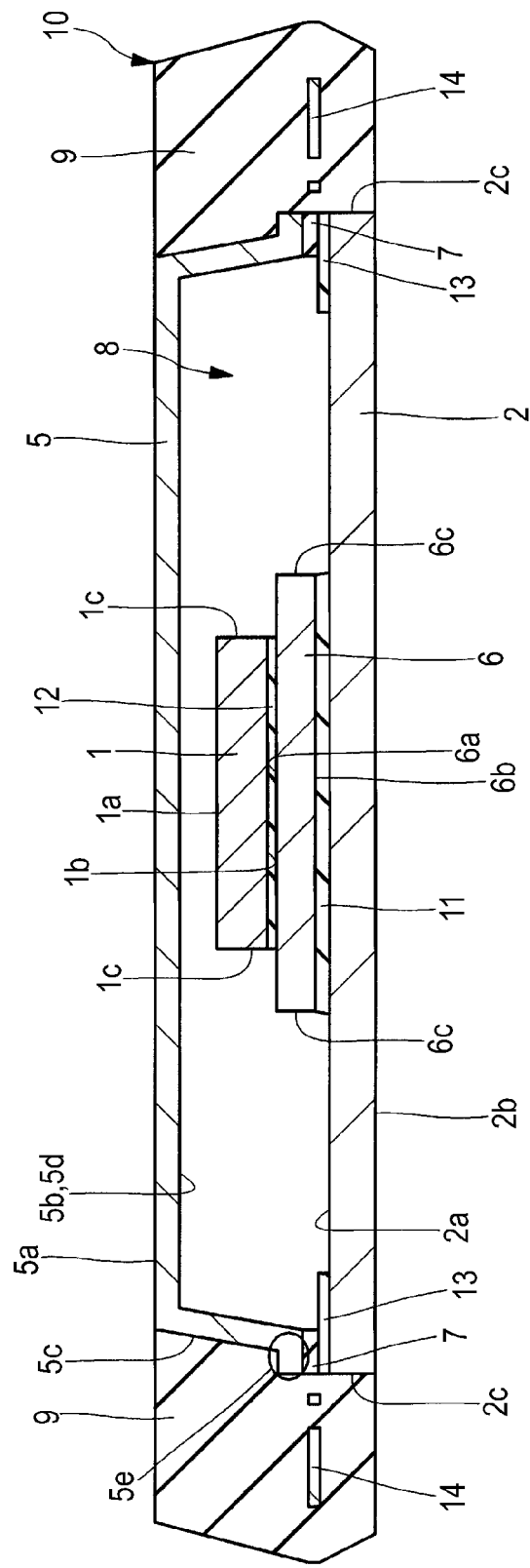
FIG. 7 is a cross-sectional view taken along the line D-D of FIG. 4.
Figure 8:
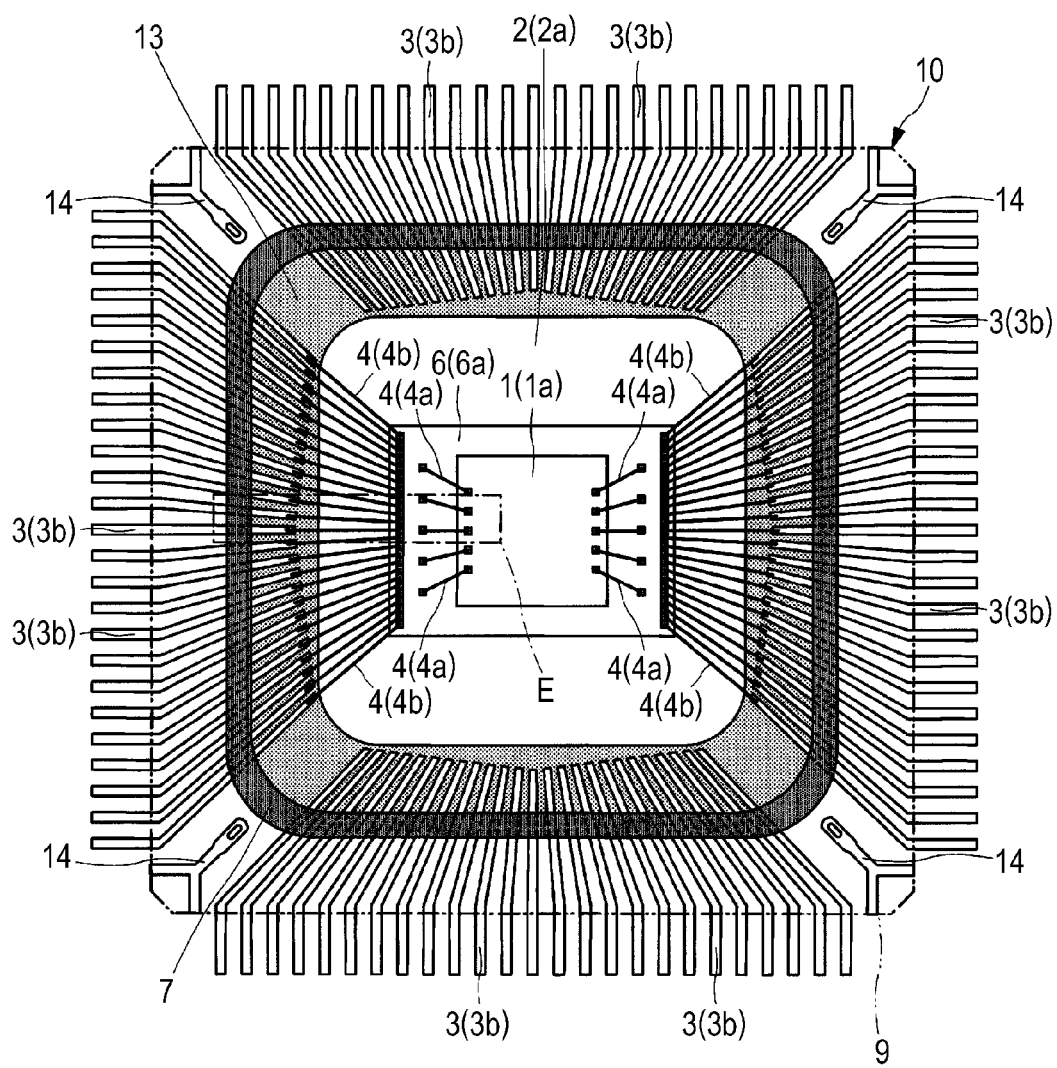
FIG. 8 is a plan view showing a planar structure inside a sealing member of the semiconductor device shown in FIG. 4.
Figure 9:
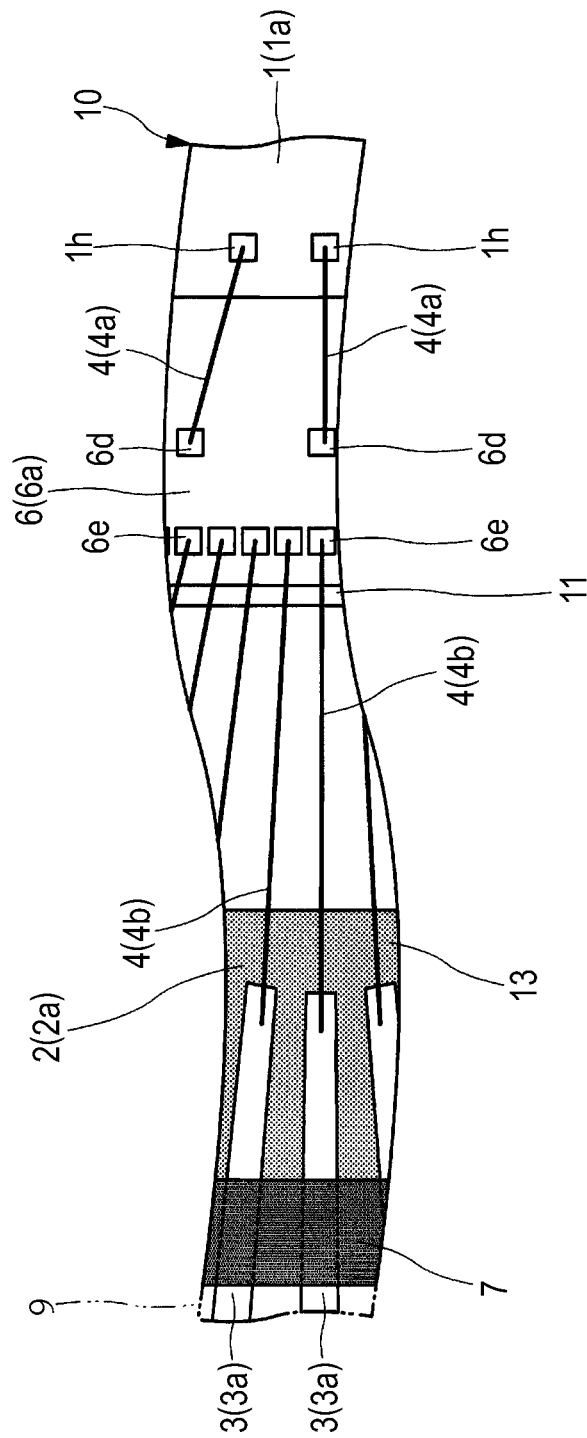
FIG. 9 is an enlarged plan view of an E part shown in FIG. 8.

Next, an example of the structure of the semiconductor device of this embodiment will be described below using FIGS. 4 to 9. FIG. 4 shows a plan view of the upper surface side of the semiconductor device in this embodiment. FIG. 5 shows a plan view of the lower surface side of the semiconductor device shown in FIG. 4. FIG. 6 is a cross-sectional view taken along the line C-C of FIG. 4. FIG. 7 is a cross-sectional view taken along the line D-D of FIG. 4. FIG. 8 shows a plan view of a planar structure inside the sealing member of the semiconductor device shown in FIG. 4. FIG. 9 is an enlarged plan view of an E portion shown in FIG. 8. FIGS. 8 and 9 are transparent plan views showing the inner structure of the semiconductor device, specifically, plan views showing the inner structure viewed through a sealing member 9 and the cap 5 shown in FIG. 4. FIGS. 6 to 8 omit the illustration of the detailed structure of the sensor chip 1 (structure shown in FIGS. 1 to 3) for easy understanding.

The semiconductor device of this embodiment is a lead frame type semiconductor package with the semiconductor chip mounted on a chip mounting portion using a lead frame as a base. In this embodiment, a quad flat package (QFP) 10, which is the lead frame type semiconductor device shown in FIG. 5, will be described below by way of example. Techniques for reducing the cost which have been developed for a long time can be applied to the lead frame type semiconductor devices. Since infrastructures already structured, such as manufacturing equipment, can be used, the manufacturing cost of the lead frame type semiconductor device can be reduced as compared to a substrate type semiconductor device that mounts a semiconductor chip on a wiring board.

The outline of the structure of the QFP 10 shown in FIGS. 4 to 9 will be described below. As shown in FIGS. 6 and 7, the QFP 10 includes a cap (first member, or back surface side cap material) 2 having an upper surface 2a, a lower surface 2b opposite to the upper surface 2a, and sides 2c located between the upper surface 2a and the lower surface 2b. The cap 2 is a plate-like member made of metal material. The QFP 10 includes the sensor chip 1 as described using FIGS. 1 to 3. The sensor chip 1 is mounted over the upper surface 2a of the cap 2 with the back surface 1b opposed to the upper surface 2a of the cap 2. In examples shown in FIGS. 4 to 9, the QFP 10 incorporates the control chip (controller chip) 6 as a semiconductor chip for controlling the sensor chip 1, in the QFP 10. The sensor chip 1 is mounted on the control chip 6. The QFP 10 includes a plurality of leads (terminals) 3 arranged around the sensor chip 1 (and control chip 6). The QFP 10 has a plurality of wires 4 that electrically connects the leads 3 with the pads 1h of the sensor chip 1. As mentioned above, the QFP 10 includes a control chip 6 in addition to the sensor chip 1. As shown in FIGS. 6 and 9, the pads 1h of the sensor chip 1 are electrically connected with pads 6d of the control chip 6 via wires 4a. Pads 6e of the control chip 6 are electrically connected with the leads 3 via the wires 4b. The pads 6d and the pads 6e are electrically connected together via wirings (not shown) provided in the control chip 6. That is, in the QFP 10, the pads 1h of the sensor chip 1 are electrically connected with the leads 3 via the wires 4a and 4b and the control chip 6. As shown in FIGS. 6 and 7, the QFP 10 includes a cap (second member, or front surface side cap material) 5 having an upper surface 5a, a lower surface 5b opposite to the upper surface 5a, and sides 5c located between the upper surface 5a and the lower surface 5b. The cap 5 has a recessed shape toward the upper surface 5a. The cap 5 has, on its lower surface 5b side, a cavity (space formation portion, concave portion, recessed portion, or chip housing portion) 5d, and a flange (joint part) 5e arranged to enclose the cavity 5d. The cap 5 is arranged over the upper surface 2a of the cap 2 such that the sensor chip 1, the wires 4, and parts of the leads 3 (bonding regions where the wires 4 are bonded) are located within the cavity 5d. The joint part between the cap 2 and cap 5 (region between an adhesive surface 5f of the flange 5e and the upper surface 2a of the cap 2) is sealed by the sealing material 7. That is, by superimposing the cap 2 over the cap 5 to bond these caps together, a space 8 within the cavity 5d becomes a hollow space sealed against the outside. In the space 8, the sensor chip 1, the wires 4, and parts of the leads are arranged. Further, the QFP 10 includes the joint part between the caps 2 and 5, and the sealing member (resin member) 9 for sealing other parts of the leads 3 (regions of inner lead parts 3a outside the caps 2 and 5 rather than outer lead parts 3b as an external terminal. That is, the QFP 10 is a semiconductor device that forms the space 8 within the sealing member 9 and which includes the sensor chip 1 arranged as the semiconductor chip in the space 8.

In the QFP 10 shown in FIGS. 6 and 7, the side 2c of the cap 2 and the side 5c of the cap 5 are covered with the sealing member 9, and the lower surface 2b of the cap 2 and the upper surface 5a of the cap 5 are entirely exposed from the sealing member 9. In other words, in a planar view shown in FIG. 4, the sealing member 9 is not arranged at the periphery of the upper surface 5a of the cap 5, or inside the periphery thereof. In another planar view, as shown in FIG. 5, the sealing member 9 is not arranged at the periphery of the lower surface 2b of the cap 2, or inside the periphery thereof. As will be described in detail later, in this embodiment, an entirety of the lower surface 2b of the cap 2 and an entirety of the upper surface 5a of the cap 5 are exposed to reduce the pressure applied to the caps 2 and 5 in a step of forming the sealing member 9, which can suppress the deformation of the cap 5 with the cavity 5d. With this arrangement, the sealing property of the space 8 can be maintained to prevent or suppress the invasion of the sealing member 9 into the space 8. As a result, this embodiment can suppress the degradation of the reliability of the sensor chip 1 and the QFP 10 which would be caused due to the influence of stress of the sealing member 9 or the like by the contact of the sensor chip 1 with the sealing member 9. The sentence "an entirety of the upper surface 5a and an entirety of lower surface 2b are exposed from the sealing member 9" means that most of the upper surface 5a and lower surface 2b are exposed from the sealing member 9. This meaning does not exclude the following situation. For example, in a step of forming the sealing member 9, resin burrs or the like are generated at an boundary between the upper surface 5a or lower surface 2b and the sealing member 9, and slightly cover the upper surface 5a or lower surface 2b. Likewise, the sentence "the sealing member 9 is not arranged at the periphery of the upper surface 5a (lower surface 2b), or inside the periphery thereof" means that for example, resin slightly left, such as resin burrs, are removed with the sealing member 9 not arranged there. The term "resin burr" means that resin, specifically, thermoset resin (resin for sealing) leaks out in the following sealing step, and that the thickness of the resin is very small in the cross-sectional view or side view.

Detailed Structure of Semiconductor Device

Now, the detail structure of each component included in the QFP 10 will be described below. The cap 2 is comprised of a flat plate having a rectangular shape in the planar view as shown in FIG. 8, and does not have a large recessed part (cavity formation portion) like the cavity 5d of the cap 5 as shown in FIGS. 6 and 7. The length of one side of the cap 2 is, for example, about 15 to 20 nm. In this embodiment, four corners of the cap 2 are chamfered (subjected to the R process) from the viewpoint of suppressing the occurrence of cracks in the sealing member 9 at an interface between the sealing member 9 and the cap 2. The planar shape of the cap 2 is not limited to the form shown in FIG. 8, and can be a rectangular planar shape, for example, with its corners not chamfered. In order to expose the lower surface 2b of the cap 2 on the lower (mounting surface) side of the QFP 10, the cap 2 is thicker than the cap 5. The cap 5 has a thickness of, for example, about 0.2 to 1 mm. From the viewpoint of improving the strength of the cap 2, the thicker the cap 2, the better the strength of the cap 2. In this case, the total thickness of the QFP 10 becomes very thick. This embodiment can suppress the deformation of the cap 2 by reducing the pressure applied to the cap 2, and thus can reduce the strength required for the cap 2 itself. As long as the lower surface of the cap 2 is exposed from the sealing member 9, the thickness of the cap 2 can be thinned. For example, the cap 2 can be formed in the same thickness as that of the cap 5.

In the QFP 10, the cap 2 serves as a chip mounting portion for mounting thereover the control chip 6. In other words, the control chip 6 is mounted over the upper surface 2a of the cap 2 as the chip mounting portion via an adhesive (die bonding material) 11. The control chip 6 has a front surface 6a, a back surface 6b opposite to the front surface 6a, and sides 6c positioned between the front surface 6a and the back surface 6b. The control chip 6 is mounted by the so-called face-up mounting such that the back surface 6b is opposed to the upper surface 2a of the cap 2. The adhesive 11 is not limited to a specific material, and may be made of any other that can fix the control chip 6 to the upper surface 2a of the cap 2. In this embodiment, the control chip 6 is bonded by applying a paste-like resin adhesive comprised of, for example, an epoxy thermoset resin, and then thermally-hardened to be secured. The sensor chip 1 is mounted over the surface 6a of the control chip 6 via an adhesive 12. That is, the sensor chip 1 is mounted on the control chip 6 by the face-up mounting. The adhesive 12 is also a member for fixing the sensor chip 1 to the control chip 6. The adhesive 12 is preferably a film-like adhesive material from the viewpoint of suppressing adverse effects on characteristics (sensing characteristics) of the sensor chip 1 due to the stress generated in the adhesive 12, a part of which is attached to the side 1c of the sensor chip 1 (see FIG. 2). The film-like adhesive is preferable because it is less likely to be attached to the side 1c of the sensor chip 1 than the paste-like adhesive. The film-like adhesive is called, for example, die attach film (DAF), and can be one that is commonly used as an adhesive for laminating another semiconductor chip on one semiconductor chip.

Like the QFP 10, when the sensor chip 1 is mounted over the cap 2, the cap 2 is preferably made of material having a linear expansion coefficient close to that of the sensor chip 1 from the viewpoint of reducing the influences on the stress generated due to a difference in linear expansion coefficient between the cap 2 and the sensor chip 1. Thus, in this embodiment, the sensor chip 1 is made of, for example, silicon, and the cap 2 is made of kovar (an alloy containing nickel, and cobalt added to iron) which is a metal material having the linear expansion coefficient close to that of silicon. Like the cap 2, the cap 5 is also comprised of kovar. Specifically, a plated film comprised of, for example, nickel, or nickel and palladium is formed over the surface (upper surface 2a and lower surface 2b of the cap 2, or upper surface 5a, lower surface 5b, and sides 5c of the cap 5) of a base comprised of kovar. The nickel and palladium means a material for forming a plated film comprised of an alloy containing nickel (Ni) and palladium (Pd). In the following, an alloy of nickel and palladium is described as nickel.palladium or Ni/Pd, and a plated film comprised of nickel.palladium is described as a nickel.palladium film. The plated film comprised of nickel or nickel.palladium (nickel film or nickel-palladium film) serves as an oxidation preventing film for preventing the oxidation of the caps 2 and 5. The plated film formed over the side 5c of the cap 5 (nickel film or nickel palladium film) serves as an adhesion improvement film for improving the adhesion of the interface between the sealing member 9 and the cap 5. From the viewpoint of reducing the transmission of the stress to the sensor chip 1, the sensor chip 1 is not mounted directly on the cap 2, and preferably mounted thereover via the control chip 6 comprised of silicon, like the QFP 10. This can further reduce the stress transmitted to the sensor chip 1. The cap 2 in this embodiment has a plate-like section not subjected to a bending process. That is, the cap 2 is not subjected to the bending process unlike the cap 5 to be described later, and thus the cap 2 may have the lower strength than that of the cap 5. Thus, the cap 2 may be comprised of the same material (copper or an copper alloy) as that of the lead 3 fixed thereto via the adhesive 7. Like the case of use of the kovar, also in this case, a plated film comprised of, for example, nickel or nickel.palladium is preferably formed over the surfaces of the base (upper surface 2a and lower surface 2b of the cap 2, and upper surface 5a, lower surface 5b, and sides 5c of the cap 5).

Since in this embodiment the lower surface 2b of the cap 2 is exposed, the cap 2 can serve as a heat dissipation member (heat spreader) for dissipating heat generated in the space 8 toward the outside of the QFP 10. From the viewpoint of a heat dissipation route, the cap 2 is comprised of metal having a thermal conductivity higher than that of ceramic material, and thus can improve the heat dissipation efficiency as compared to a ceramic package. In use of the cap as a heat dissipation member, for example, a joint material (not shown) made of metal, such as solder, is arranged on the lower surface 2b side of the cap 2, so that the cap 2 can be joined to a terminal (not shown) of a mounting substrate (not shown) by the junction material. In this case, the heat transfer to the mounting substrate can be made more efficient, thus improving the heat dissipation efficiency.

The QFP 10 includes in one package, the sensor chip 1 and the control chip 6 for controlling the sensor chip 1. In other words, the QFP 10 forms a system including a plurality of semiconductor chips mounted in the package and electrically connected together. In this way, the mounting of the sensor chip 1 and the control chip 6 in one package can reduce a mounting area as compared to the case where the sensor chip 1 and the control chip 6 are respectively housed in different packages.

A plurality of leads (terminals) 3 are arranged around the sensor chip 1 and the control chip 6. The leads 3 are external terminals of the QFP 10, and each lead includes an inner lead part 3a arranged inside the sealing member 9 (including the inside of the space 8), and an outer lead part 3b arranged outside the sealing member 9. The inner lead part 3a and the outer lead part 3b are integrally formed to each other. Each of the leads 3 is comprised of, for example, copper or a copper alloy, and has a plated film (metal film) formed of, for example, nickel or nickel.palladium over its surfaces (upper surface, lower surface, and sides (surfaces positioned between the upper and lower surfaces)). The plated film may not necessarily be formed over the entire surface of each of the leads 3. When the plated film is not formed over the entire surface of the lead, another plated film (exterior plated film) is formed of a lead soldering material or a solder material (lead-free solder) substantially not containing lead, over the surfaces (upper surface, lower surface, and sides) of the outer lead part 3b exposed from the sealing member 9 after forming the sealing member 9. The outer lead part 3b shown in FIG. 6 is arranged to protrude from the side of the sealing member 9, and subjected to the bending process outside the sealing member 9. For example, FIG. 6 shows an example of a gull wing-like form. The inner lead part 3a shown in FIG. 6 extends from the boundary with the outer lead part 3b into the space 8, and has its tip end housed in the space 8. Since the inner lead part 3a is arranged in the space 8, the tip end (bonding region 3c shown in FIG. 13) of the inner lead part 3a is arranged over the upper surface 2a of the cap 2. In this way, a part of the inner lead part 3a is arranged inside the space 8, so that joint parts of the wires 4b for coupling the control chip to the leads 3 can be arranged inside the space 8 (cavity 5d). That is, a surrounding area around the tip end of the inner lead part 3a becomes a bonding region for joining the wires 4b. The provision of the bonding region inside the cavity 5d can cover the wires 4b with the cap 5. As mentioned above, the cap 2 is comprised of metal material (conductive material), such as kovar, copper, or an copper alloy. Thus, if the leads 3 arranged over the cap 2 are not insulated from the cap 2, the short circuit would be caused between the leads 3. Thus, the QFP 10 is provided with an insulating adhesive 13 arranged between the upper surface 2a of the cap 2 and the lower surface of the lead 3, and the lead 3 is bonded and secured to the cap 2 by the adhesive 13.

In the planar view shown in FIG. 8, the leads 3 are respectively arranged along four sides of the QFP 10. The sensor chip 1 and the control chip 6 respectively has a rectangular planar shape with respect to the semiconductor chip as a reference, and the leads 3 are arranged in positions opposed to the four sides in the planar view. In the example shown in FIGS. 8 and 9, a plurality of pads 6e (see FIG. 9) are arranged along two sides opposed to each other among four sides of the control chip 6, and wires 4b are coupled to the leads 3 opposed to the pads 6e. Other leads 3 opposed to the sides of the rectangular control chip which do not have any pads 6e are not coupled to the wires 4. Thus, when the number of the leads 3 is larger than that of the terminals (pads) of the semiconductor chip, some of the leads 3 can be structured so as not to be coupled to the wires 4. In the QFP 10 shown in FIGS. 8 and 9, the pads 1h (see FIG. 9) of the sensor chip 1 are not directly coupled to the leads 3 via the wires 4. That is, the pads 1h coupled to the wires 4 among the pads 1h of the sensor chip 1 are coupled to the pads 6d of the control chip 6 (see FIG. 9) via all wires 4a. The leads 3 coupled to the wires 4 among the leads 3 are coupled to the pads 6e of the control chip 6 via all wires 4b. In this way, the pads 1h of the sensor chip 1 are coupled to the leads 3 via the control chip 6, which can shorten the length of wires 4a coupled to the pads 1h. For example, as shown in FIGS. 6 and 8, the length of the wire 4a is shorter than the length of the wire 4b. As shown in FIG. 6, when the wires 4 are arranged in the space 8, the wire 4 is often vibrated by external force generated by the vibration or the like applied to the QFP 10. In particular, when the wire 4a coupled to the sensor chip 1 is largely vibrated, the characteristics (sensing characteristics) of the sensor chip 1 would be degraded. When the external force applied to the QFP 10 is constant, the degree of the vibration is reduced by decreasing the length of the wire 4. In order to suppress the reduction in characteristics (sensing characteristics) of the sensor chip 1, the pads 1h coupled to the wires 4 among the pads 1h of the sensor chip 1 are preferably coupled to the pads 6d of the control chip 6 by all wires 4a. The layout of the wiring is not limited to the form shown in FIGS. 8 and 9, and various modifications can be made to the number and layout of terminals (pads) of the semiconductor chip coupled to the leads 3.

The cap (second member, or front surface side cap) 5 is arranged over the control chip 6 and the sensor chip 1. The cap 5 shown in FIGS. 6 and 7 includes an upper surface 5a, a lower surface 5b opposite to the upper surface 5a, and sides 5c positioned between the upper surface 5a and the lower surface 5b. The cap 5 is comprised of kovar, and has its surfaces (upper surface 5a, lower surface 5b, and sides 5c) covered with a plated film formed of nickel. The cavity 5d arranged substantially at the center of the cap 5, and a flange (joint part) 5e surrounding the cavity 5d are arranged on the lower surface 5b side of the cap 5. In the QFP 10, the flange 5e of the cap 5 is joined to the periphery of the upper surface 2a of the cap 2 via the sealing material 7 (and adhesive 13), whereby respective parts (bonding regions) of the sensor chip 1, the control chip 6, the wires 4, and the leads 3 are sealed inside the space 8. The depth of the cavity 5d is larger than the thickness of the semiconductor chip (sensor chip 1 and control chip 6), but is preferably as thin as possible so as to make the package thinner because the depth of the cavity 5d affects the thickness of the QFP 10. For example, in this embodiment, the depth of the cavity 5d is in a range of about 1 to 3 mm. The planar size of the cavity 5d is larger than the planar size of each of the sensor chip 1 and the control chip 6. For example, the length of one side of the cavity 5d forming the rectangular in the planar view is, for example, in a range of about 13 to 18 mm.

The sealing material 7 is a member arranged in the joint part between the cap 2 and the cap 5. In order to improve the sealing properties of the space 8, the sealing material 7 is required to have high sealing properties (embedded property in between the adjacent leads 3, shape keeping property from the time of application to the time of bonding and fixing, and adhesion property of the bonded interface). In this embodiment, the sealing material 7 required for the high sealing properties is preferably formed of the following materials. That is, from the viewpoint of reducing a gap between the adjacent leads 3, the sealing material 7 is preferably formed of material having paste-like properties before the hardening, rather than material that adheres to an object in a solid state like the film-like (tape-like) adhesive (for example, adhesive material, such as an adhesive 12). The applied sealing material 7 needs to keep its shape from the time when the sealing material 7 is applied to when the sealing material 7 is hardened. Thus, the sealing material 7 preferably has a high viscosity to some degree. For example, a sealing material having a low viscosity, like water, cannot keep its applied shape. In contrast, when the viscosity of the sealing material is too high, a gap may be generated between the adjacent leads 3. The sealing material 7 preferably has such a low viscosity that can keep its applied shape while being applied to the cap 2 and the lead 3 and then hardened to fix the joint part between the caps 2 and 5. For example, in this embodiment, the adhesive 11 and the sealing material 7 are formed using an adhesive comprised of an epoxy thermoset resin containing fillers (particles). The viscosity of the sealing material 7 before the hardening is lower than that of the adhesive 11 before the hardening. Such adjustment of the viscosity can be performed by adjusting the shape or particle diameter of the filler added to the adhesive, the composition ratio of an additive, such as a binder for adjustment of the viscosity, or the like. After hardening the sealing material 7, the interface for adhesion between the caps 2 and 5 and the leads 3 is required to be sealed and fixed. In this embodiment, a plated film made of the same metal material (for example, nickel or nickel.palladium) is formed over each of the upper surface 2a of the cap 2, the adhesive surface 5f of the flange 5e of the cap 5, and the surface of the lead 3, which can easily improve the adhesion with each component arranged in the joint part. Note that the adhesive 13 for bonding and securing the leads 3 to the upper surface 2a of the cap 2 is also arranged in the joint part. Thus, the adhesive 13 can be also formed using the same material as the sealing material 7. When the paste-like thermoset resin is used as the sealing material 7, for example, even the use of the film-like adhesive as the adhesive 13 fills the gap between the adjacent leads 3 with the sealing material 7. Thus, in this embodiment, the adhesive 13 is a film-like adhesive which is easy for handling (for example, over the surface of a film-like base, like the adhesive 12).

Then, the joint part between the caps 2 and 5 is covered with the sealing member 9. The sealing member 9 is resin generally used in a resin-sealed semiconductor device called a "plastic package". The sealing member 9 is formed, for example, by transfer mold (which will be described in detail below) in this embodiment. As shown in FIG. 6, in the QFP 10, each of the semiconductor chip (sensor chip 1 and control chip 6) and the wires 4 coupled thereto is arranged in the space 8 formed by superimposing the cap 2 over the cap 5. A structure without the sealing member 9 is also regarded as a modified example. When the sealing member 9 is not formed, however, the joint part between the caps 2 and 5 is exposed, and thus easily broken, for example, by the external force generated due to the influence of impact or heat. In order to suppress the breaking of the joint part, the strength of the sealing material 7 and the adhesive 13 is intended to be increased, which would degrade the sealing properties of the space 8. The manufacturing step thereof would be complicated. As shown in FIG. 6, preferably, the outer side of the joint part between the caps 2 and 5 is covered with and protected by the sealing member 9. The sealing material 7 and the adhesive 13 can be formed by selecting an optimal material taking into consideration the above sealing properties. The joint part is reinforced by the sealing member 9, which can suppress the breaking of the joint part as compared to the case where the sealing member 9 is not formed.

As shown in FIG. 8, the sealing member 9 has a rectangular shape including four sides (main sides other than corners chamfered) in a planar view. Each suspension lead 14 is arranged at the corner at which the respective sides intersect. The suspension lead 14 is a support member for supporting the region inside the sealing member 9 by the lead frame as a base in each step after formation of the sealing member 9 until the QFP 10 is singulated in the manufacturing process of the QFP 10 to be described later. Thus, the suspension leads 14 each are comprised of the same material as the lead 3 (for example, copper or a copper alloy). In contrast, in this embodiment, the caps 2 and 5 each are comprised of, for example, kovar as mentioned above, and is foamed separately from the suspension lead 14. As mentioned above, the cap 2 may be comprised of the same material (for example, copper or a copper alloy) as the lead 3.

Manufacturing Process of Semiconductor Device

Figure 10:
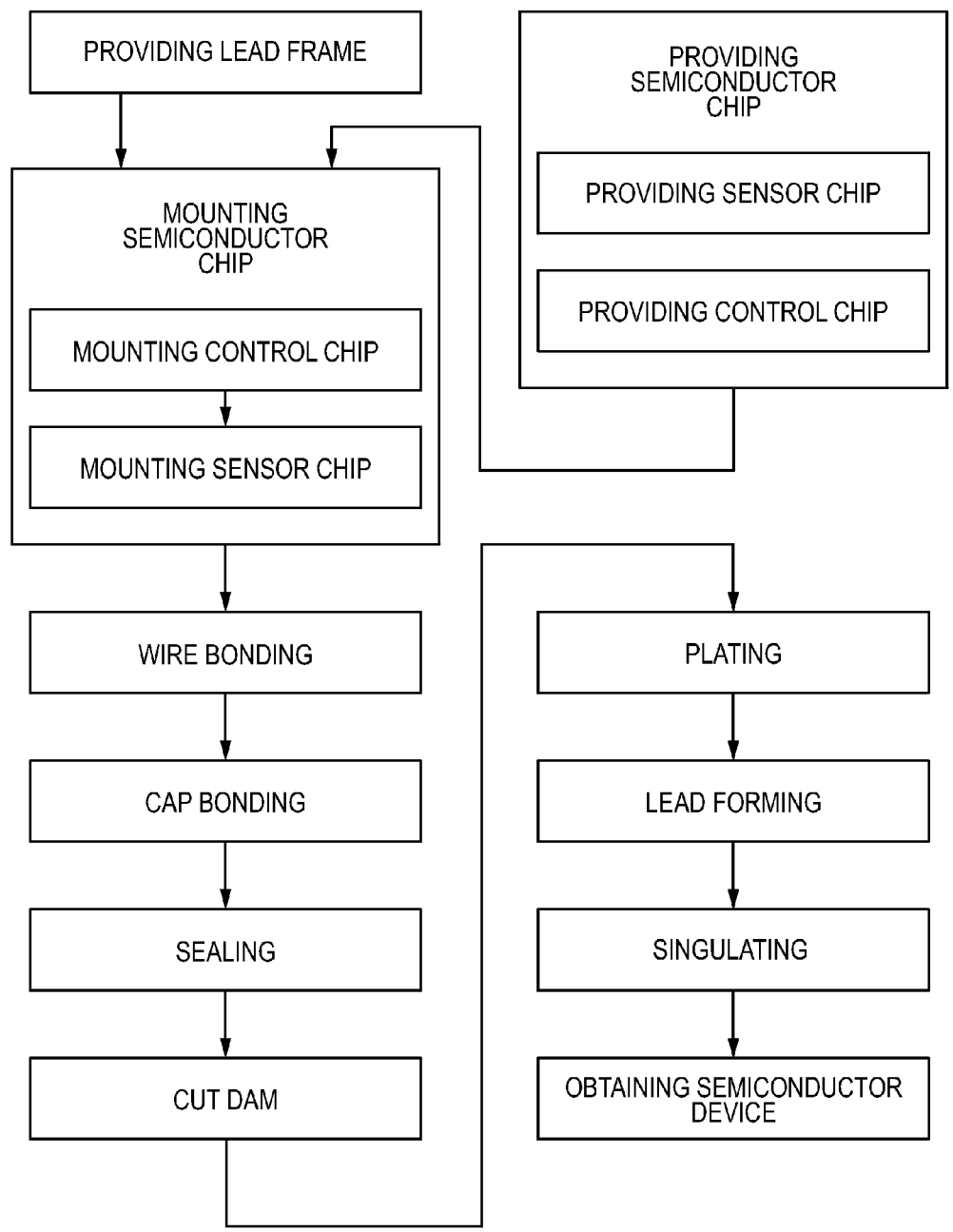
FIG. 10 is an explanatory diagram showing an assembly flowchart of the semiconductor device in the one embodiment of the invention.

Next, the manufacturing process of the QFP 10 will be described below with reference to FIGS. 5 to 9. The QFP 10 is manufactured along an assembly flowchart shown in FIG. 10. FIG. 10 shows an explanatory diagram of the assembly flowchart of the semiconductor device of this embodiment. Each step will be described in details below using FIGS. 11 to 31.

Figure 11:
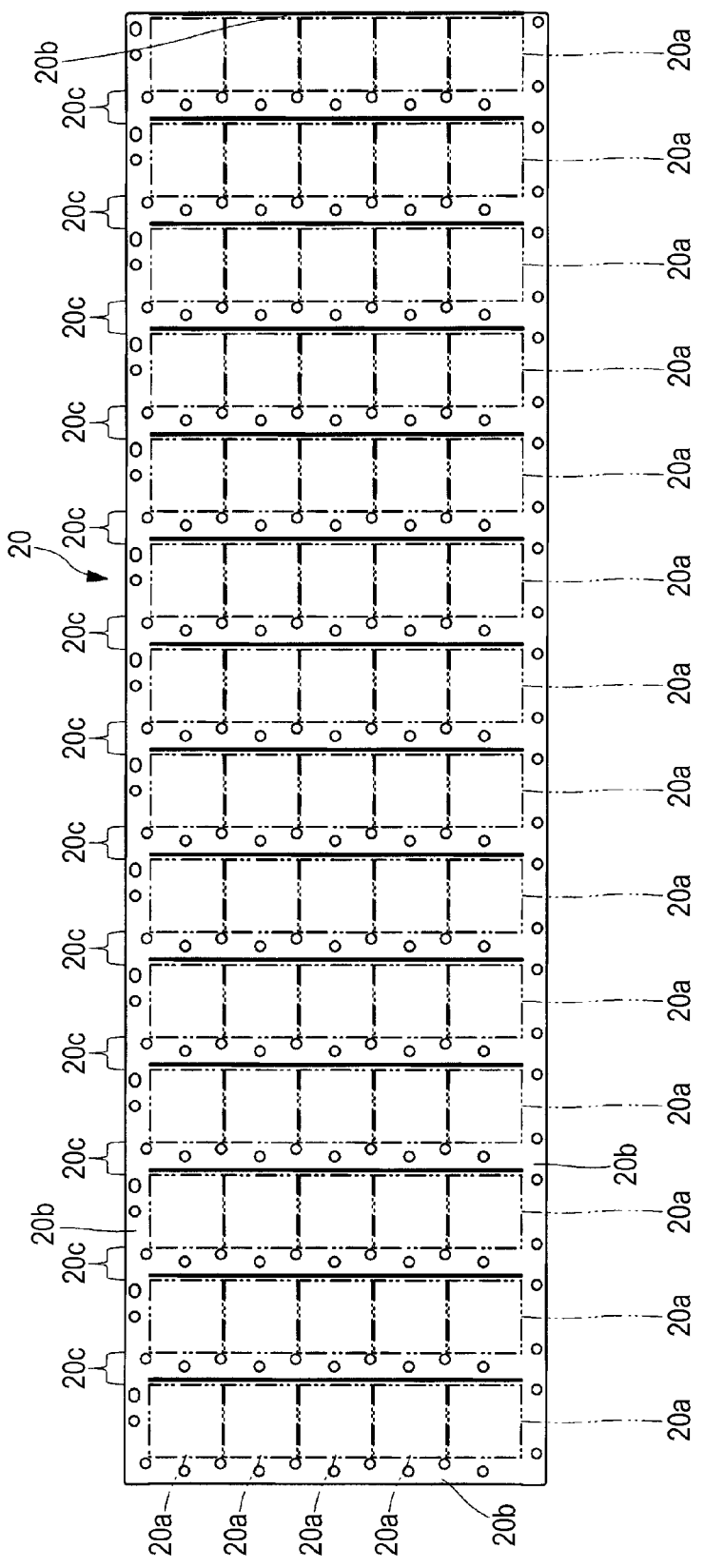
FIG. 11 is a plan view showing the entire structure of a lead frame provided in a lead frame providing step shown in FIG. 10.
Figure 12:
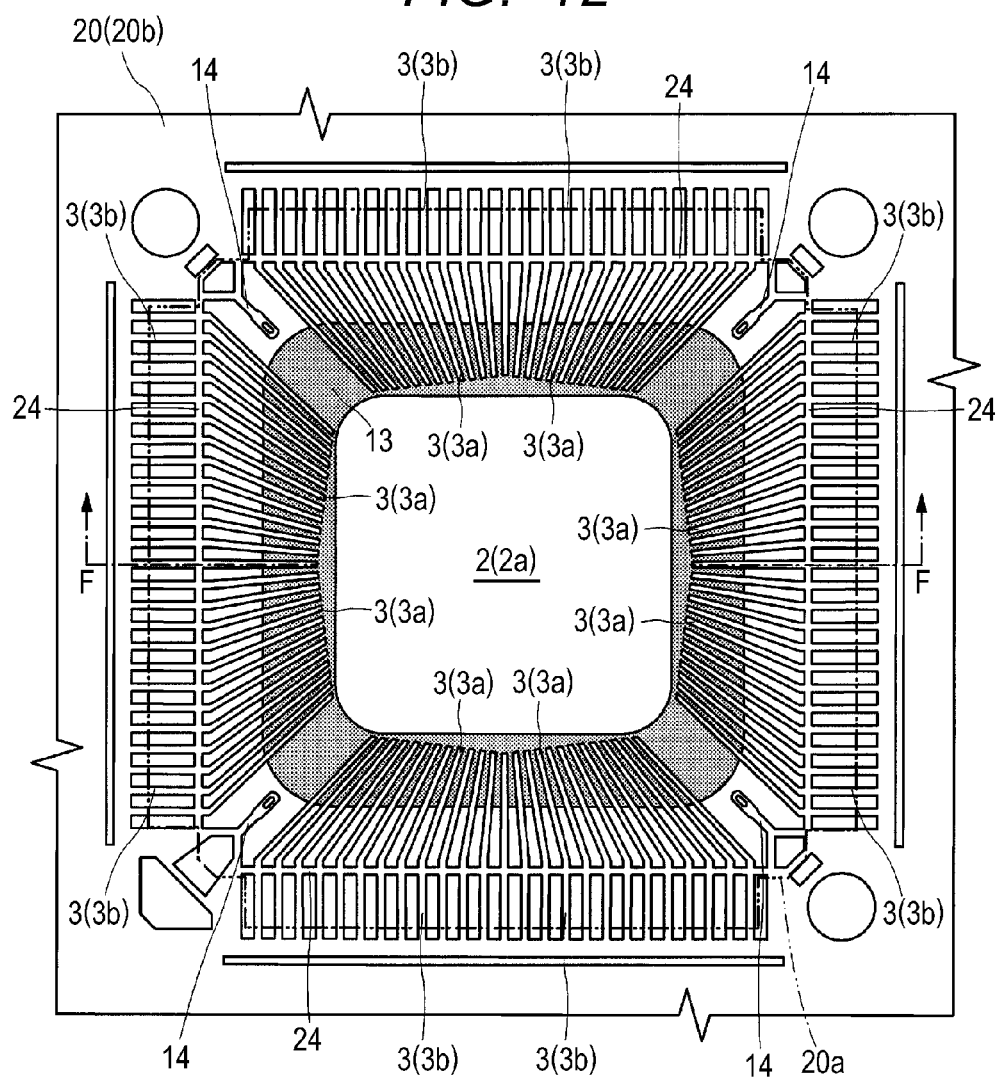
FIG. 12 is an enlarged plan view of the surroundings of one product formation region among a plurality of product formation regions shown in FIG. 11.
Figure 13:
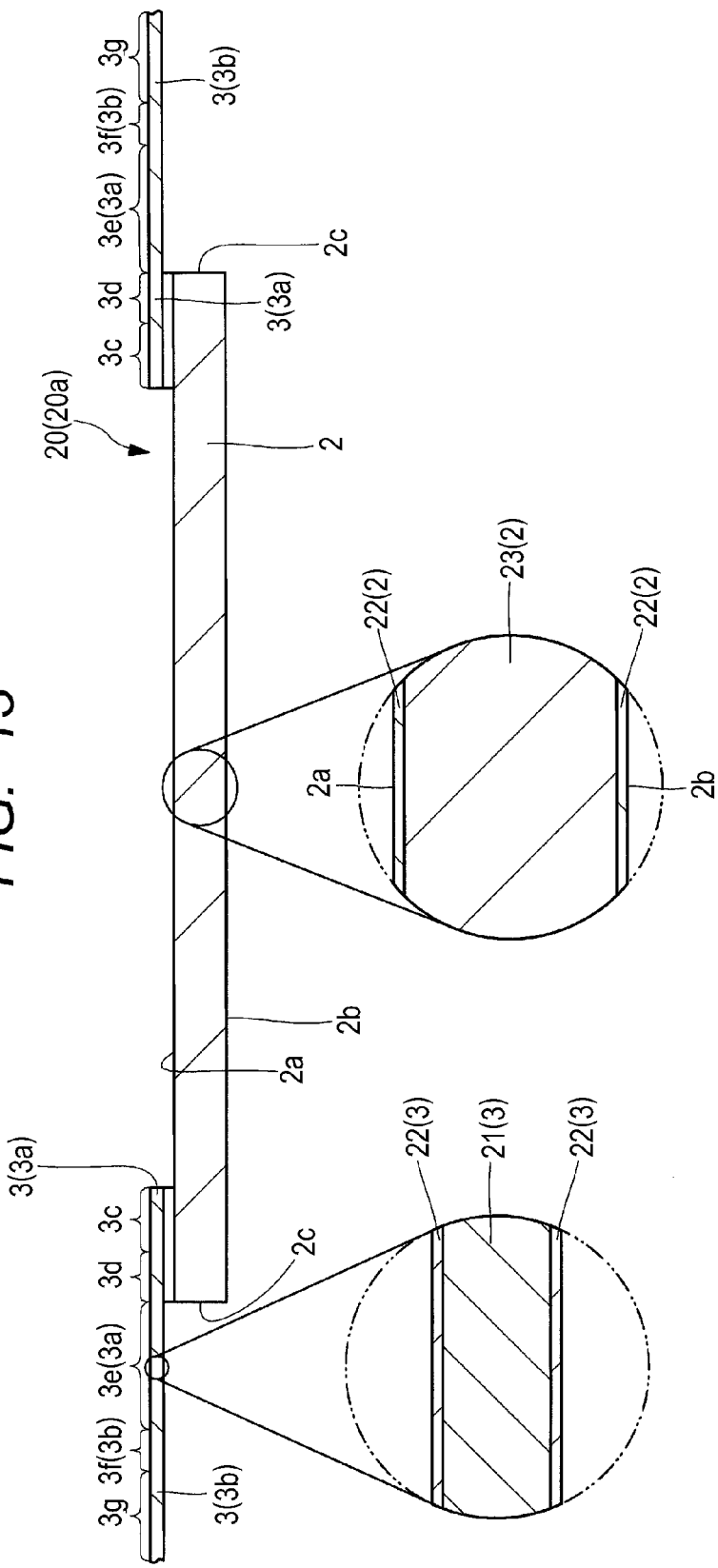
FIG. 13 is an enlarged cross-sectional view taken along the line F-F of FIG. 12.

1. Lead Frame Providing Step: FIG. 11 shows a plan view of an entire structure of the lead frame provided in a lead frame providing step shown in FIG. 10, and FIG. 12 shows an enlarged plan view of the surroundings of one product formation region among product formation regions shown in FIG. 11. FIG. 13 is an enlarged cross-sectional view taken along the line F-F of FIG. 12.

First, in the lead frame providing step shown in FIG. 10, a lead frame 20 is provided as shown in FIG. 11. The lead frame 20 used in this embodiment includes product formation regions 20a arranged inside frame parts (frame body) 20b. The product formation regions 20a are arranged in columns and rows. The frame part 20b is arranged between the adjacent product formation regions 20a. Between the adjacent product formation regions 20a, runner regions 20c are arranged along the row direction. The runner regions 20c are regions having runners arranged to serve as a supply route for supplying resin for sealing to the cavity arranged in each product formation region 20a in the following sealing step.

As shown in FIG. 12 which is a partial enlarged view of FIG. 11, the cap 2 is arranged at the center of each product formation region 20a. Generally, in the manufacturing step of the lead frame type semiconductor device, a die pad (tub) which is a chip mounting portion for mounting the semiconductor chip thereon is arranged at the center of the product formation region. The die pad is coupled to the frame part of the lead frame via the suspension leads. In this embodiment, however, the cap 2 also serves as the chip mounting portion, and thus the die pad which is integrally formed with the lead frame in the related art is not formed. In this embodiment, the cap 2 is formed of different material from that of the lead frame 20. For example, the lead frame 20 is made of metal, for example, copper (Cu) or a copper alloy in this embodiment. Specifically, as shown in FIG. 13, a plated film (metal film) 22 is formed of, for example, nickel (Ni) or nickel.palladium (Ni/Pd), over the surface of a base 21 comprised of copper (Cu). In the cap 2, the plated film (metal film) 22 comprised of, for example, nickel (Ni) or nickel.palladium (Ni/Pd) is formed over the surface of the base 23 made of, for example, kovar. Thus, the cap 2 is separately formed form the lead frame 20, and bonded and secured to the leads 3 via the adhesive 13. At this time, the plated film 22 comprised of nickel or nickel.palladium (Ni/Pd) is framed over the adhesive interface between the adhesive 13 and each of the lead 3 and the cap 2, which can improve the adhesion with the adhesive 13. In this step, as shown in FIG. 12, the lead frame 20 with the leads 3 and the cap 2 bonded and secured thereto is provided. In the following description, especially, except when described by distinguishing from the cap 2, the lead frame 20 contains the cap 2 bonded and secured to the leads 3.

As shown in FIG. 12, the leads 3 are arranged around the cap 2. The leads 3 each are comprised of inner lead parts 3a sealed by the sealing member 9 upon completion of formation, and outer lead parts 3b exposed from the sealing member 9 as shown in FIG. 6. As shown in FIG. 13, the inner lead 3a includes a bonding region 3c, a sealing region 3d, and a sealing region 3e which are arranged in that order from the inner end of each lead 3. The outer lead 3b includes a dam region 3f and an outermost region 3g which are arranged in that order from the boundary with the inner lead 3a. The bonding region 3c is arranged at an inner end of the lead 3. The bonding region 3c is a region for bonding the wire 4 (see FIG. 6) in a wire bonding step (see FIG. 10). The sealing region 3d is arranged between the bonding region 3c and the outer lead 3b. In a cap bonding step (see FIG. 10), the sealing region is a region sealed by the sealing material 7 (see FIG. 6) positioned between the flange 5e of the cap 5 (see FIG. 6) and the sealing region itself. The sealing region 3e is arranged between the sealing region 3d and the outer lead part 3b, and is a region sealed with the sealing member 9 (see FIG. 6) in a sealing step (see FIG. 10). The dam region 3f is a region arranged between the sealing region 3e and the outermost region 3g, and coupled to the dam 24 (see FIG. 12) which is to serve as a dam upon supplying the resin for sealing to a molding die in the sealing step (see FIG. 10). The outermost region 3g is positioned at an outer end of the lead 3. The outermost region 3g is a region subjected to a bending process, for example, in a gull wing shape as shown in FIG. 6, in a lead formation step (see FIG. 10).

Each dam (dam bur, or tie bar) 24 is arranged to extend so as to intersect (to be directed orthogonal to) the leads 3 between the dam regions 3f (see FIG. 13) of the leads 3 shown in FIG. 12. The leads 3 are integrally formed with the lead frame 20 via the dams 24. The dams 24 are arranged to enclose the cap 2. In the sealing step (see FIG. 10) to be described later, the resin for sealing is supplied into the region enclosed by the dams 24 to thereby form the sealing member 9 shown in FIG. 6. The suspension lead 14 is arranged at each corner of the rectangle formed by the dams 24. In other words, the leads 3 are arranged between the adjacent suspension leads 14. The suspension lead 14 is a member for causing each component inside the product formation region 20a to be supported by the lead frame 20 after the outermost regions 3g of the leads 3 (see FIG. 13) are cut in the lead formation step shown in FIG. 10 until a singulating step. Thus, the suspension lead 14 is integrally foamed with the lead frame 20.

The lead frame 20 shown in FIGS. 11 to 13 can be formed, for example, in the following way. First, a thin plate made of copper (Cu) is provided to thereby form the leads 3, the suspension leads 14, and the dams 24 in the pattern, for example, as shown in FIG. 12 by etching. The caps 2 are provided corresponding to the number of product formation regions 20a shown in FIG. 11, and the adhesive 13 is arranged at the periphery of the upper surface 2a. And, the cap 2 is bonded to the leads 3 by alignment so as to superimpose the region with the adhesive 13 arranged over the upper surface 2a of the cap 2 on the tip regions (bonding region 3c and sealing region 3d shown in FIG. 13) of the leads 3. Then, the adhesive 13 is hardened, for example, by heating the lead frame 20 with the cap 2 bonded thereto, to thereby fix the cap 2 to the leads 3. At this time, in order to improve the sealing properties of the space 8 shown in FIG. 6, it is important to dispose the adhesive 13 so as not to generate a gap between the lower surface of the lead 3 and the upper surface 2a of the cap 2. In the case of a paste-like adhesive, when the amount of the adhesive 13 is excessive, a part of the adhesive 13 comes around toward the upper surface side of the bonding region 3c (see FIG. 13), which causes failures in bonding in the wire bonding step (see FIG. 10). Thus, the adhesive 13 is preferably formed using a film-like adhesive (specifically, an adhesive layer positioned on the upper and lower surfaces of the resin film as the base, for example, an adhesive material including a thermoset resin layer).

As mentioned above, the caps 2 are provided corresponding to the number of the product formation regions 20a shown in FIG. 11, and are then aligned with the leads 3. However, various modified examples can be applied. For example, the following modified form can be employed. That is, the caps 2 are integrally coupled together via a suspension lead (not shown) (suspension lead for coupling the caps) to cause the cap 2 to be bonded and secured to the leads 3, and then the suspension leads are cut. In this case, the caps 2 and the leads 3 which are arranged in the product formation regions 20a can be totally aligned with each other. Further, since there is a need for a space for cutting the suspension leads (not shown) coupling the caps 2 together, the suspension lead 14 integrally formed with the lead frame 20 is preferably arranged spaced apart from the cap 2. Thus, the suspension leads (not shown) for coupling the caps 2 together can be cut in a space between the suspension lead 14 and the cap 2. When the caps 2 not coupled together are bonded and secured to the leads 3, in a modified example corresponding to FIG. 12, the suspension leads 14 can be bonded and secured to the upper surface 2a side of each of the caps 2, like the leads 3.

2. Semiconductor Chip Providing Step:

In a semiconductor chip providing step shown in FIG. 10, the semiconductor chips (semiconductor chip 1 and control chip 6) shown in FIG. 6 are provided. In this step, a semiconductor wafer (not shown) including a plurality of chip regions and comprised of, for example, silicon is provided. Thereafter, the semiconductor wafer is divided by running a dicing blade (not shown) along a dicing line of the semiconductor wafer to thus obtain a plurality of kinds of semiconductor chips. Specifically, the semiconductor wafer is provided which includes a sensor (movable portion) included in the sensor chip 1 of the respective chip regions shown in FIGS. 1 to 3, and a sensor circuit portion electrically connected with the movable portion and formed by the MEMS technique. Another semiconductor wafer is provided which includes a control circuit included in the control chip 6 shown in FIGS. 6 to 8, in each of the chip regions. Each semiconductor wafer is singulated, so that the sensor chips 1 and the control chips 6 are obtained. In this embodiment, the sensor chip 1 shown in FIG. 6 is mounted over the surface 6a of the control chip 6 via the film-like adhesive, for example, DAF. The adhesive 12 is attached to the back surface 1b of each of the sensor chips 1 obtained in this step.

3. Semiconductor Chip Mounting Step

Figure 14:
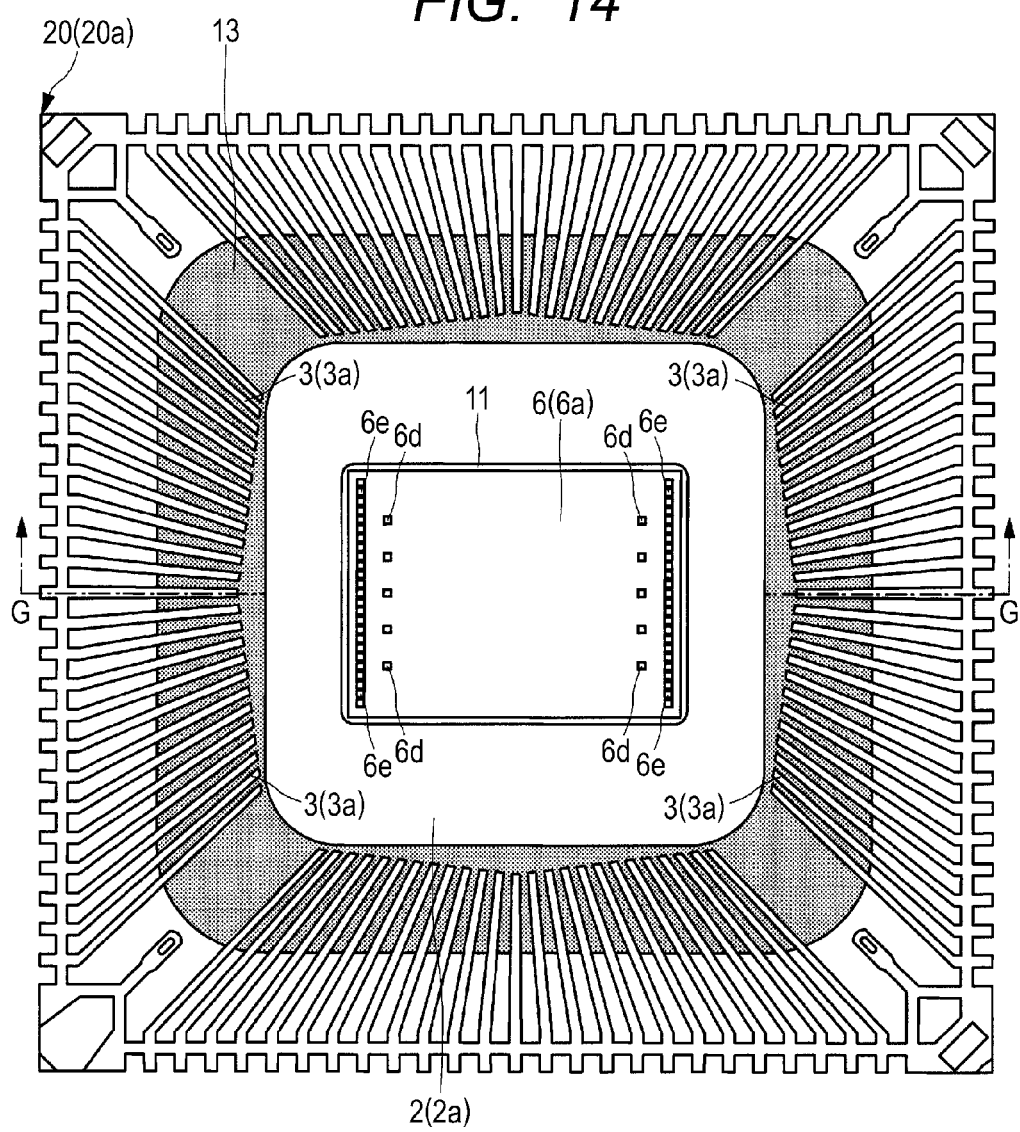
FIG. 14 is an enlarged plan view showing the state of a semiconductor chip (control chip) mounted over a cap shown in FIG. 12, via an adhesive.
Figure 15:
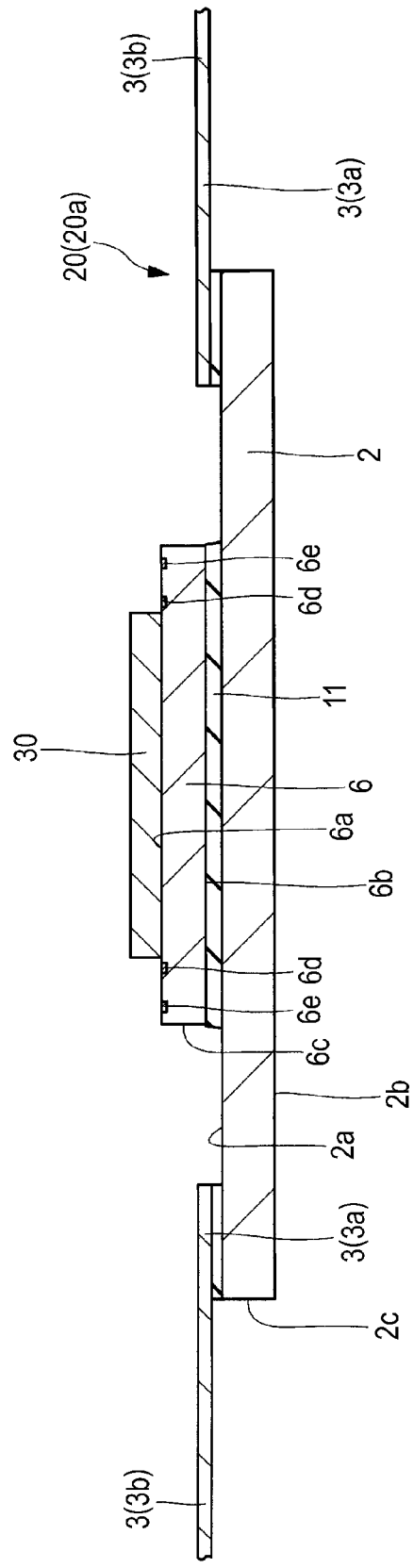
FIG. 15 is an enlarged cross-sectional view taken along the line G-G of FIG. 14.
Figure 16:
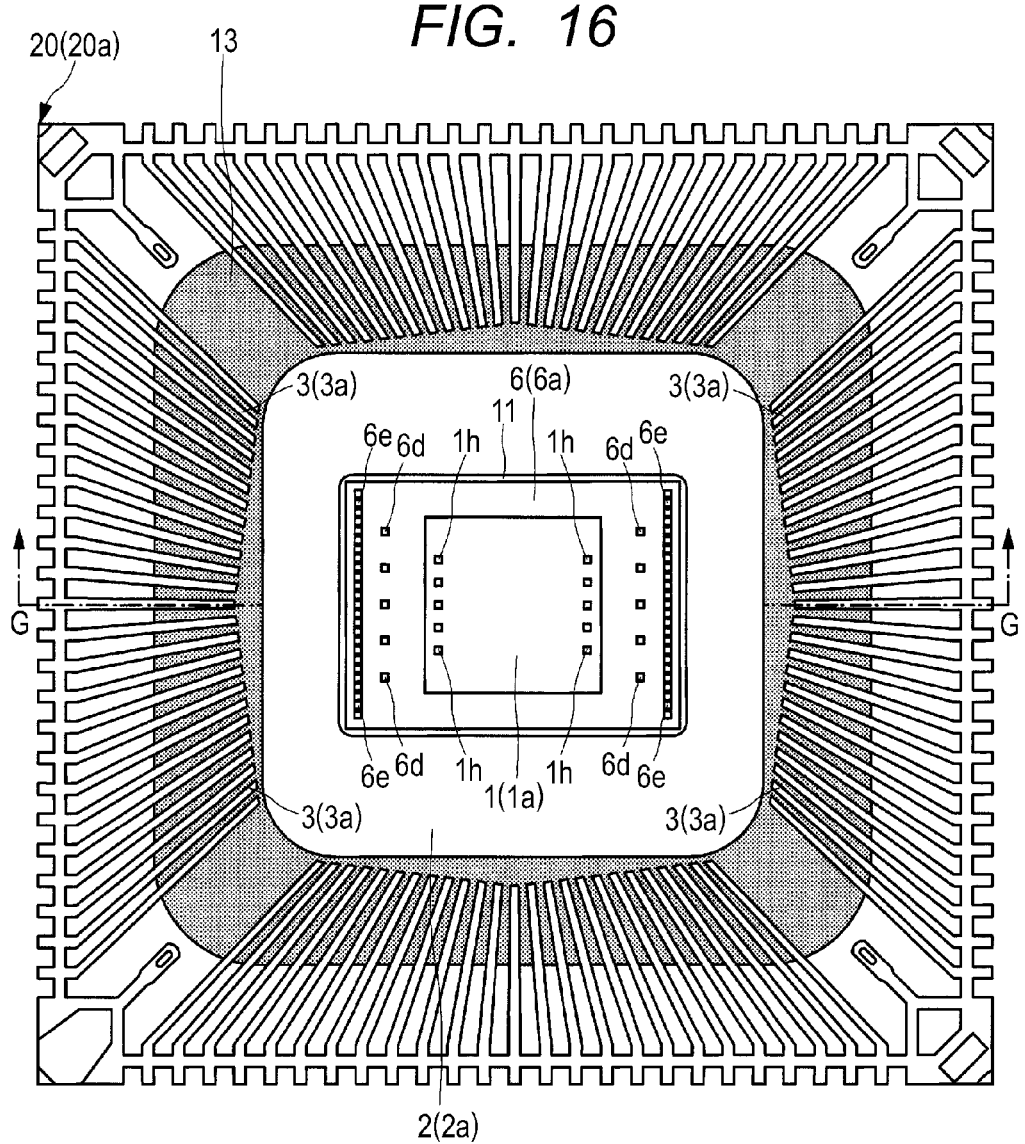
FIG. 16 is an enlarged plan view showing the state of a semiconductor chip (control chip) mounted over a control chip shown in FIG. 14 over an adhesive.
Figure 17:
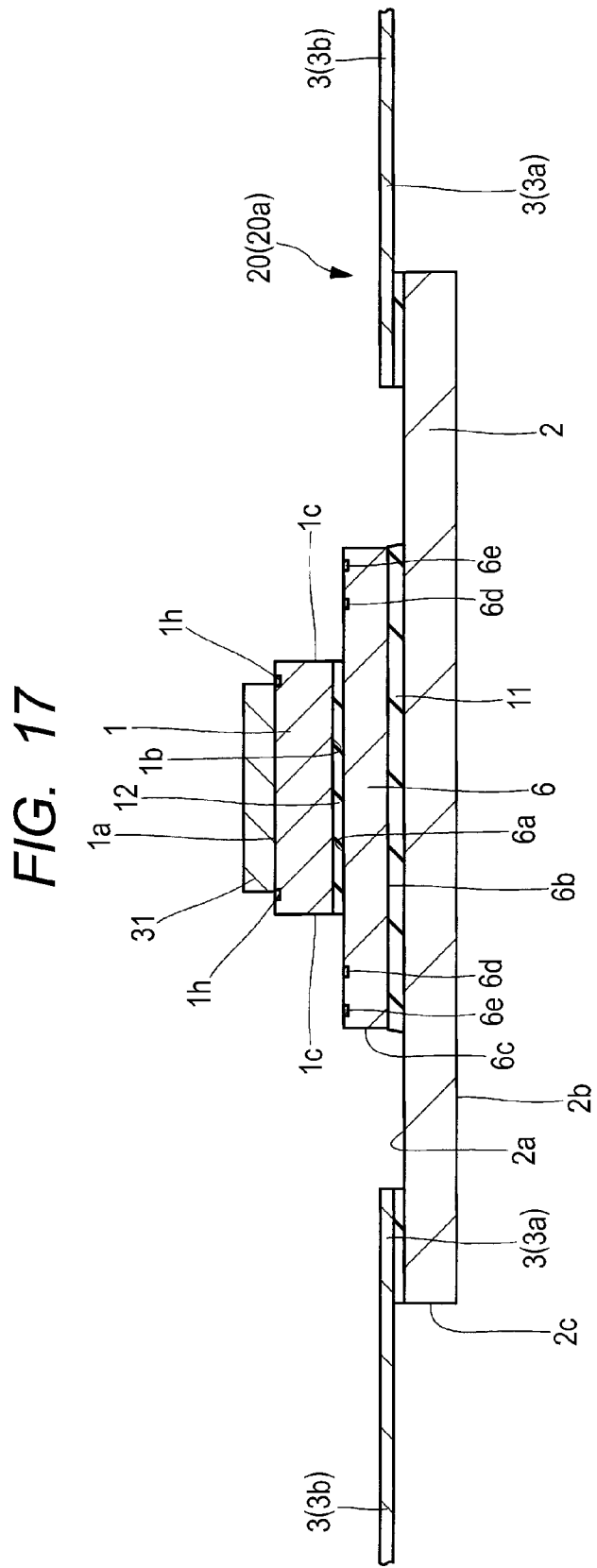
FIG. 17 is an enlarged cross-sectional view taken along the line G-G of FIG. 16.

FIG. 14 is an enlarged plan view showing the state in which the semiconductor chip (control chip) is mounted over the cap shown in FIG. 12 via the adhesive. FIG. 15 is an enlarged cross-sectional view taken along the line G-G of FIG. 14. FIG. 16 is an enlarged plan view showing the state in which the semiconductor chip (sensor chip) is mounted over the control chip shown in FIG. 14 via the adhesive. FIG. 17 is an enlarged cross-sectional view taken along the line G-G of FIG. 16. FIGS. 14 and 16 show an enlarged view of the surroundings of the cap 2 shown in FIG. 12 for easy understanding.

Then, in a semiconductor chip mounting step shown in FIG. 10, the control chip 6 and the sensor chip 1 are mounted over the upper surface 2a of the cap 2 in that order as shown in FIGS. 14 to 17. In this step, as shown in FIGS. 14 and 15, the control chip 6 which is a semiconductor chip arranged as a lower layer is mounted over the upper surface 2a of the cap 2 via the adhesive 11. In this embodiment, as shown in FIG. 14, the pads 6d and 6e are respectively formed over two sides opposed to each other among four sides included in the surface 6a. In this step, two sides where the pads 6e of the control chip 6 are arranged are arranged at the center of the cap 2 along the respective sides of the cap 2 so as to be respectively opposed to a group of leads (leads 3) bonded and secured to the cap 2. As shown in FIG. 15, the so-called face-up mounting is performed such that the back surface 6b of the control chip 6 is mounted to be opposed to the upper surface 2a of the cap 2.

In this embodiment, the control chip 6 is mounted by the adhesive 11, for example, comprised of an epoxy thermoset resin. The adhesive 11 is a paste-like material having flexibility before being hardened (thermally-cured). In use of the paste-like material as the adhesive 11, first, the paste-like adhesive 11 is applied to a chip mounting region of the upper surface 2a of the cap 2. Then, for example, the adhesive 11 is spread over and bonded to the entire back surface 6b of the control chip 6, for example, by pushing a pressing jig 30 shown in FIG. 15 against the front surface 6a of the control chip 6 to press the back surface 6b of the control chip 6 against the upper surface 2a of the cap 2. After the adhesion, the adhesive 11 is hardened (for example, subjected to a heat treatment), so that the control chip 6 is secured to the chip mounting region 2d by the adhesive 11 as shown in FIGS. 14 and 15. In a modified example, the adhesive 11 can be a film-like adhesive. Taking into consideration the improvement of heat dissipation toward the cap 2, an adhesive containing conductive particles having a high thermal conductivity may be used. The paste-like adhesive is preferable because the adhesive can improve the strength of bonding to the upper surface 2a of the cap 2 comprised of metal (for example, nickel or nickel.palladium). In this way, the use of the paste-like adhesive 11 spreads the adhesive 11 over the entire back surface 6b of the control chip 6, so that the outer edge of the adhesive 11 is expanded outward from the outer edge of the control chip 6 as shown in FIGS. 14 and 15. In order to suppress the reduction in reliability of the QFP 10 (see FIG. 6), it is important to prevent a part of the adhesive 11 from getting wet and rising up to the front surface 6a side of the control chip 6 to cover the pads 6d and 6d, or to reach the sensor chip 1 (see FIG. 6). Thus, the amount of arrangement of the adhesive 11 (application amount) is preferably small as long as the adhesive 11 gets wet and spreads over the entire back surface 6b of the control chip 6. The increase in viscosity of the adhesive 11 to some degree can prevent the adhesive 11 from getting wet and rising up to the surface 6a side. Thus, the viscosity of the adhesive 11 before hardening is higher than that of the adhesive 7 before hardening shown in FIG. 6.

As shown in FIGS. 16 and 17, the sensor chip 1 is mounted over the front surface 6a of the control chip 6 via the adhesive 12. In this step, the sensor chip 1 is arranged over the surface 6a of the control chip 6 such that the back surface 1b of the sensor chip 1 (surface with the adhesive 12 bonded thereto) is opposed to the front surface 6a of the control chip 6. The sensor chip 1 is mounted, for example, by pushing a pressing jig 31 shown in FIG. 17 against the surface 6a of the control chip 6 to press the back surface 1b of the sensor chip 1 against the surface 6a of the control chip 6. Since the film-like adhesive 12 is previously bonded to the back surface 1b of the sensor chip 1, the sensor chip 1 can be mounted by a weak pressed force as compared to the case of mounting the control chip 6. Thus, the damages on the sensor chip 1 in this step can be suppressed. When the film-like adhesive 12 is used, the adhesive 12 does not protrude outward from the outer edge of the back surface 1b of the sensor chip 1 as shown in FIG. 17, which can prevent a part of the adhesive 12 from being attached to the side 1c of the sensor chip 1, or a part of the adhesive from being attached to (or polluting) the bonding pad 6b of the control chip 6. Then, the adhesive layer of the adhesive 12 is hardened to thereby fix the sensor chip 1 to the surface 6a of the control chip 6.

4. Wire Bonding Step

Figure 18:
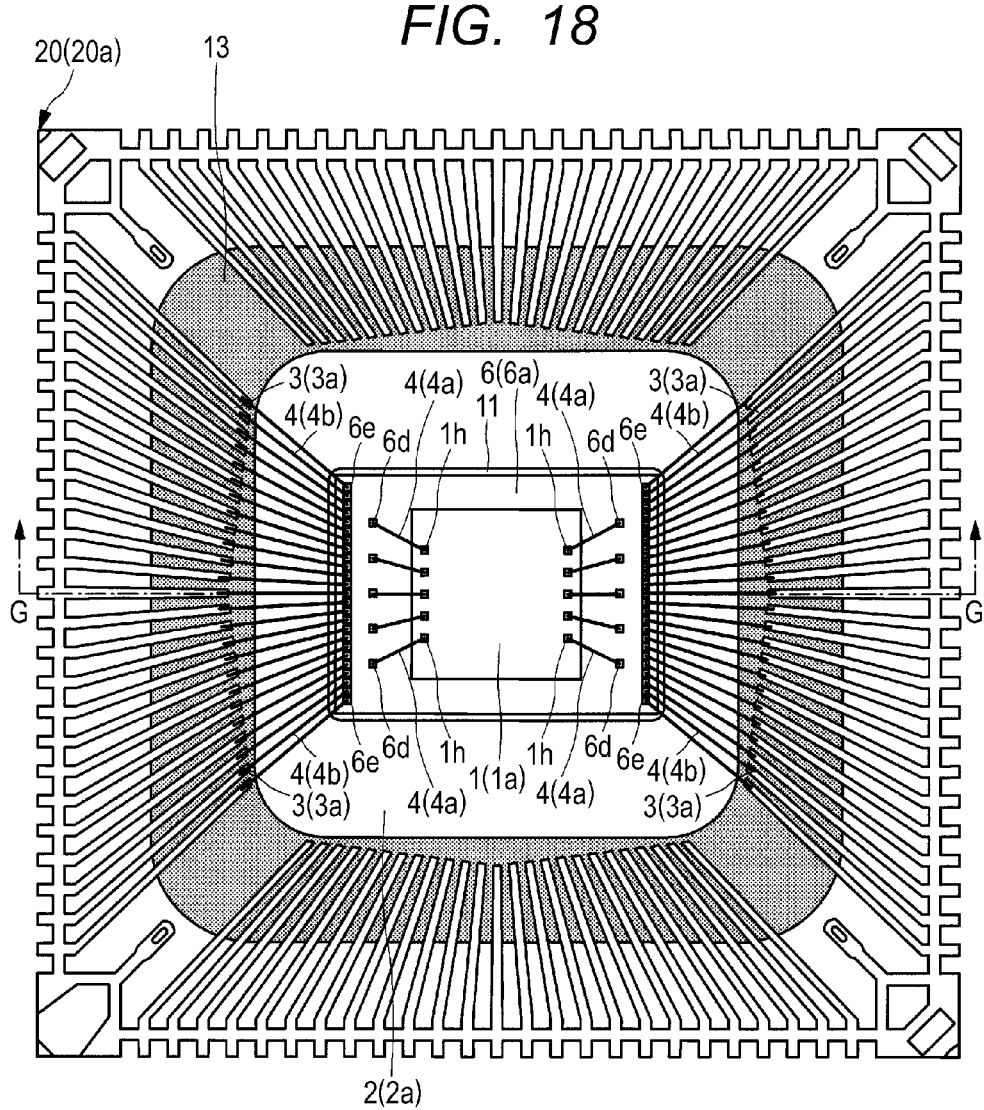
FIG. 18 is a plan view showing the state in which the semiconductor chip and a plurality of leads shown in FIG. 16 are electrically connected together via wires.
Figure 19:
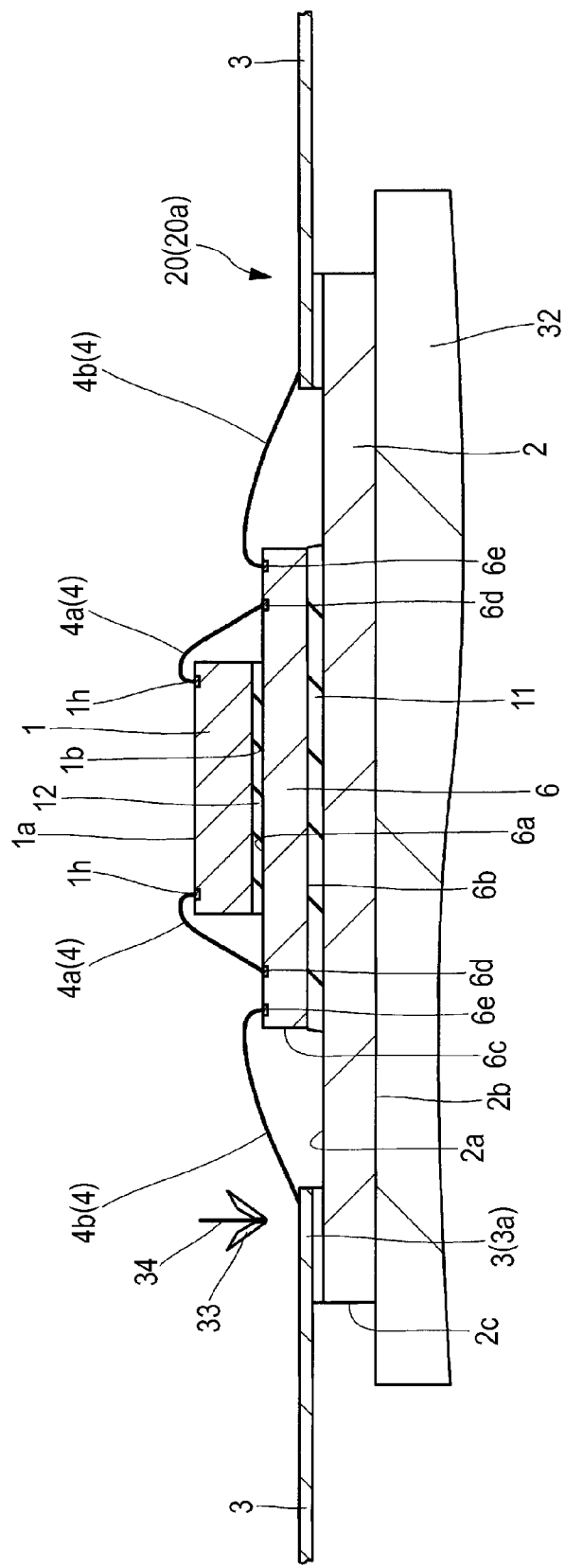
FIG. 19 is an enlarged cross-sectional view taken along the line G-G of FIG. 18.

FIG. 18 is a plan view showing the state in which the semiconductor chip shown in FIG. 16 is electrically connected with the leads via the wires. FIG. 19 is an enlarged cross-sectional view taken along the line G-G of FIG. 18.

Then, in the wire bonding step shown in FIG. 10, as shown in FIGS. 18 and 19, the pads of the semiconductor chip are electrically connected with the leads 3 via the wires 4. In this step, the pads 1h of the sensor chip 1 are electrically connected with the pads 6d of the control chip 6 via the wires 4a. The pads 6e of the control chip 6 are electrically connected with the leads 3 via the wires 4b.

Specifically, for example, a heat stage 32 as a heating source is provided upon the wire bonding, for example, as shown in FIG. 19. The lead frame 20 is arranged over the heat stage 32, and then the control chip 6 and the sensor chip 1 are heated via the cap 2. A ball is formed by electric discharge of an end of a wire 34 protruding from the tip of a capillary 33, and the ball is joined to the pad 1h or pad 6e as the first bond side. The wires 34 are jointed using both ultrasonic wave and thermocompression bonding, that is, by the so-called nail head bonding. After jointing the first bond side, the capillary 33 is moved, while gradually unreeling the wire 34 from the capillary 33, thus forming a looped shape of the wire 4. After jointing the wire 34 to the pad 6d or the bonding region 3c of the lead 3 on the second bond side (see FIG. 13), the wire 34 is cut, whereby the wire 4 having the looped shape is formed as shown in FIG. 19. The order of coupling of the wires 4a and 4b is not limited to a specific one. In this embodiment, the pads 1h and 6e positioned on the relatively upper side are defined as the first bond side. That is, the wires 4 are formed by the so-called positive bonding. In a modified example, the pads 1h and 6e are defined as the second bond side. That is, the reverse bonding can be applied. When the wire 4(4a) is formed by the positive bonding, for example, a bump (not shown) comprised of a part of the wire is previously formed over the pad 6d as the second bond side, and a part of the wire 4(4a) is coupled to the bump. On the other hand, when applying the reverse bonding, for example, a bump (not shown) comprised of a part of the wire is formed over each of the pads 1e and 6d, and a part of the wire 4(4a) is coupled to the corresponding bump.

5. Cap Bonding Step

Figure 20:
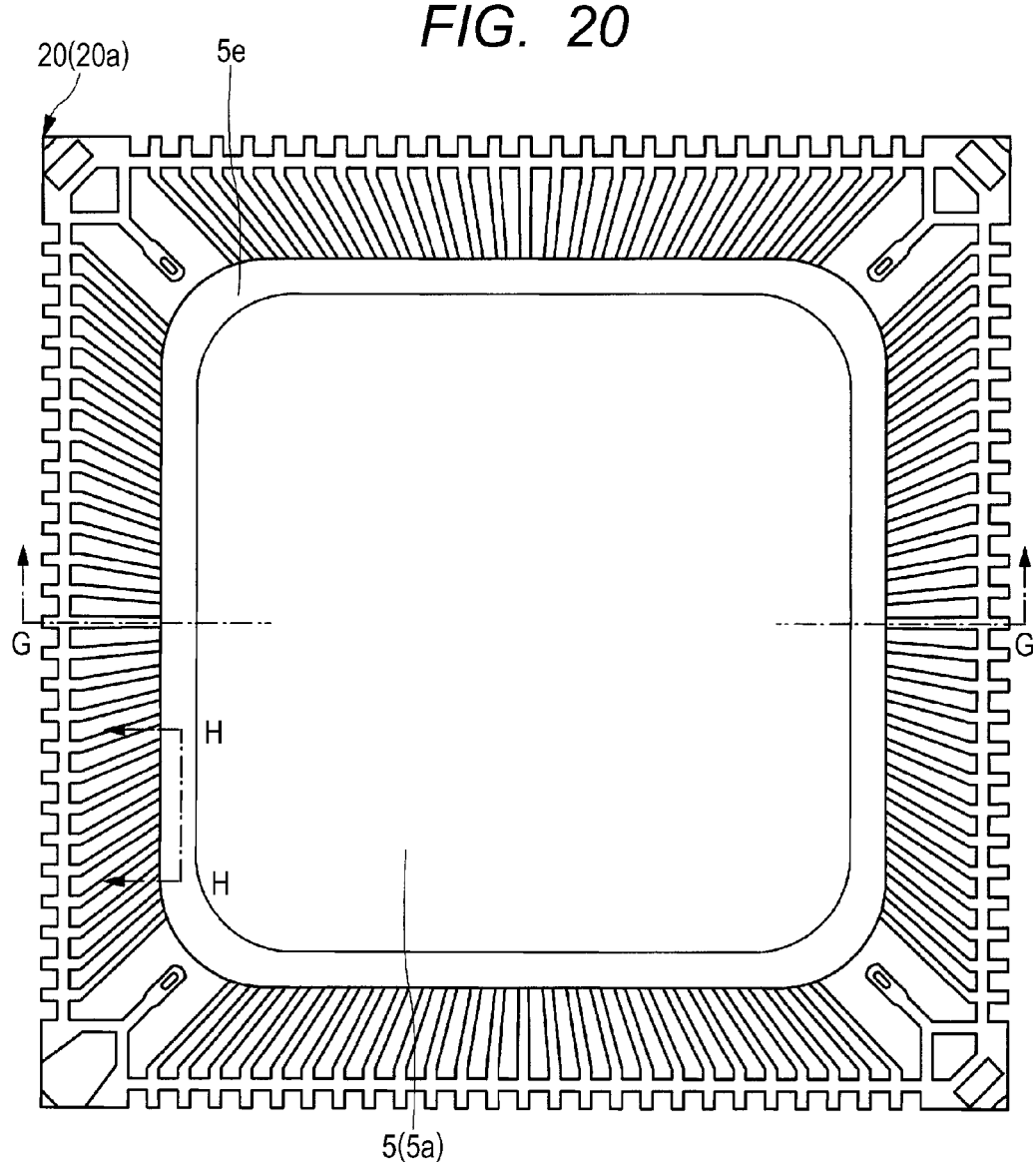
FIG. 20 is an enlarged plan view showing the state in which another cap is bonded and secured to the cap shown in FIG. 18, while being superimposed thereover.
Figure 21:
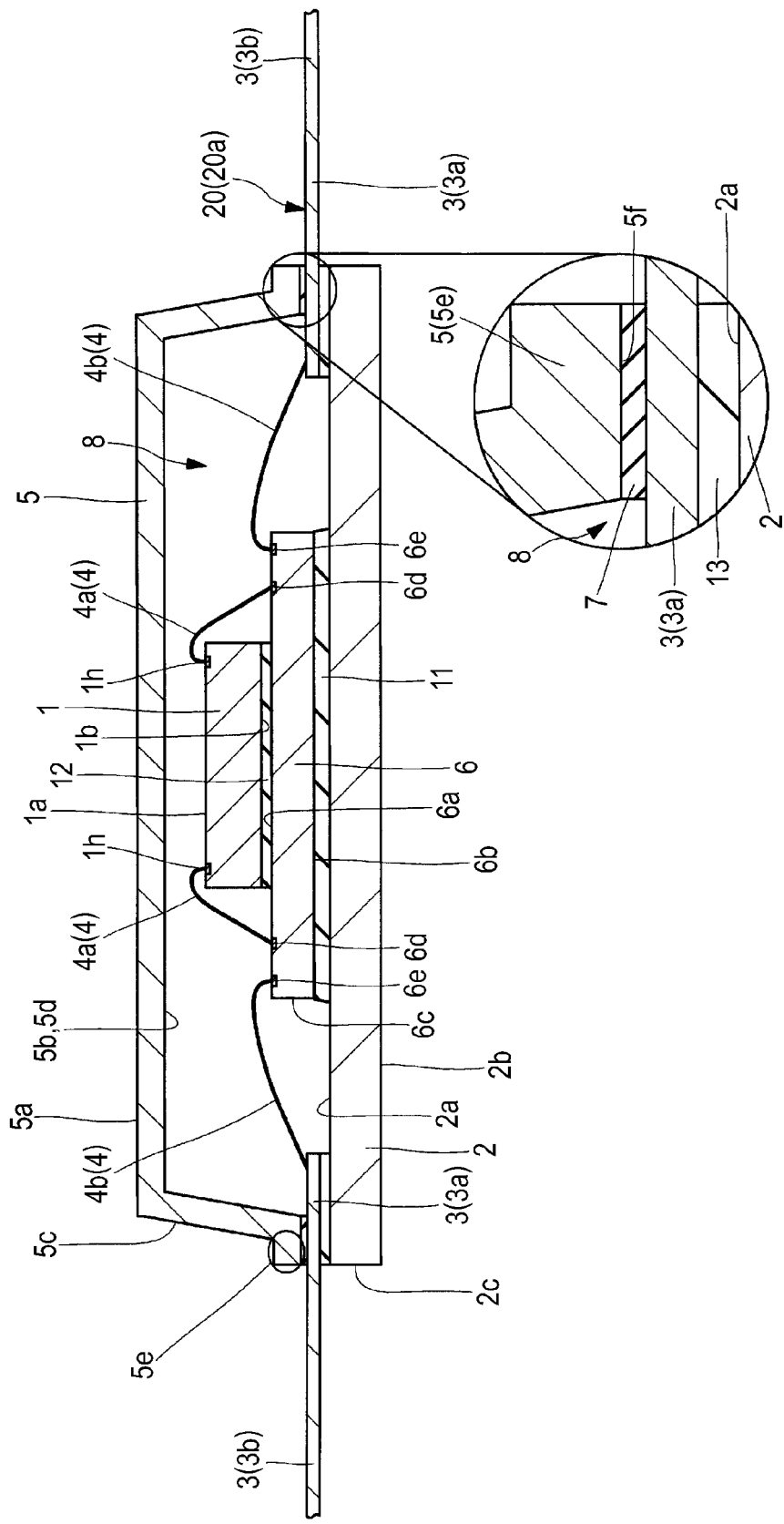
FIG. 21 is an enlarged cross-sectional view taken along the line G-G of FIG. 20.
Figure 22:
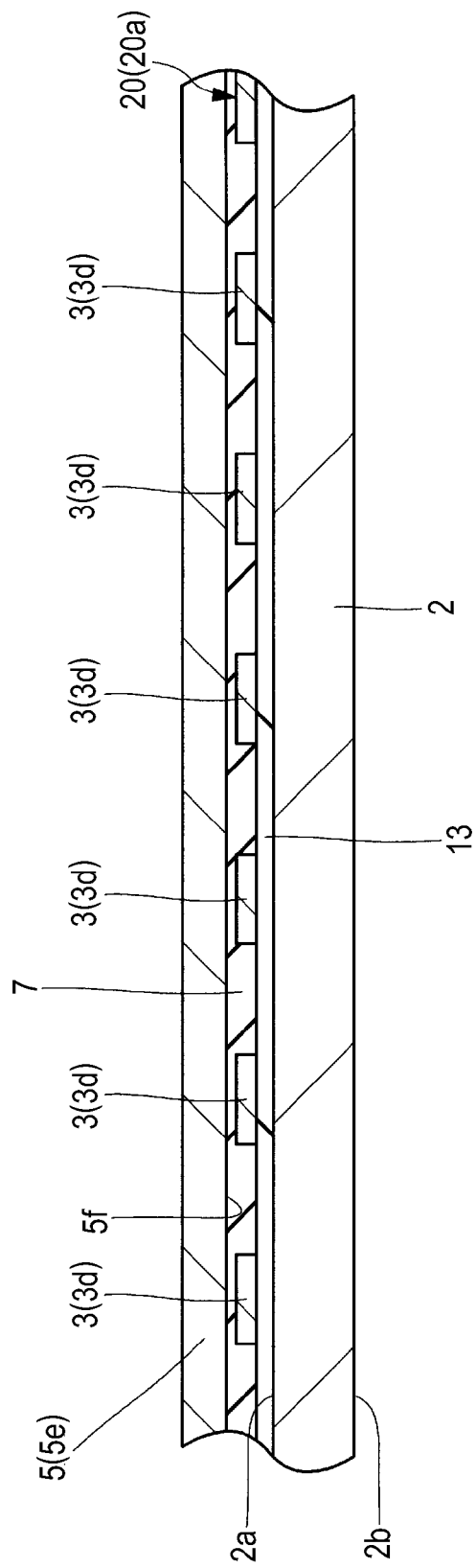
FIG. 22 is an enlarged cross-sectional view taken along the line H-H of FIG. 20.
Figure 23:
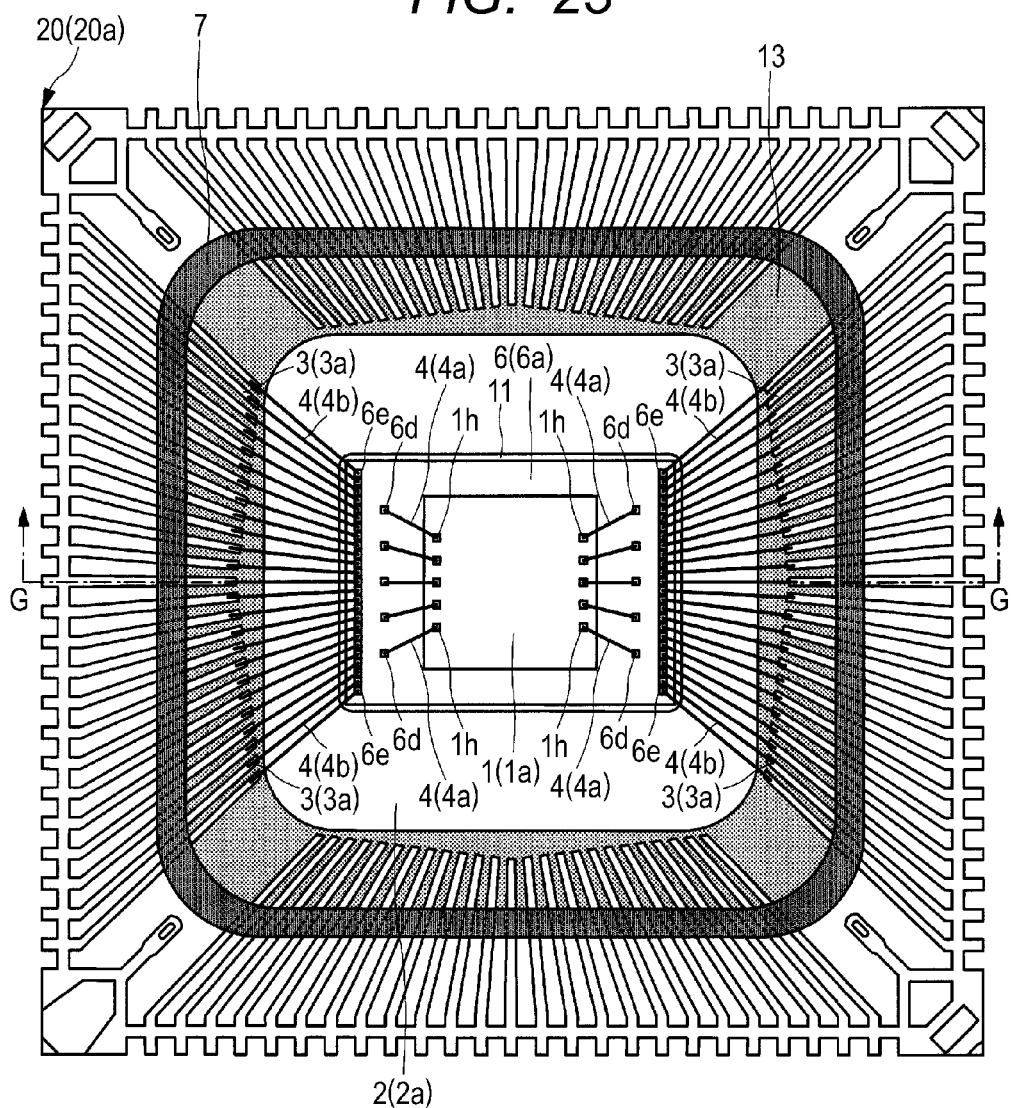
FIG. 23 is an enlarged plan view showing the state in which a sealing material is applied over the cap and leads shown in FIG. 18.
Figure 24:
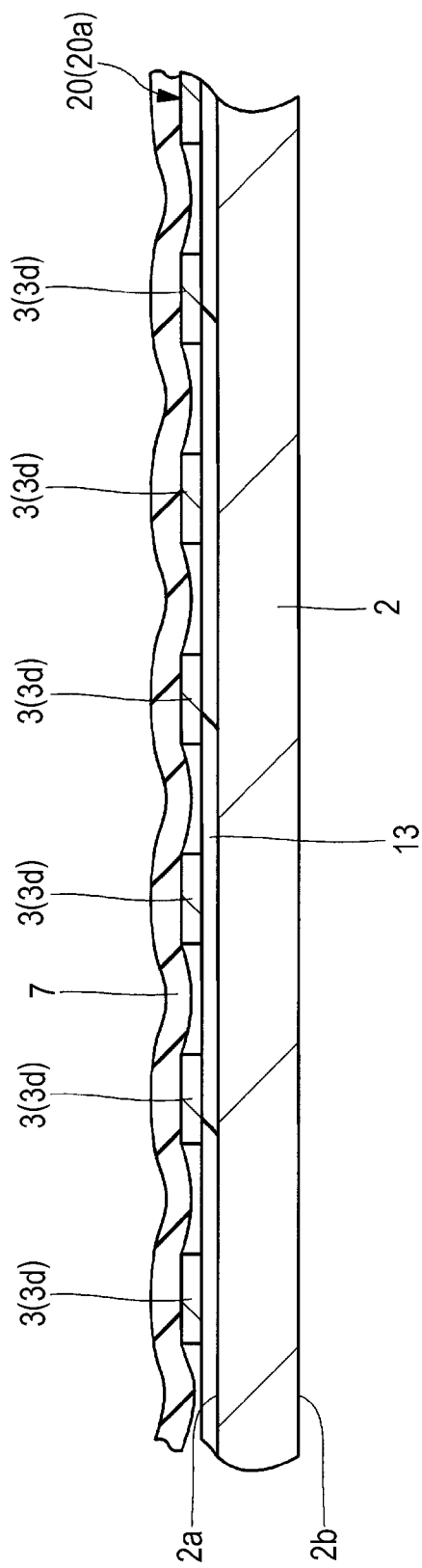
FIG. 24 is an enlarged cross-sectional view of FIG. 23 corresponding to the cross-section taken along the line H-H of FIG. 20.

FIG. 20 is an enlarged plan view showing the state in which another cap is superimposed on and bonded and fixed to the cap shown in FIG. 18. FIG. 21 is an enlarged cross-sectional view taken along the line G-G of FIG. 20. FIG. 22 is an enlarged cross-sectional view taken along the line H-H of FIG. 20. FIG. 23 is an enlarged plan view showing the state in which the sealing material is applied to the cap and the leads shown in FIG. 18. FIG. 24 is an enlarged cross-sectional view of FIG. 23 corresponding to the cross-section taken along the line H-H of FIG. 20.

Then, in a cap bonding step shown in FIG. 10, as shown in FIG. 21, the cap (second member, or front surface side cap material) 5 is provided over the upper surface 2a of the cap 2. The adhesive surface (lower surface) 5f of the flange 5e provided outside the cavity 5d of the cap 5 is bonded and fixed to (or mounted on) the upper surface 2a of the cap 2 via the adhesive 7. A method for mounting the cap 5 will be performed, for example, in the following way.

First, as shown in FIGS. 23 and 24, the paste-like adhesive 7 is applied to the periphery of the upper surface 2a of the cap 2. Then, the cap 5 is arranged over the cap 2 such that the region with the adhesive 7 applied thereto is opposed to the adhesive surface 5f of the flange 5e of the cap 5 shown in FIGS. 22 and 23. The cap 5 is pressed from the upper surface 5a side toward the cap 2 by a pressing jig (not shown) to push the adhesive surface 5f of the flange 5e into the upper surface 2a side of the cap 2. As a result, as shown in FIGS. 22 and 23, the adhesive 7 is spread over to embed in the gap between the adjacent leads 3, so that the adhesive surface 5f of the flange 5e is bonded to the upper surface 2a of the cap 2 by the adhesive 7. Then, when the paste-like adhesive 7 is heated to be hardened, the adhesive surface 5f of the flange 5e is secured to the upper surface 2a of the cap 2, whereby the cap 5 is mounted over the cap 2. In this embodiment, the adhesive 7 contains, for example, an epoxy thermoset resin, and can be hardened by being heated.

As shown in FIG. 21, the cap 5 has an upper surface 5a, a lower surface 5b opposite to the upper surface 5a, and sides 5c positioned between the upper surface 5a and the lower surface 5b. The cap 5 has a recessed shape toward the upper surface 5a. The cap 5 has, on its lower surface 5b side, a cavity (space formation portion, concave portion, recessed portion, or chip housing portion) 5d, and a flange (joining portion) 5e arranged to enclose the cavity 5d. The cap 5 is obtained to have the cavity 5d and the flange 5e, for example, by pressing a flat plate comprised of kovar. A method for forming the cap 5 is not limited to the above one, but the cavity 5d and the flange 5e (portion protruding from the bottom of the flat plate) may be formed by removing (hollowing out) a part (center) of one flat thick plate.

The cavity 5d has such a planar size that can house (accommodate) therein the sensor chip 1, the control chip 6, the wires 4, and parts of the leads 3 (bonding region 13c shown in FIG. 13). In this step, the sensor chip 1, the control chip 6, the wires 4, and the parts of the leads 3 (bonding region 3c) are covered with the cap 5. In other words, in this step, the cap 5 is bonded and secured to the upper surface 2a of the cap 2 so as to cover the sensor chip 1, the control chip 6, the wires 4, and the parts of the leads 3 (bonding region 3c). The leads 3 each are comprised of the inner lead part 3a and the outer lead part 3b which are integrally formed. Each of the leads 3 is arranged to extend from the inner side of the cavity 5d of the cap 5 toward the outside of the cavity 5d. After the caps 2 and 5 are bonded and secured together, the sensor chip 1, the control chip 6, the wires 4, and the parts of the leads 3 (bonding region 3c) are arranged in the space 8 sealed by the joint part (sealing region) enclosing these components.

As mentioned above, the paste-like sealing material 7 has such a viscosity that can hold the application shape (for example, the shape shown in FIG. 24). Thus, the sealing material 7 can be prevented from being spread over the surroundings of the applied region until the cap 5 is bonded after applying the sealing material 7. The viscosity of the paste-like adhesive 7 is lower than that of the paste-like adhesive 11 shown in FIG. 15. Thus, as shown in FIG. 23, the sealing material 7 can be embedded so as not to form any gap between the adjacent leads 3. In other words, since the leads 3 are arranged in a region with the sealing material 7 applied thereto, the region has a rough uneven surface as compared to the upper surface 2a of the cap 2. Thus, some gaps are generated between the sealing material 7 and the upper surface of the cap 2 as shown in FIG. 24 on a stage where the sealing material 7 is applied. The cap 5 is pressed to push and spread the paste-like sealing material 7, which can fill the gap with the sealing material 7. In particular, the use of the adhesive 7 having a lower viscosity than that of the paste-like adhesive 11 shown in FIG. 15 improves the embedding characteristics, which can effectively suppress the occurrence of the gaps not filled with the sealing material 7.

Referring to FIGS. 23 and 24, the example of a method for applying the sealing material has been explained. As shown in FIGS. 21 and 22, the application method is not limited thereto as long as the sealing material 7 encloses the sensor chip 1, the control chip 6, the wires 4, and the bonding region of the leads 3 and can suppress the generation of the gap between the leads 3 in the sealing region (joint part) when the part of the cap 5 (flange 5e) is bonded to the upper surface 2a of the cap 2. For example, FIGS. 23 and 24 show the form in which the paste-like sealing material 7 is arranged in a strip along the periphery of the upper surface 2a of the cap 2. In a modified example, the paste-like sealing materials 7 are arranged in positions along the periphery of the upper surface 2a of the cap 2 (the region where the sealing material 7 is arranged as shown in FIG. 23), which can be the so-called multipoint application. Even in use of the multipoint application, the paste-like sealing material 7 is pressed and spread out by pushing the cap 5, so that the sealing material 7 can be embedded in the gap between the leads 3. For example, as shown in FIGS. 23 and 24, the paste-like adhesive 7 is applied over the cap 2. The member to which the adhesive 7 is applied is not limited to the cap 2. The adhesive 7 can be applied to the bonding surface 5f of the flange 5e of the cap 5. For example, the adhesive 7 can be applied to both the periphery of the upper surface 2a of the cap 2 and the bonding surface 5f of the flange 5e of the cap 5.

6. Sealing Step

Figure 25:
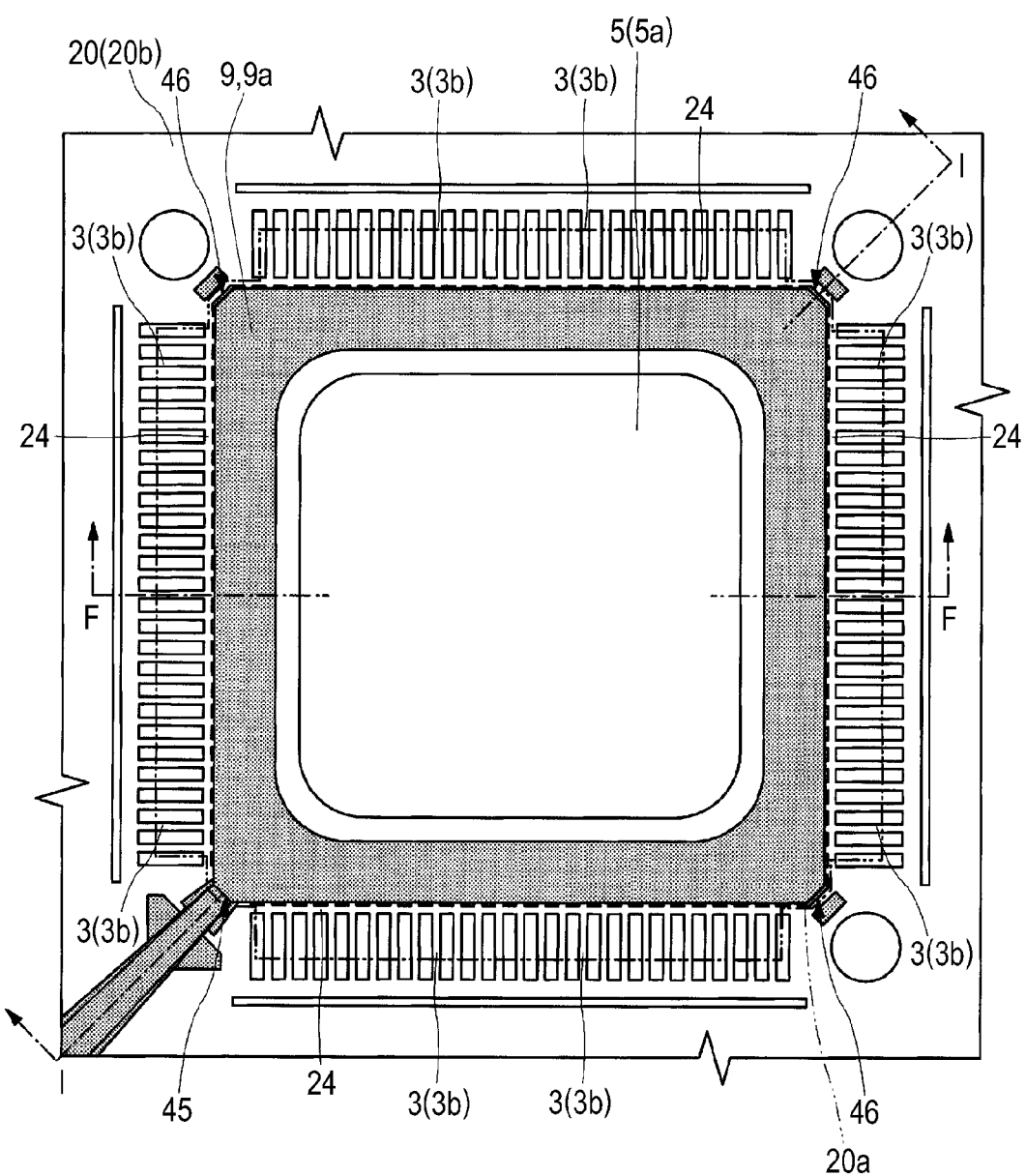
FIG. 25 is an enlarged plan view showing the state in which a sealing member is formed in a product formation region of the lead frame shown in FIG. 20.
Figure 26:
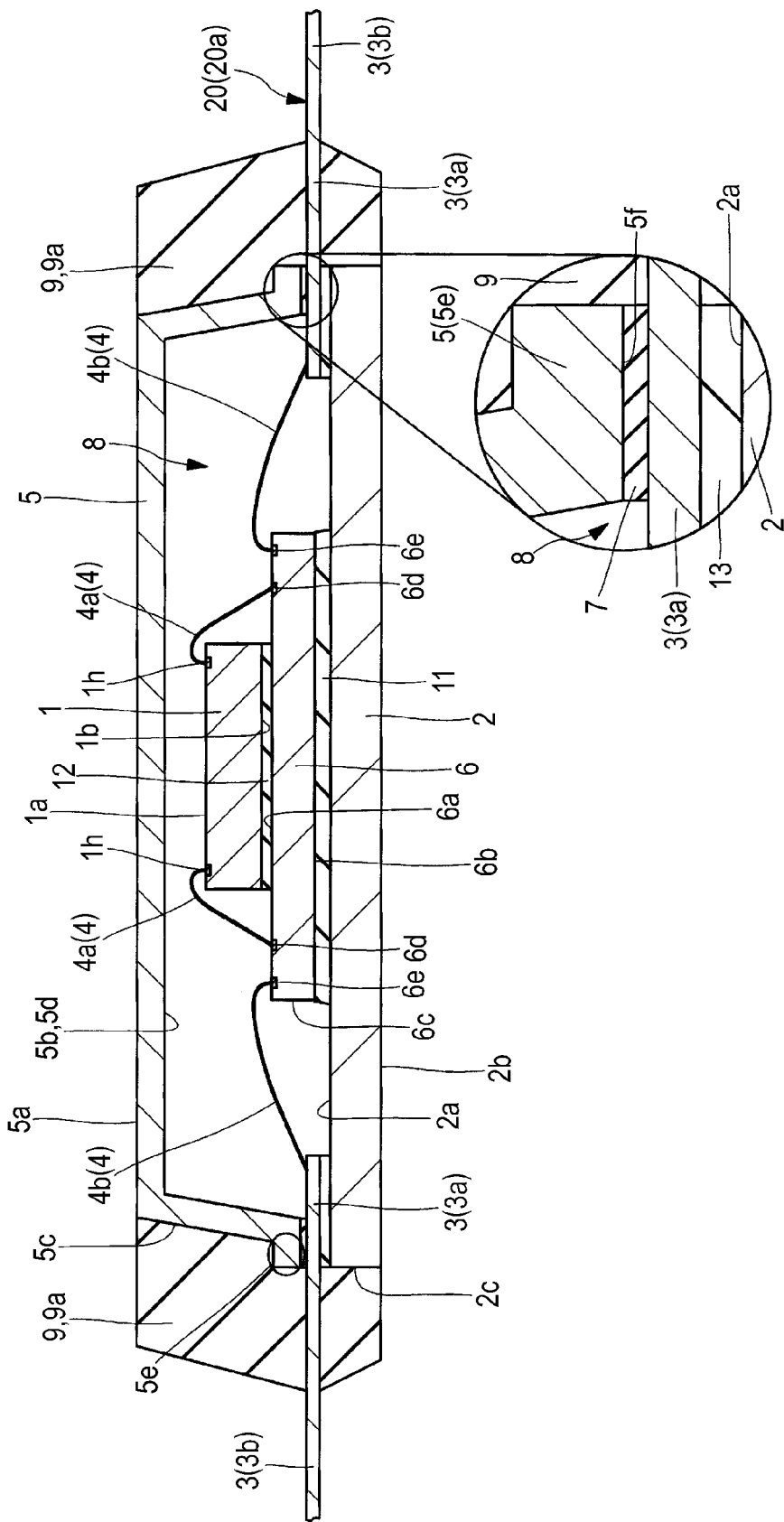
FIG. 26 is an enlarged cross-sectional view taken along the line F-F of FIG. 25.
Figure 27:
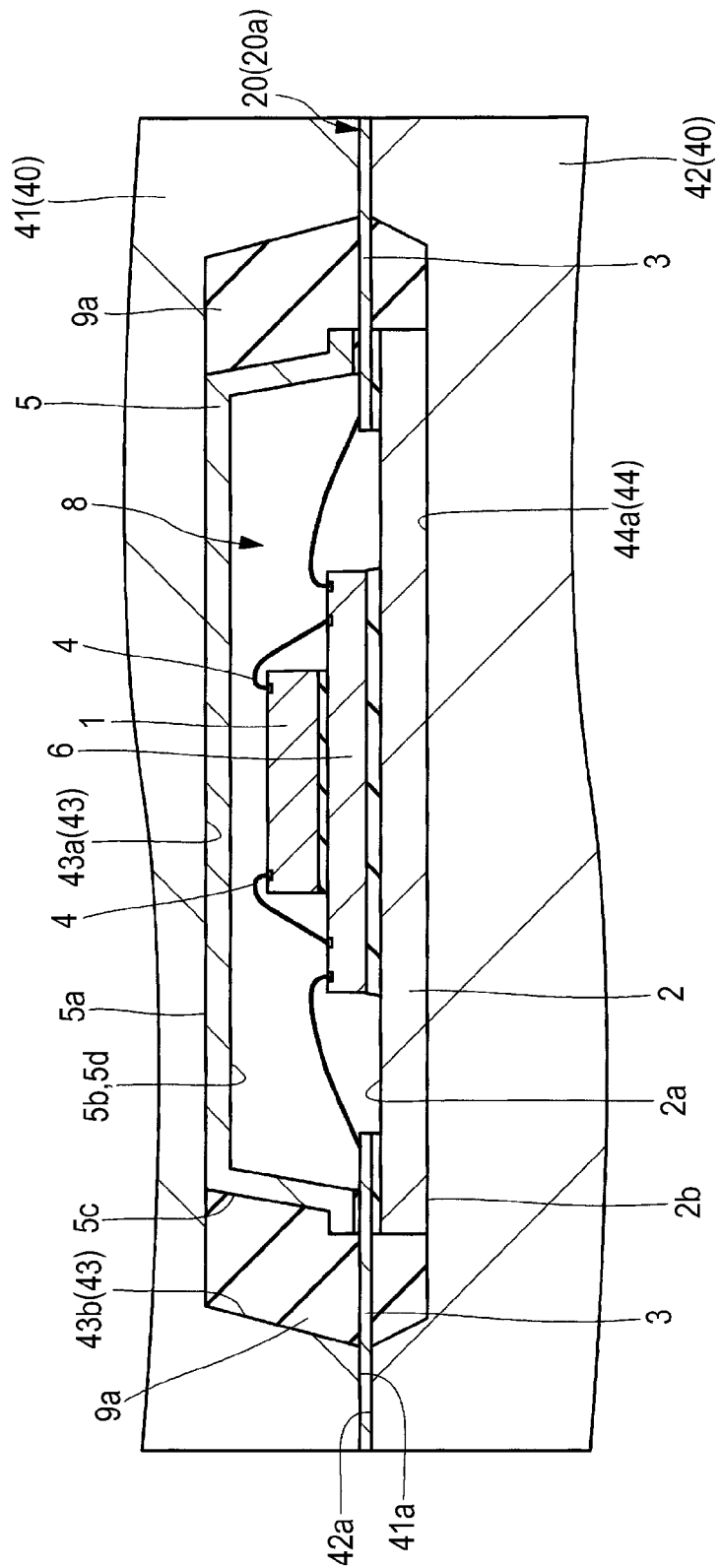
FIG. 27 is an enlarged cross-sectional view taken along the line F-F of FIG. 25, showing the state in which resin for sealing is supplied into a cavity of a molding die.
Figure 28:
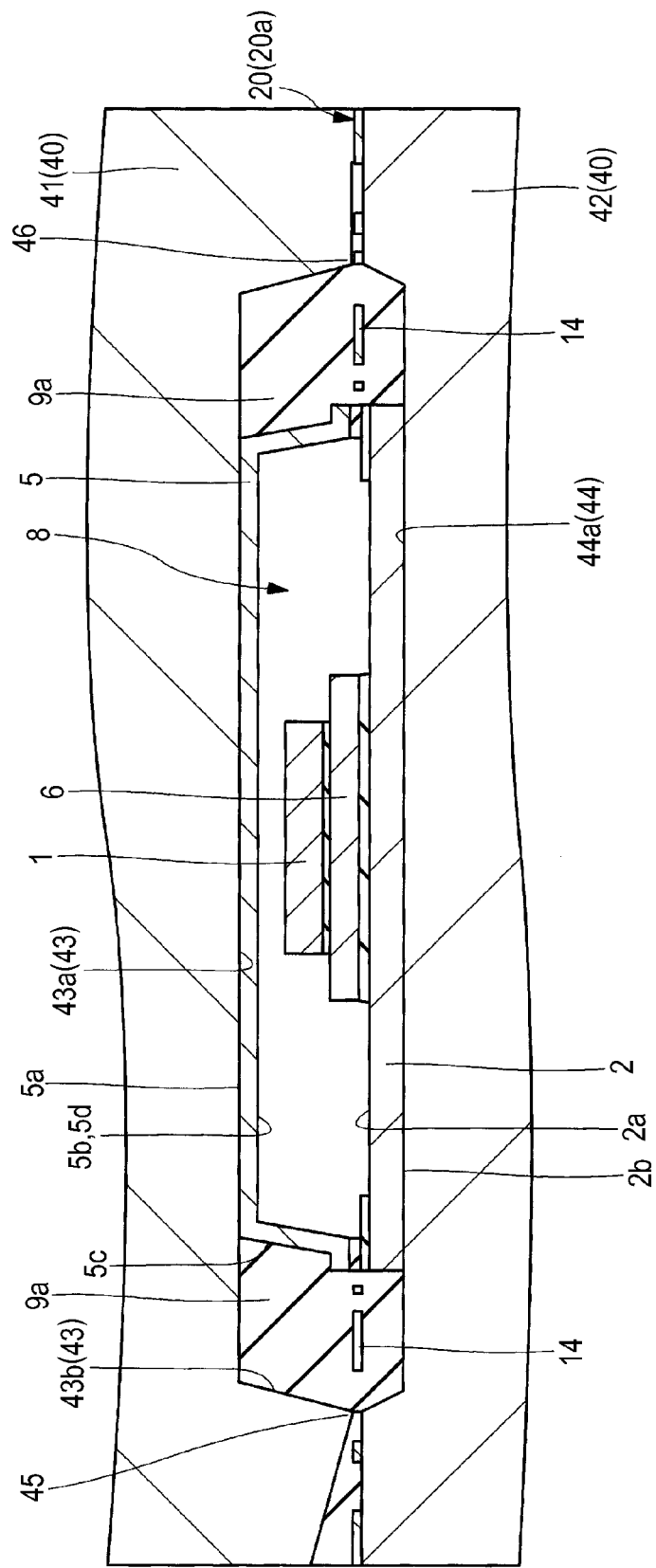
FIG. 28 is an enlarged cross-sectional view taken along the line I-I shown in FIG. 25, showing the state in which the resin for sealing is supplied into the cavity of the molding die.
Figure 57:
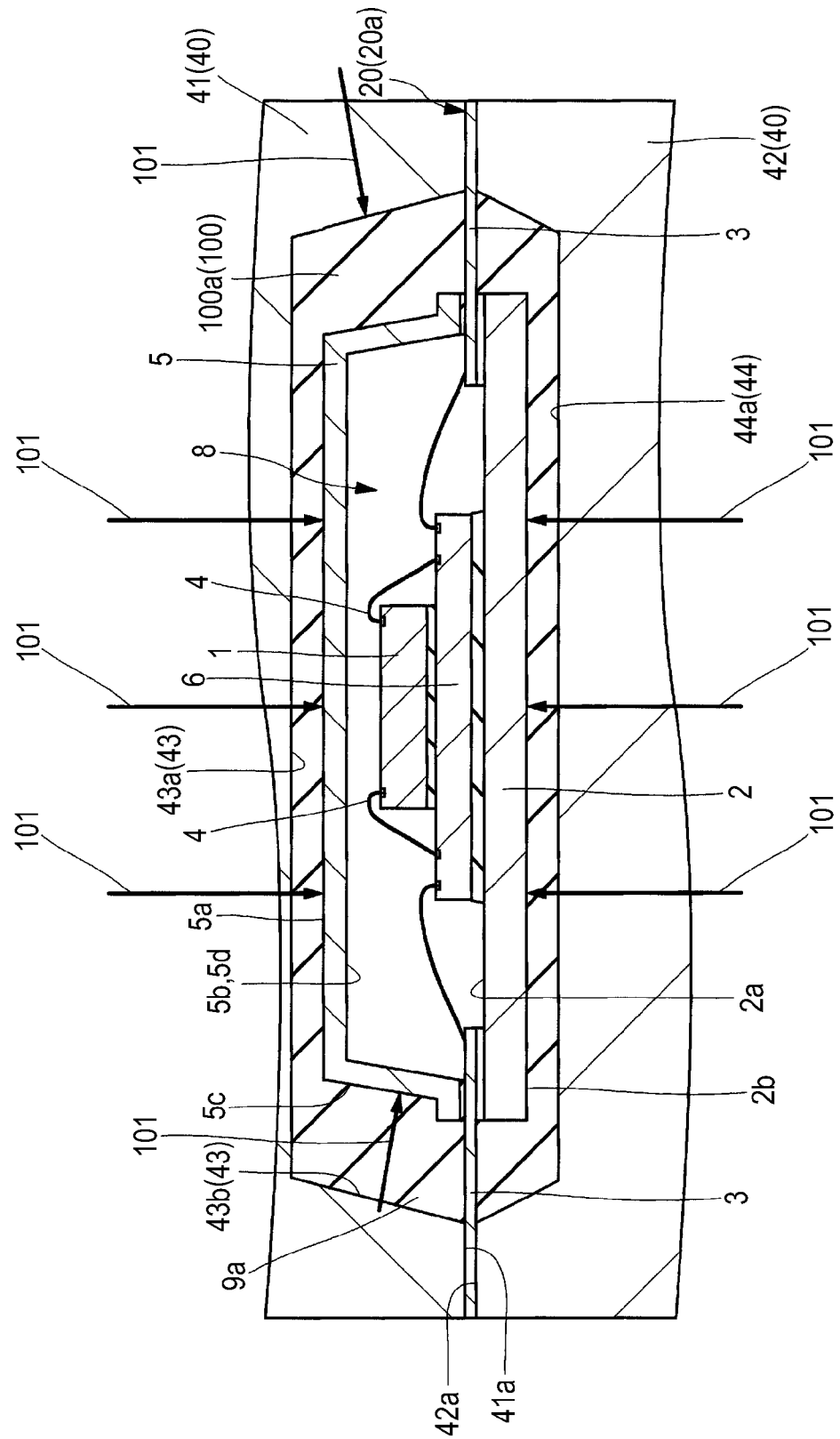
FIG. 57 is an enlarged cross-sectional view showing a comparative example corresponding to FIG. 27.

FIG. 25 is an enlarged plan view showing the state in which the sealing member is formed in the product formation regions of the lead frame shown in FIG. 20. FIG. 26 is an enlarged cross-sectional view taken along the line F-F of FIG. 25. FIG. 27 is an enlarged cross-sectional view taken along the line F-F of FIG. 25, showing the state in which resin for sealing is supplied into a cavity of a molding die. FIG. 28 is an enlarged cross-sectional view taken along the line I-I shown in FIG. 25, showing the state in which the resin for sealing is supplied into the cavity of the molding die. FIG. 57 is an enlarged cross-sectional view showing a comparative example corresponding to FIG. 27.

Then, in the sealing step shown in FIG. 10, as shown in FIGS. 25 and 26, the sealing member 9 is formed to enclose the caps 2 and 5 to thereby seal the joint part between the caps 2 and 5. As mentioned above, the space 8 shown in FIG. 22 are already sealed and bonded by the joint part between the caps 2 and 5. The sealing member 9 having a higher strength than that of the hardened sealing material 7 is formed to seal the joint part, so that the joint part can be reinforced by being sealed to maintain the sealed state.

The sealing method in this embodiment uses the so-called transfer mold. As shown in FIGS. 27 and 28, the sealing method involves fixing the semiconductor chip with the lead frame 20 mounted thereon inside cavities 43 and 44 of an upper die 41 and a lower die 42 of a molding die 40, pressing and molding the softened (plasticized) thermoset resin (resin 9a for sealing) into the cavities 43 and 44, and then heating and hardening the resin. The thermoset resin (resin 9a for sealing) used in this embodiment contains resin, and filler (particles) mixed in the resin. The transfer mold can collectively form the sealing member 9 in the product formation regions 20a, which is preferable in terms of efficiency of production. The transfer mold involves applying a strong supply pressure to the resin for sealing which is relatively hard even when it is softened, and pressing the resin into the cavity to thereby obtain the sealing member 9 which is a resin member obtained after the hardening. The strength of the obtained sealing member 9 is higher than that of the resin obtained by other methods. Thus, the transfer mold method is more preferable as a method for reinforcing the joint part.

In this step, first, the molding die 40 is provided as shown in FIGS. 27 and 28. The molding die 40 includes the upper die (first die) 41 for covering the upper surface (surface with the semiconductor chip mounted thereon) side of the lead frame 20, and the lower die (first die) 42 for covering a lower surface (surface opposite to the surface with the semiconductor chip mounted thereon) of the lead frame 20. The upper die 41 includes the cavity (recessed portion) 43, and the lower die 42 includes the cavity (recessed portion) 44. The cavities 43 and 44 are opposed and superimposed to and on each other to thus form a space for forming the sealing member 9 shown in FIG. 26. A die surface (clamp surface) 41a is arranged around the cavity 43 of the upper die 41. A die surface (clamp surface) 42a is arranged around the cavity 44 of the lower die 42 and is opposed to the die surface 41a. The molding die 40 fixes the lead frame 20 between the upper die 41 and the lower die 42 by sandwiching and pushing the lead frame 20 between the opposed die surfaces 41a and 42a. The die surfaces 41a and 42a extend up to the inside of the dam 24 shown in FIG. 25 (near the cap 5). In other words, the cavities 43 and 44 are arranged inside the dam 24 shown in FIG. 25. Thus, the resin 9a for sealing shown in FIGS. 27 and 28 does not expand outside the dam 24 (see FIG. 25), and thus the sealing member 9 having the shape shown in FIGS. 25 and 26 is formed.

As shown in FIG. 28, the molding die 40 includes a gate portion 45 serving as a supply port for the resin 9a for sealing, and a vent 46 serving as a discharge port for gas (air) inside the cavities 43 and 44 and the excessive resin 9a for sealing. In this embodiment, the cavities 43 and 44 each have four corners, in which the gate portion 45 is arranged at one corner and the vent portions 46 are arranged at the remaining three corners. The planar positions of the gate portion 45 and the vent portions 46 are illustrated in FIG. 25. As shown in FIG. 28, the way to dispose the gate portion 45 at the side 43b of the cavity 43 is called a "side gas method". In the transfer mold, the resin 9a for sealing is supplied from the gate portion 45 into the cavities 43 and 44. The resin 9a expands to enclose the caps 2 and 5 inside the cavities 43 and 44 to thereby seal the entire joint part between the caps 2 and 5. The gas (air) inside the cavities 43 and 44 is pushed by the supply pressure of the resin 9a for sealing to be discharged from the vents 46. After filling the cavities 43 and 44 with the resin 9a for sealing, a stronger pressure than the supply pressure (void removal pressure) is applied to the inside of the cavities 43 and 44 in order to forcedly discharge gas bubble (voids) remaining in the resin 9a for sealing. This is because the gas bubble remaining inside the sealing member 9 is preferably removed so as to improve the strength of the sealing member 9 shown in FIG. 26.

From the viewpoint of reinforcing the joint strength by sealing the joint part between the caps 2 and 5, like the comparative example shown in FIG. 57, a sealing member 100 is formed so as to cover the lower surface of the cap 2 and the upper surface 5a of the cap 5. In this case, since the interface between the sealing member 100 and the caps 2 an 5 is not exposed, the joint part between the caps 2 and 5 can be sealed more surely than this embodiment. However, a step of forming the sealing member 100, that is, a sealing step involves applying a pressure to a resin 100a for sealing. The inventors of the present application have found through their studies that when performing the sealing step involving application of the pressure in the form shown in FIG. 57, one or both of the caps 2 and 5 would be pressed and crushed toward the space 8 side by the pressure applied in the sealing step. In the example shown in FIG. 57, the cap 5 is thin because of the formation of the cavity 5d, and thus is apt to be easily crushed as compared to the cap 2. When the cap 5 is crushed to be brought into contact with the sensor chip 1 or wire 4, the reliability (sensing characteristics or electric characteristics) of the sensor chip 1 would be degraded. Even when the sensor chip 1 is not brought into contact with the cap 2, the deformation of the cap 2 causes a part of the resin 9a for sealing to invade the space 8 because of the degradation of the sealing of the space 8 and to be in contact with the sensor chip 1.

A phenomenon of crush of the cap 5 (hereinafter referred to as a cap deformation phenomenon) is caused by correlation between the pressure applied to the cap 5 and the strength of the cap 5 in the sealing step. Specifically, when a resin 100a for sealing is supplied to cover the caps 2 and 5 as shown in FIG. 57, the pressure is applied in the direction indicated by the arrow 101 of FIG. 57. Thus, the phenomenon can be caused depending on the correlation between the pressure applied to the cap 5 and the strength of the cap 5 in the sealing step even in a sealing method other than the transfer mold method. The transfer mold method, however, applies the strong pressure as compared to other sealing methods, whereby the cap deformation phenomenon easily tends to be caused. Even if the resin 100a for sealing shown in FIG. 57 is supplied in the transfer mold and the cap deformation phenomenon does not occur, the cap deformation phenomenon can be easily caused upon applying a void removal pressure which is higher than the supply pressure.

Based on the above consideration, the inventors in the present application have found through their studies the following structure that can suppress the occurrence of the cap deformation phenomenon. That is, in the sealing step shown in FIGS. 25 and 26, the sealing member 9 is formed such that an entirety of the upper surface 5a of the cap 5 and an entirety of the lower surface 2b of the cap 2 are respectively exposed. As described above, the cap deformation phenomenon is caused due to the pressure applied to the caps 2 and 5 via the resin 9a for sealing in the sealing step. Also, this embodiment is the same as the comparative example described above in the step of forming the sealing member 9, that is, in that the pressure is applied to the resin 9a for sealing in a sealing step. In the sealing step, decreasing the pressure acting in the direction of pressing and crushing the caps 2 and 5 (in the direction toward the space 8) can suppress the cap deformation phenomenon. In this embodiment, as shown in FIGS. 27 and 28, the resin 9a for sealing is supplied while a top surface 43a of the cavity 43 is abutted against the upper surface 5a of the cap 5, and a bottom surface 44a of the cavity 44 is abutted against a lower surface 2b of the cap 2. Thus, the resin 9a for sealing is not supplied over the upper surface 5a of the cap 5 and under the lower surface 2b of the cap 2 in principle (except for a small amount of the resin 9a for sealing entering the gap due to the accuracy of processing of the molding die 40 or caps 2 and 5). Thus, the pressure acting on the cap 5 via the resin 9a for sealing is applied only to (strictly speaking, most of) the sides 5c which are contact interfaces with the resin 9a for sealing even upon applying the supply pressure to the resin 9a for sealing or the void removal pressure in the sealing step. Even when the pressure is applied from the side 5c toward the space 8, the upper surface 5a of the cap 5 is supported by the cavity 43, and the lower surface 2b of the cap 2 is supported by the cavity 44. As long as the pressure does not break the cavities 43 and 44, the cap deformation phenomenon is not caused. That is, in this embodiment, the sealing member 9 is formed in the sealing step such that each of an entirety of the upper surface 5a of the cap 5 and an entirety of the lower surface 2b of the cap 2 is exposed, which can prevent or suppress the cap deformation phenomenon. Thus, the sealing of the space 8 can be maintained to prevent or suppress invasion of the sealing member 9 into the space 8. As a result, the sealing member 9 is brought into contact with the sensor chip 1, which can suppress the degradation of the reliability of the sensor chip 1 and the QFP 10 due to the influence including stress of the sealing member 9. The cap 5 includes the flange 5e around the cavity 5d, and the flange 5e protrudes toward the outside of the cavity 5d. In the sealing step, the protruding flange 5e is pressed by the sealing member 9, which can improve the adhesion between the sealing member 9 and the cap 5.

The inventors in the present application have studied a structure in which the deformable upper surface 5a of the cap 5 is exposed and the lower surface 2b of the cap 2 is covered with the resin for sealing. As a result of consideration, the upper surface 5a of the cap 5 is supported by the cavity 43, so that the pressure applied from the lower surface 2b of the cap 2 is transmitted to the cap 5 via the joint part between the caps 2 and 5 to cause the cap deformation phenomenon. That is, it has been found that it is important to expose each of an entirety of the upper surface 5a of the cap 5 and an entirety of the lower surface 2b of the cap 2 for the purpose of preventing the cap deformation phenomenon.

As mentioned above, the resin 9a for sealing fills the cavities 43 and 44. After removing gas bubble (voids) from the resin, the resin 9a for sealing is heated and hardened to thereby form the sealing member 9 shown in FIGS. 25 and 26. In the heating step (baking step), the resin 9a for sealing is temporarily hardened, for example, in the molding die 40 (see FIG. 27) (although the entire resin 9a for sealing is not hardened, the resin 9a can maintain its shape even when being removed from the molding die 40). After removing the lead frame 20 from the molding die 40, the resin 9a for sealing is transferred to a heating furnace (not shown) to be fully hardened (while the entire resin 9a for sealing is being hardened). When the heating step is completed, the sealing member 9 is formed as shown in FIGS. 25 and 26. The following technique for easily removing the lead frame 20 from the molding die 40 has been proposed. That is, an extrusion pin (not shown) (ejector pin) is attached to one or both sides of the molding die 40, and then pushed toward the cavities 43 and 44. In this embodiment, preferably, the extrusion pin is arranged in the position apart from the caps 2 and 5 to thereby push the sealing member 9 (resin 9a for sealing temporarily hardened) from the viewpoint of reducing the external force applied to the caps 2 and 5.

As mentioned above, the sealing step of this embodiment has been described. The sealing step is not limited to the above method as long as an entirety of the upper surface 5a of the cap 5 and an entirety of the lower surface 2b of the cap 2 can be exposed, and various modified examples can be applied. For example, in the description of the form shown in FIGS. 27 and 28, the resin 9a for sealing is supplied while the top surface 43a of the cavity 43 of the molding die 40 is abutted against the upper surface 5a of the cap 5, and the bottom surface 44a of the cavity 44 is abutted against the lower surface 2b of the cap 2. In a modified example, a resin film (not shown) which is softer than the caps 2 and 5 and the cavities 43 and 44 is arranged between the cap 5 and the cavity 43, and between the cap 2 and the cavity 44. That is, the so-called laminate mold method can be applied. The application of the laminate mold method can improve the adhesion between the caps 2 and 5, so that the resin 9a for sealing can be surely prevented from invading over the upper surface 5a of the cap 5 or under the lower surface 2b of the cap 2. This method can fill the gap caused due to the accuracy of processing of the caps 2 and 5 and the molding die 40, and thus can prevent the occurrence of resin burrs in the forming step. In the laminate mold method, it is necessary to exchange a resin film with frequency. In order to reduce the manufacturing cost, the form described using FIGS. 27 and 28 is preferable. In this case, there is the possibility that the resin burrs are attached to the upper surface 5a of the cap 5 and the lower surface 2b of the cap 2. However, the resin burrs can be removed, for example, by applying a laser or the like.

7. Dam Cutting Step

Figure 29:
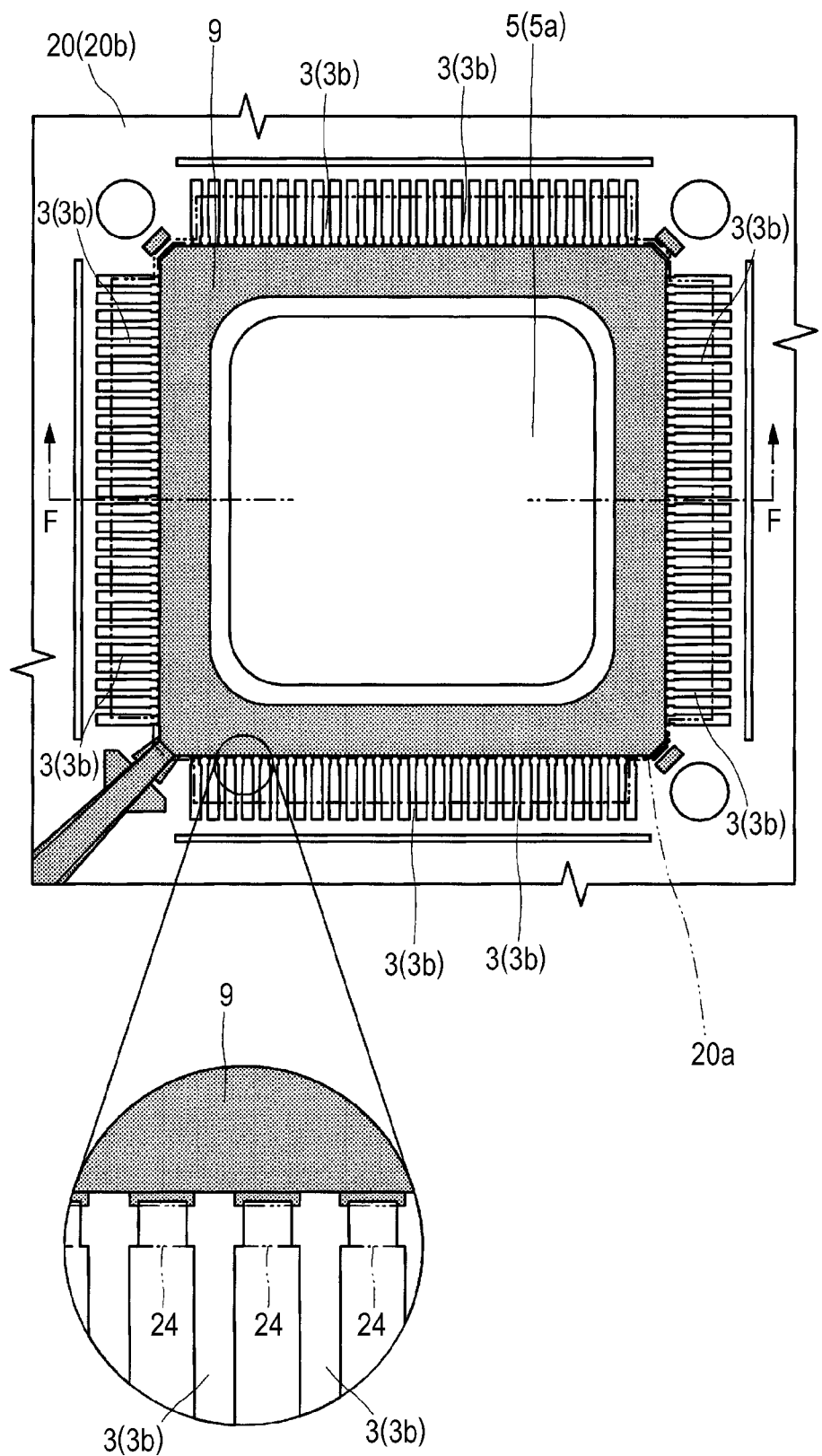
FIG. 29 is an enlarged plan view showing the state in which dams shown in FIG. 25 are cut.

FIG. 29 shows an enlarged plan view of the state in which dams shown in FIG. 25 are cut. Then, in a dam cutting step shown in FIG. 10, as shown in FIG. 29, the dams 24 formed between the leads 3 (outer leads 3b) for coupling the leads 3 together are removed. In this step, for example, each dam 24 is removed by the press processing, for example, using a punch (not shown) (cutting blade) and a die (support jig). At this time, a part of the resin body (resin in the dam) formed inside the dam 24 (near the cap 5) is also removed together with the dam 24. In this step, the ends of the outer leads 3b of the leads 3 are coupled together with frame part 20b of the lead frame. In other words, after removing the dam 24, the leads 3 are also integrally formed via the frame part 20b of the lead frame 20.

8. Lead Forming

Figure 30:
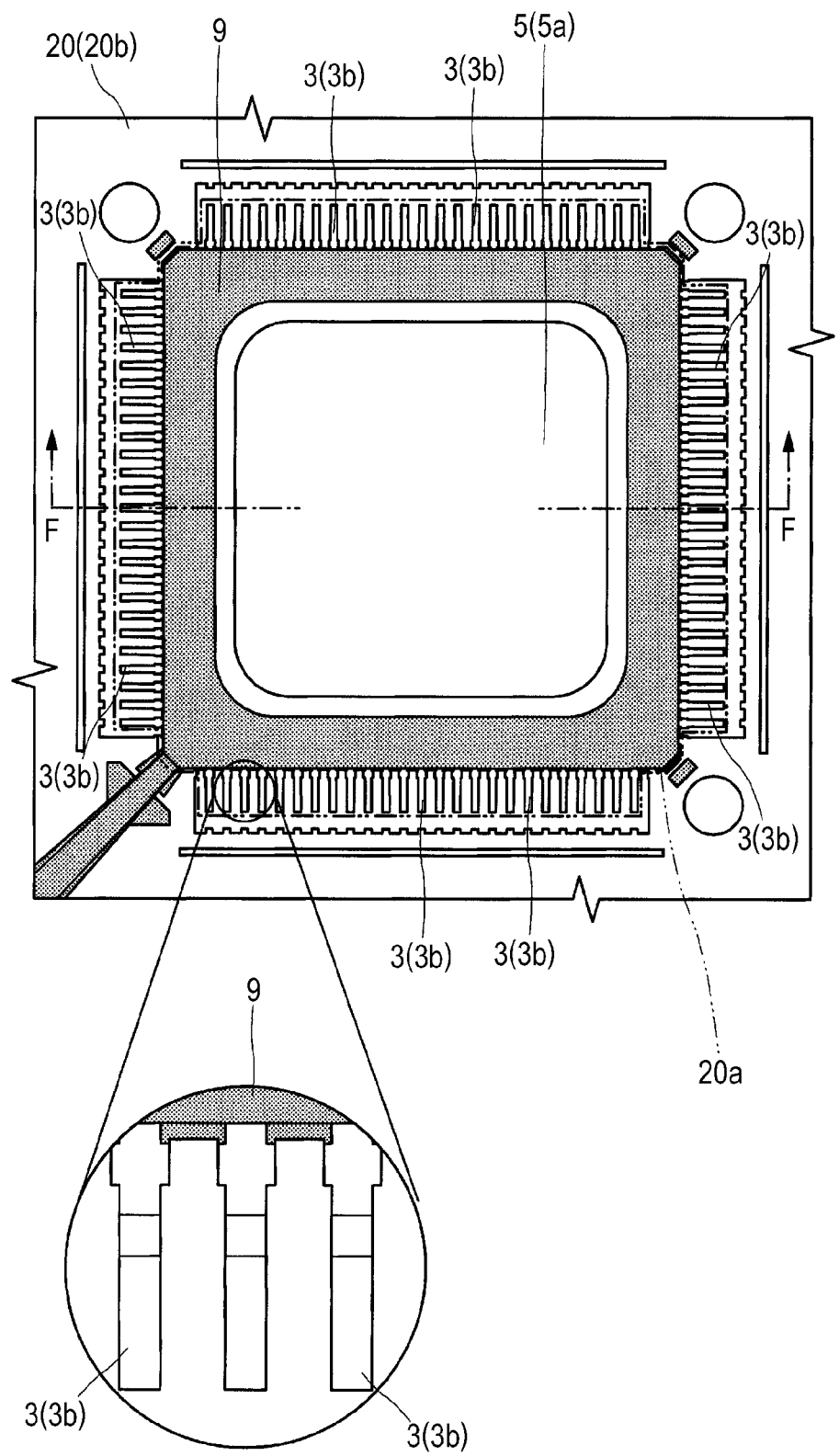
FIG. 30 is an enlarged plan view showing the state in which outer leads shown in FIG. 29 are cut and shaped.

FIG. 30 shows an enlarged plan view of the state in which the outer lead parts shown in FIG. 29 are cut and shaped. An enlarged cross-sectional view taken along the line F-F of FIG. 30 is the same as that of FIG. 6, and thus its illustration will be omitted below. Thus, the state will be described using FIG. 6.

Then, in a lead forming step shown in FIG. 10, the outer lead parts 3b of the lead 3 is cut to be singulated from the frame part 20b as shown in FIG. 30. Thereafter, the outer lead parts 3b of the leads 3 as shown in FIG. 6 are formed in a gull-wing shape. The cutting method of the outer lead parts 3b of the leads 3 involves, for example, pressing and cutting by arranging a punch (not shown) (cutting blade) on the upper surface side of the lead frame 20, and a die (not shown) (supporting jig) on the lower surface side thereof. The method for forming the outer lead 3b of the lead 3 enables forming using a punch and a die for molding. In this step, the leads 3 are respectively singulated as an individual member. In this step, the leads 3 are singulated from the lead frame 2. Thus, when each component in the product formation region 20a is not supported by the frame part 20b of the lead frame 20, it is difficult to form the lead. In this embodiment, as shown in FIG. 12, the suspension leads 14 are arranged in the regions where the leads 3 are not arranged. For example, as shown in FIG. 7, the suspension leads 14 are sealed with the sealing member 9. Thus, until the completion of the singulating step to be described later, the product formation region 20a is coupled to and supported by the frame part 20b of the lead frame 20 via the suspension leads 14 (see FIG. 12).

9. Singulating Step

Figure 31:
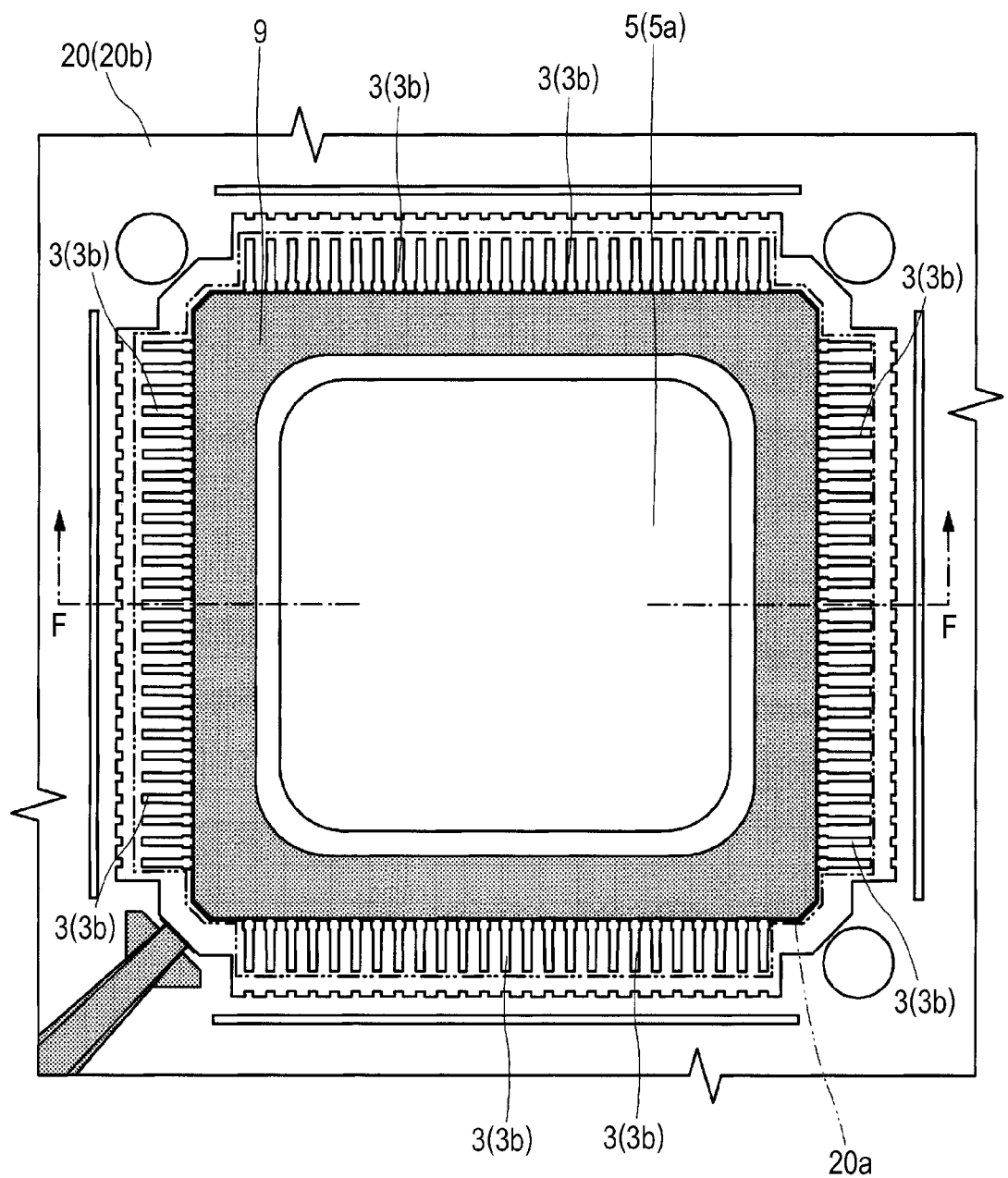
FIG. 31 is an enlarged plan view showing the state in which the product formation region shown in FIG. 30 is singulated from a frame part of a lead frame.

FIG. 31 is an enlarged plan view showing the state in which the product formation region shown in FIG. 30 is singulated from the frame part of the lead frame.

Then, in a singulating step shown in FIG. 10, as shown in FIG. 31, the product formation region 20a is separated from the frame part 20b of the lead frame 20. In this step, the suspension lead 14 (see FIG. 12) serving as a coupling portion between the product formation region 20a and the frame part 20b is cut, for example, by pressing using the punch (not shown) (cutting blade) and the die (support jig) (not shown). At this time, the gate resin formed in the gate part 45 and the vent resin formed in the vent part 46 shown in FIG. 25 are respectively removed by the punch.

Through the above respective steps, the QFP 10 shown in FIGS. 4 to 9 is obtained. Although not shown, in addition to the above respective steps, a marking step is performed to form a product identification mark or the like for the QFP 10. The marking step can form the mark, for example, by applying the laser light to the upper surface 5a of the cap 5. The timing for performing the marking step can be any timing after the above cap bonding step before the singulating step. The lead frame 20 for use in this embodiment includes the product formation regions 20a as shown in FIG. 11, so that a plurality of QFPs 10 can be obtained from one piece of the lead frame 20. Thereafter, necessary checks and tests including an appearance check or an electric test are performed, and the QFP 10 is shipped out, or mounted on a mounting substrate (not shown).

Referring to FIG. 13 used for the description of the above lead frame providing step, in this embodiment, for example, a plated film metal film) 22 comprised of, nickel (Ni) or nickel-palladium (Ni/Pd) is previously formed over the entire surface (upper surface, lower surface, and sides) of the base 21, for example, comprised of copper (Cu). The cap 2 includes the plated film (metal film) 22 comprised of, for example, nickel (Ni) or nickel.palladium (Ni/Pd), formed over the entire surface (upper surface 2a, lower surface 2b, and sides 2c) of the base 23, for example, made of kovar. That is, as shown in FIG. 6, the lower surface 2b of the cap 2, and the outer lead part 3b to be coupled to a terminal on the mounting substrate side when the QFP 10 is mounted on the mounting substrate (not shown) are covered with the plated film 22 comprised of nickel (Ni) or nickel.palladium (Ni/Pd). The plated film 22 has a function of improving the solder wettability of the solder material serving as a joint when the QFP 10 is mounted on the mounting substrate, and thus a plating step provided inside a parenthesis in FIG. 10 can be omitted.

Figure 32:
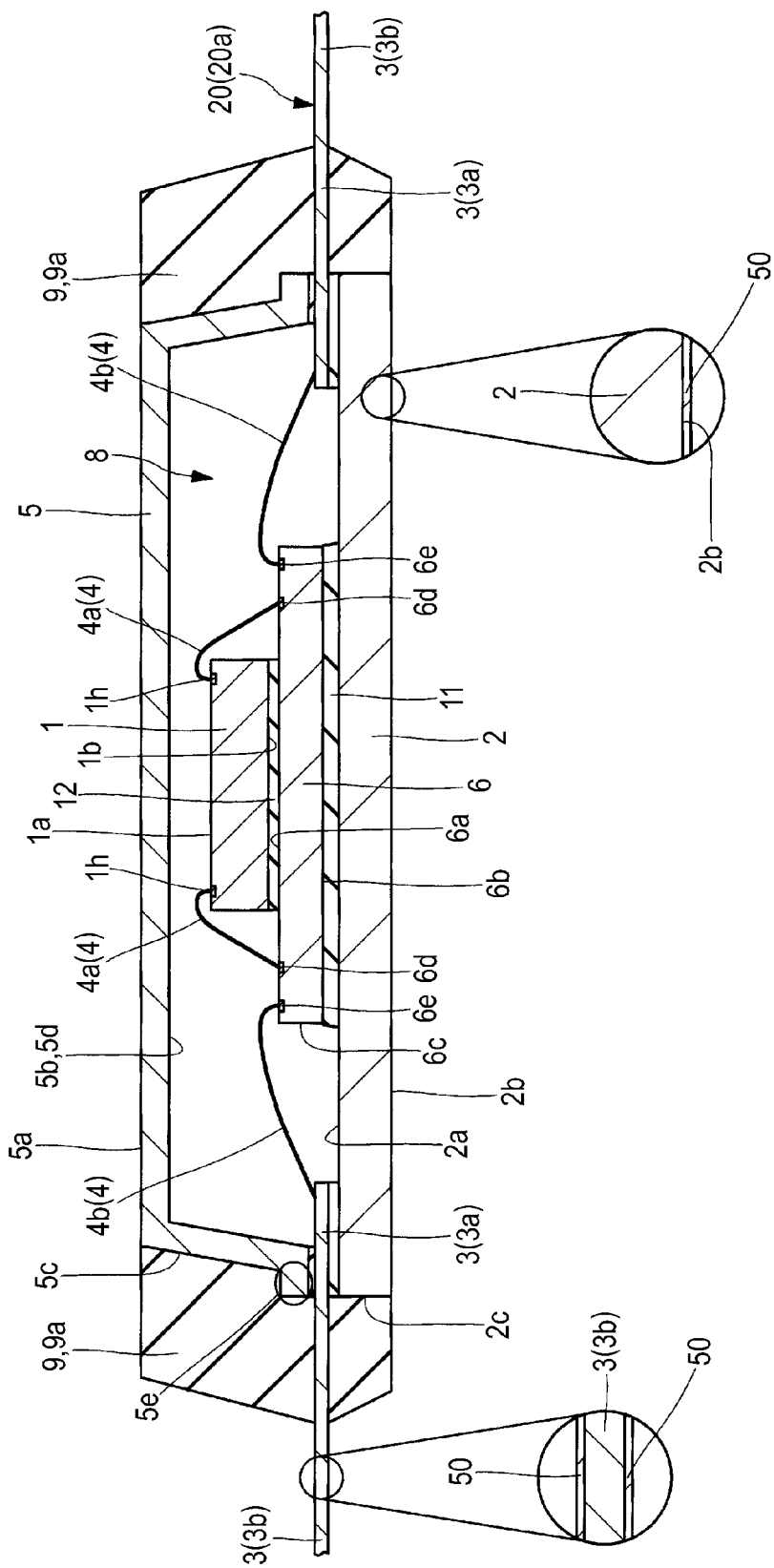
FIG. 32 is an enlarged cross-sectional view taken along the line F-F of FIG. 29, showing the state in which an external plating film is formed over exposure surfaces of the leads and the back surface side cap exposed from the sealing member.

In a modified example, when the plated film 22 is not formed over the outer lead part 3b and the lower surface 2b of the cap 2, the plating step inside the parenthesis in FIG. 10 is performed. FIG. 32 shows an enlarged cross-sectional view taken along the line F-F of FIG. 29, showing the state in which an external plating film is formed over the exposed surfaces of the leads and the back surface cap exposed from the sealing member.

When the plating step is performed as shown in FIG. 10, an exterior plated film 50 is formed at exposed surfaces of the cap 2 and the leads (outer lead parts 3b) exposed from the sealing member 9 as shown in FIG. 32. The exterior plated film 50 can improve the solder wettability of the solder material which is a joint to be used when the QFP 10 shown in FIG. 6 is mounted on the mounting substrate (not shown), by forming the exterior plated film 50 over the leads 3 formed of, for example, solder as the external terminal. In this step, the lead frame 20 to be plated is arranged in a plating tank (not shown) accommodating therein a plating solution (not shown), and then the exterior plated film 50 is formed, for example, by electrolytic plating. By the electrolytic plating, the exterior plated film 50 can be totally formed over the regions exposed from the sealing member 9. Thus, the exterior plated film 50 is formed over the upper surface, lower surface, and sides of the outer lead parts 3b and the lower surface 2b of the cap 2.

Second Embodiment

In this embodiment, a package structure which also has a cavity formed in a cap arranged at the back surface of the sensor chip will be described as a modified example of the QFP 10 described in the first embodiment. This embodiment will describe mainly different points from the first embodiment in the semiconductor device and the manufacturing method thereof, and thus the description of common points between these embodiments will be omitted below. This embodiment will be described below using some drawings necessary for explaining the different points from the first embodiment while quoting the drawings used in the first embodiment if necessary.

Different Points in Semiconductor Device Structure

Figure 33:
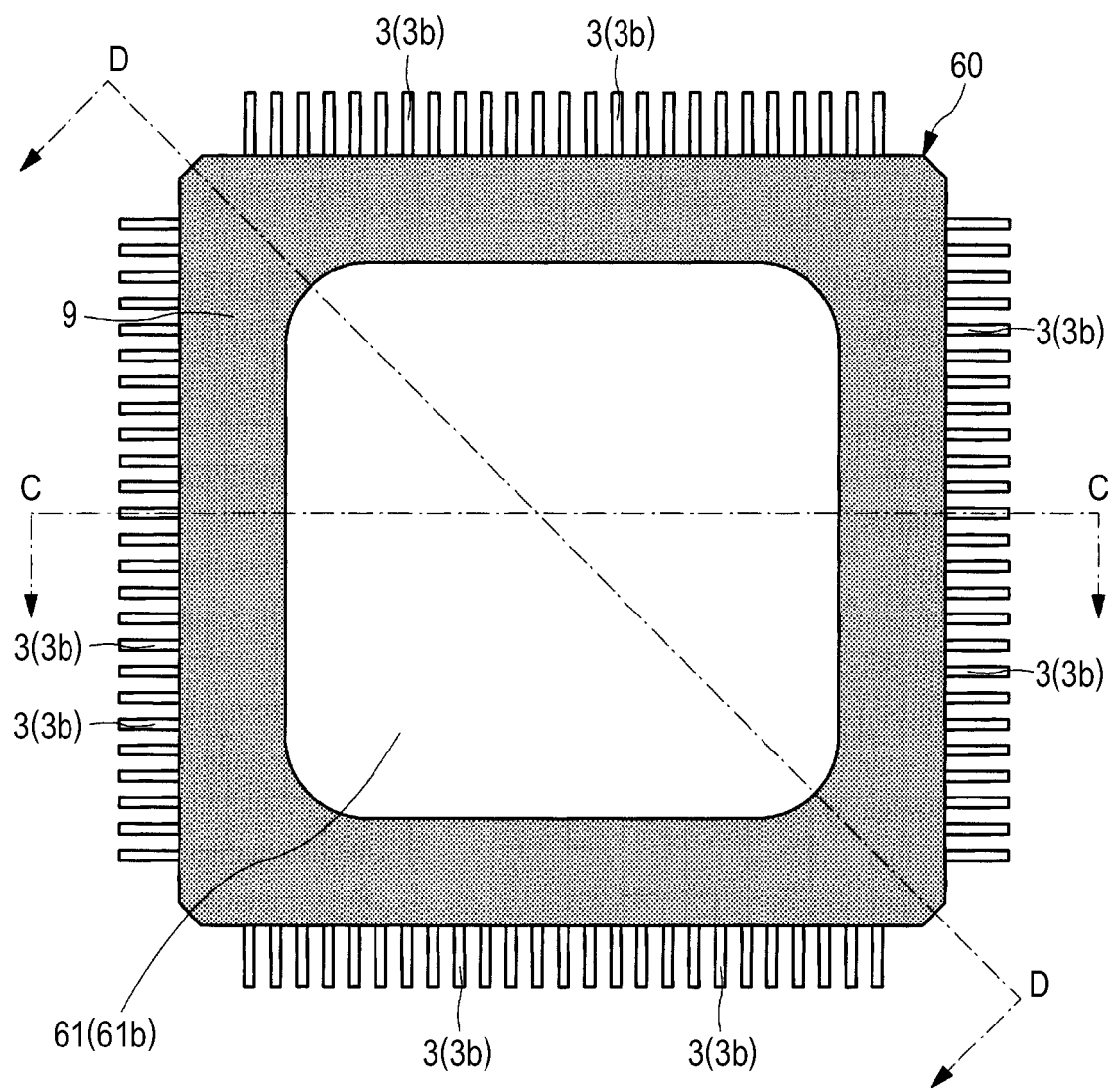
FIG. 33 is a plan view showing a lower surface side of a semiconductor device in a modified example corresponding to FIG. 5.
Figure 34:
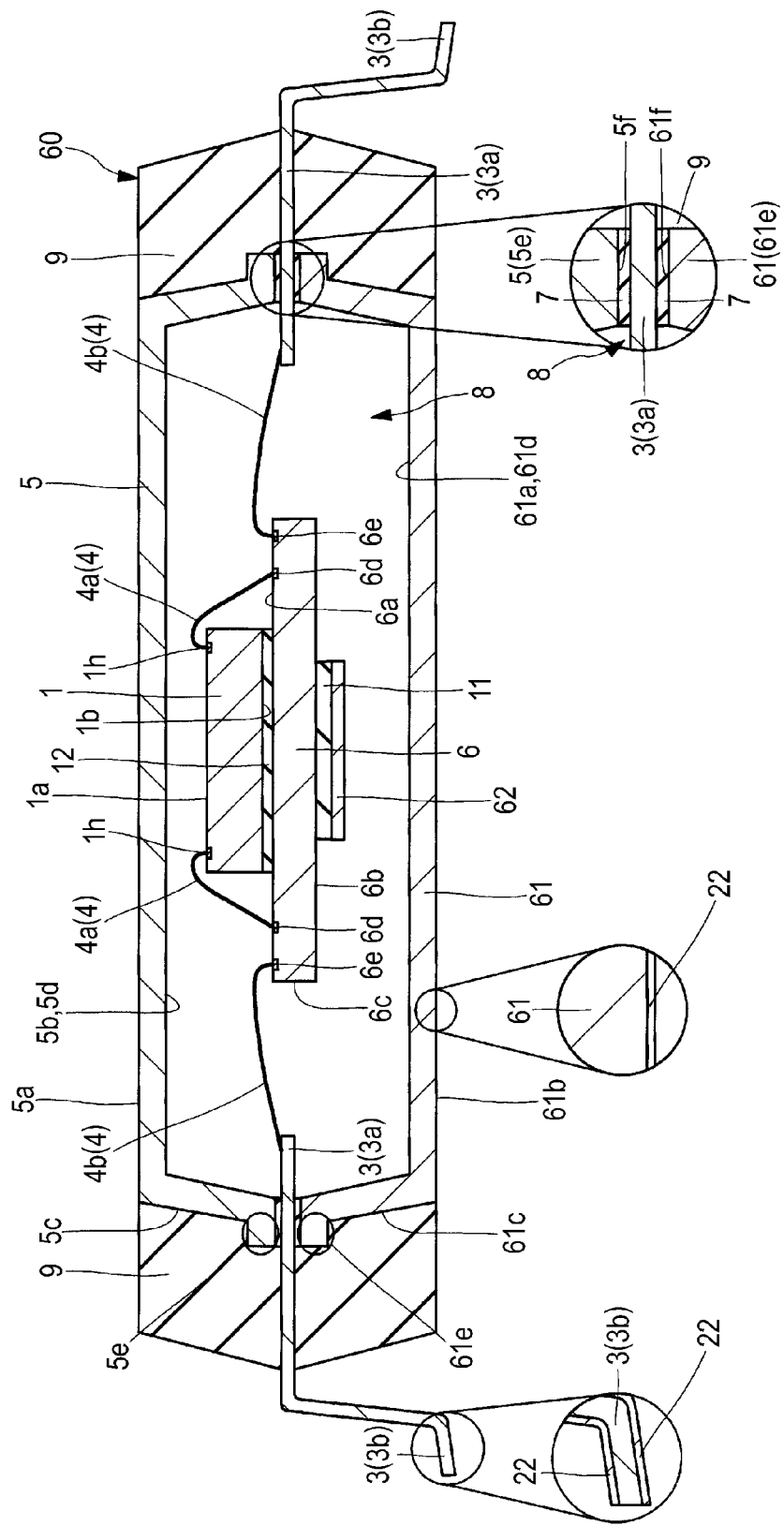
FIG. 34 is a cross-sectional view taken along the line C-C of FIG. 33.
Figure 35:
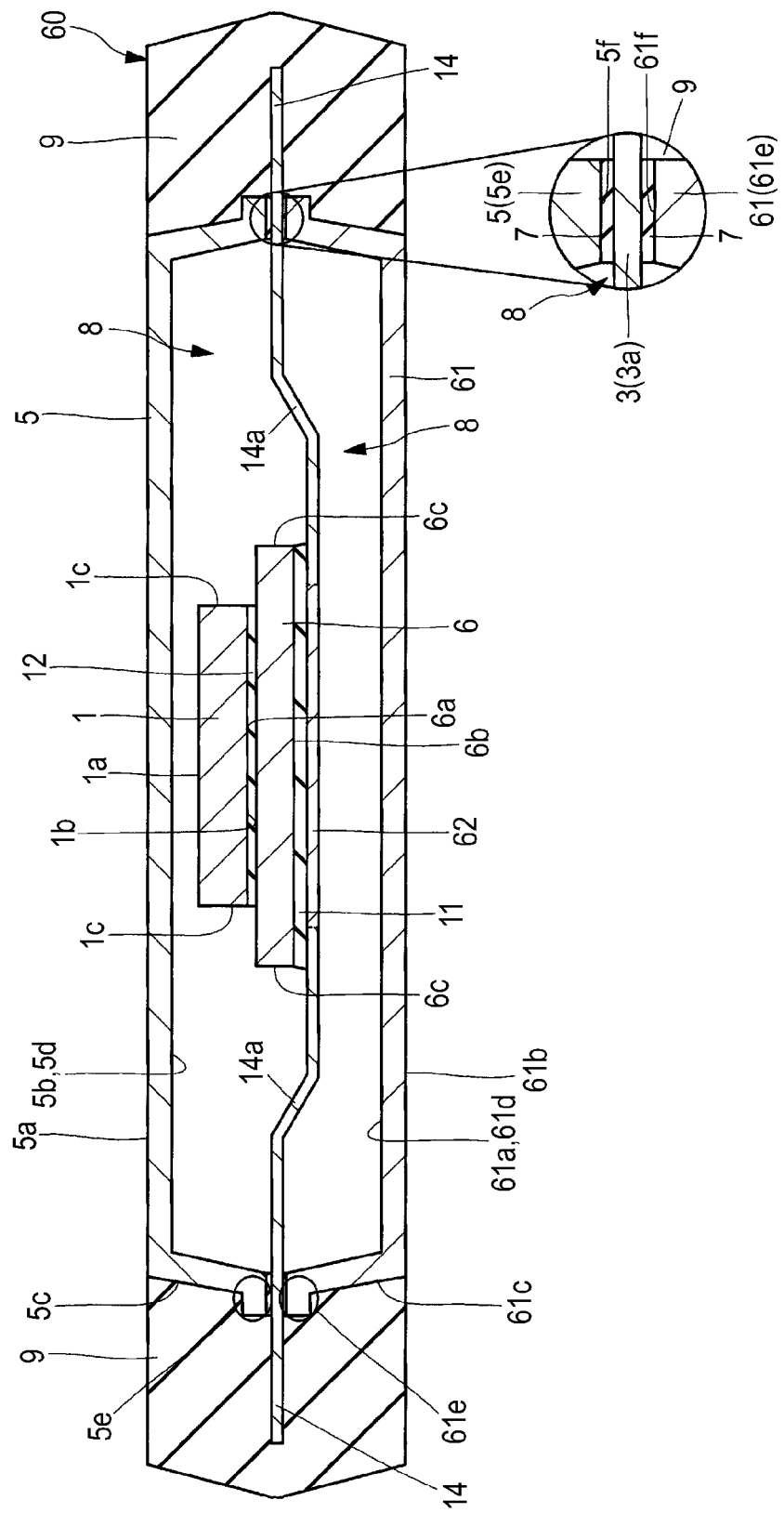
FIG. 35 is a cross-sectional view taken along the line D-D of FIG. 33.
Figure 36:
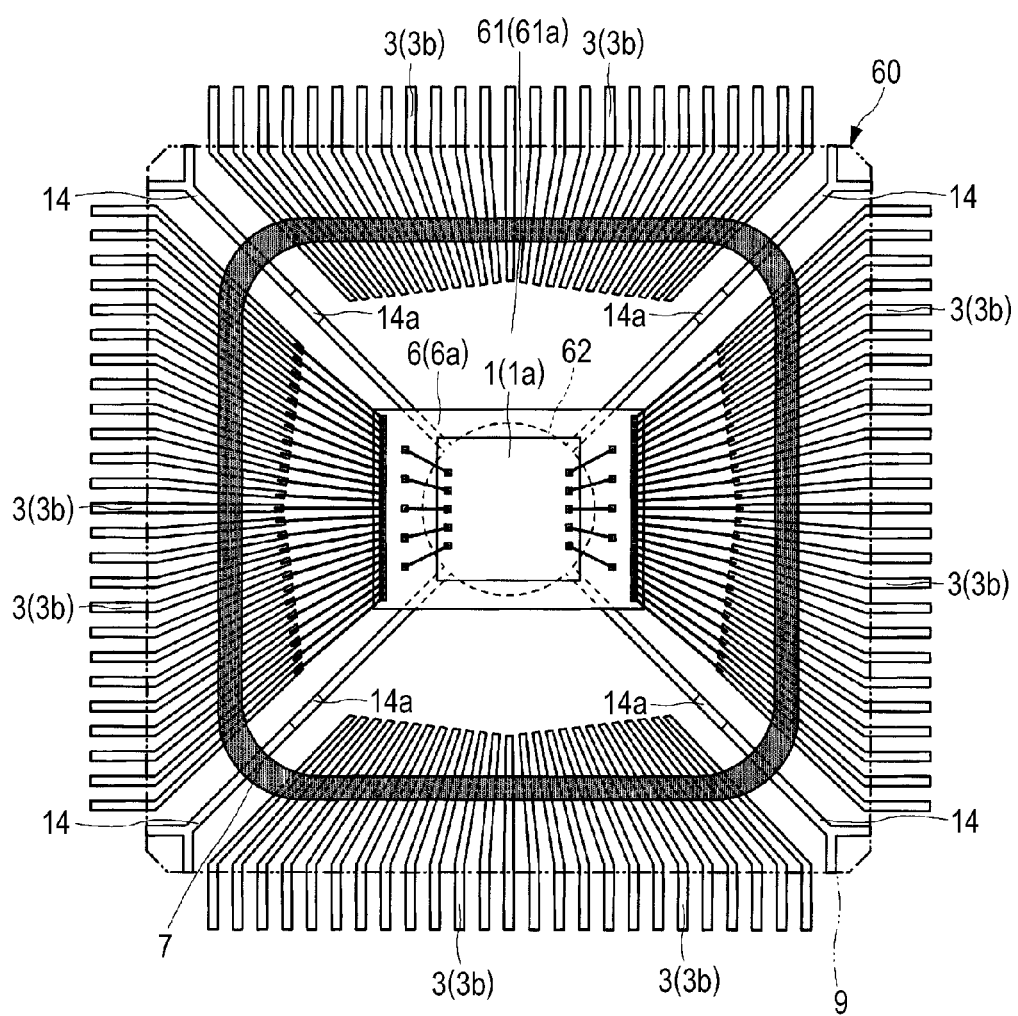
FIG. 36 is a plan view showing a planar structure on an upper surface side inside the sealing member of the semiconductor device shown in FIG. 33.
Figure 37:
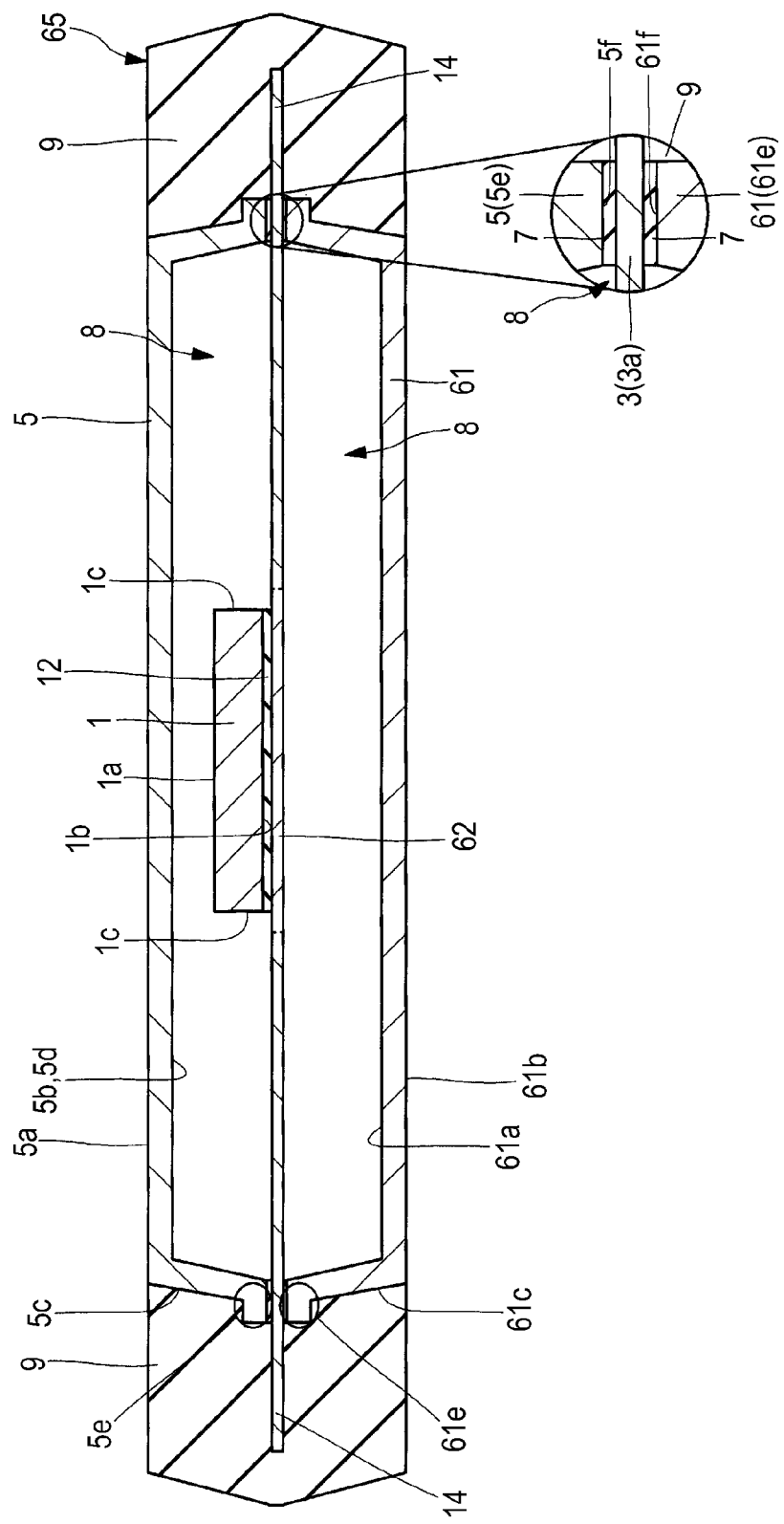
FIG. 37 is a cross-sectional view showing a modified example of the semiconductor device shown in FIG. 35.

FIG. 33 is a plan view showing the lower surface side of the semiconductor device as a modified example corresponding to FIG. 5. FIG. 34 is a cross-sectional view taken along the line C-C of FIG. 33, and FIG. 35 is a cross-sectional view taken along the line D-D of FIG. 33. FIG. 36 shows a plan view of a planar structure on an upper surface side of the inside of the sealing member of the semiconductor device shown in FIG. 33. FIG. 37 is a cross-sectional view showing a modified example of the semiconductor device shown in FIG. 35. The top view of the semiconductor device shown in FIG. 33 is the same as that described in the first embodiment with reference to FIG. 4, and thus an illustration of the top view will be omitted.

A QFP (semiconductor device) 60 shown in FIGS. 33 to 36 differs from the QFP 10 described in the first embodiment using FIGS. 4 to 9 in that a cap 61 arranged on the back surface of the sensor chip 1 has a cavity (space formation portion, concave portion, recessed portion, or chip housing portion) 61d. Further, the QFP 60 differs from the QFP 10 (see FIGS. 4 to 9) in that a tab (die pad) 62 is provided as a chip mounting portion for mounting thereon the semiconductor chip, separately from the cap 61. As shown in FIGS. 34 and 35, the QFP 60 has the control chip 6 and the sensor chip 1 mounted over the tab 62, and the space 8 intervenes in between the back surface 6b of the control chip 6 and the upper surface 61a of the cap 61.

The cap (first member, or back surface side cap member) 61 has a reversed structure in which the cap 5 covering the front surface 1a of the sensor chip 1 is turned upside down, and thus covers the back surface 1b side of the sensor chip 1. Specifically, the cap 61 includes an upper surface 61a, a lower surface 61b opposite to the upper surface 61a, and sides 61c positioned between the upper surface 61a and the lower surface 61b. The cap 61 has a recessed shape toward the lower surface 61b. The cap 61 has, on its upper surface 61a side, a cavity 61*d*, and a flange (joining portion) 61*e* arranged to enclose the cavity 61*d*. The cap 61 is obtained by forming the cavity 61*d* and the flange 61*e*, for example, by applying the press processing to a flat plate comprised of kovar. The method of forming the cap 61 is not limited thereto. A part (central part) of one thick flat plate may be removed (hollowed out) to thereby form the cavity 61*d* and the flange 61*e* (part protruding from the bottom surface of the flat plate). Like the cap 5, the cavity 61*d* has such a planar size that can house (accommodate) therein the sensor chip 1, the control chip 6, the wires 4, and parts of the leads 3 (bonding region 13*c* shown in FIG. 13). In this step, the sensor chip 1, the control chip 6, the wires 4, and the parts of the leads 3 (bonding region 3*c*) are covered with the cap 61.

The caps 5 and 61 are opposed to each other, and a joint part between the caps 5 and 61 (between the adhesive surface 5*f* of the flange 5*e* and an adhesive surface 61*f* of the flange 61*e*) is sealed by and bonded to the sealing material 7 (see FIGS. 34 and 36) to seal the space 8, which is the same as the QFP 10 shown in FIGS. 4 to 9. In the QFP 60, the cap 61 arranged on the back surface 1*b* side of the sensor chip 1 includes the cavity 61*d* and the flange 61*e*. For example, the adhesive 13 shown in FIG. 6 is not arranged, and the sealing member 7 is arranged around the sealing region 3*d* of the leads 3 (see FIG. 13). In other words, the sealing region 3*d* of each of the leads 3 (and suspension leads 14) is sealed with the sealing material 7.

As shown in FIGS. 35 and 36, the tab 62 serving as a chip mounting portion for mounting the control chip 6 and the sensor chip 1 is integrally formed with the suspension leads 14, and supported by the sealing member 9 via the suspension leads 14. The tab 62 is arranged in the space 8 formed by the caps 2 and 61, and over the upper surface 61*a* of the cap 61 via the space 8. In other words, in the QFP 10 shown in FIGS. 4 to 9, the control chip 6 and the sensor chip 1 are directly supported by the cap 2. In this embodiment, the control chip 6 and the sensor chip 1 are not supported directly by the cap 61, but supported by the sealing member 9 via the suspension lead 14 and the tab 62.

The cases where the QFP 10 and QFP 60 are affected by external forces other than the force of interest to be sensed, including an external force generated due to drop impact or the like, will be considered as follows. Since in the QFP 10, the control chip 6 and the sensor chip 1 are directly supported by the cap 2, the external force tends to be easily transmitted to the control chip 6 and the sensor chip 1. In contrast, in this embodiment, the control chip 6 and the sensor chip 1 are not directly supported by the cap 61, but supported by the suspension leads 14 inside the hollow space 8, which tends to easily absorb the external force as compared to the QFP 10. For example, when the external force is transmitted to the QFP 60, the suspension leads 14 vibrates vertically (in the thickness direction). The external force is converted into a vibration energy, and can be relieved. In this way, this embodiment can suppress the transmission of the external force, such as impact, to the sensor chip 1, in addition to the effect given by the QFP 10. This arrangement can suppress the reduction in reliability of the sensor chip 1 and the semiconductor device due to the above external force.

The QFP 10 shown in FIGS. 4 to 9 is better than the QFP 60 from the viewpoint of heat dissipation which involves dissipating heat generated by the sensor chip 1 or the control chip 6 toward the outside. The control chip 6 and the sensor chip 1 are directly supported by the cap 2 exposed from the sealing member 9, which can increase a sectional area of a heat transmission route (heat dissipation route).

FIGS. 35 and 36 illustrate the so-called down-set type structure. Specifically, in an example of arrangement of the tab 62, an inclined part 14*a* is provided at each of the suspension leads 14. The upper surface of the tab 62 is positioned below the upper surface of the lead 3 (see FIG. 34). Various modified examples can be applied. For example, in a QFP 65 shown in FIG. 37, the upper surface of the region sealed with the sealing member 9 of the suspension lead 14 can be positioned at the same level as the upper surface of the tab 62. Since the sensor chip 1 is mounted over the tab 62, when the QFP 65 shown in FIG. 37 intends to be positioned at the same level as the QFP 60 shown in FIG. 35, a plurality of semiconductor chips cannot often be laminated as shown in FIG. 37. In other words, like the QFP 60, the QFP 65 will also increase the height of the package (or the thickness of the package) when the QFP 65 with a laminate of the control chip 6 and the sensor chip 1 is mounted. From the viewpoint of reduction in thickness of the package, the QFP 60 is preferable. In the QFP 60 described above, the suspension leads 14 vibrate inside the space 8 to relieve the external force. When the wire 4 shown in FIG. 34 is excessively close to the lower surface 5*b* of the cap 5, the wire 4 may be brought into contact with the cap 5 depending on the degree of vibration. When the wire 4 contacts the cap 5, a short circuit between the wires is produced, or the wire 4 is deformed, which leads to electric coupling failures (short circuit between the wires 4, or break of a joint of the wire 4). In the QFP 60, as shown in FIG. 34, the lower surface 5*b* of the cap 5 can be arranged sufficiently apart from the wire 4. Thus, the QFP 60 is better from the viewpoint of preventing or suppressing the above electric coupling failure.

FIGS. 35 and 36 illustrate the so-called small tab-type structure which includes a semiconductor chip mounted over the tab 62 having a planar size smaller than that of a mounting surface (back surface 6*b*) of the semiconductor chip (control chip 6). In a modified example, the planar size of the tab 62 can be larger than the back surface 6*b* of the control chip 6. The small tab-type structure can use the common lead frame even when the size of the mounted semiconductor chip is changed. Thus, the small tab-type structure is better in terms of versatility of the lead frame. The tab 62 is comprised of the same material (for example, copper) used as the lead frame for manufacturing the QFP 60. Thus, a difference in linear expansion coefficient between the tab 62 and the sensor chip 1 is larger than that between the cap 61 and the sensor chip 1. In order to reduce the stress (thermal expansion stress or contraction stress) generated due to the difference in liner expansion coefficient, the QFP 60 which can reduce a contact area between the tab 62 and the semiconductor chip (control chip 6) is better.

Difference in Manufacturing Method of Semiconductor Device

A manufacturing method of the QFP 60 shown in FIGS. 33 to 36 will be described below. In this section, differences from the manufacturing method of the semiconductor device described in the first embodiment will be mainly described below, and thus the description of common parts will be omitted. The QFP 60 is manufactured along an assembly flowchart described in the first embodiment with reference to FIG. 10.

Figure 38:
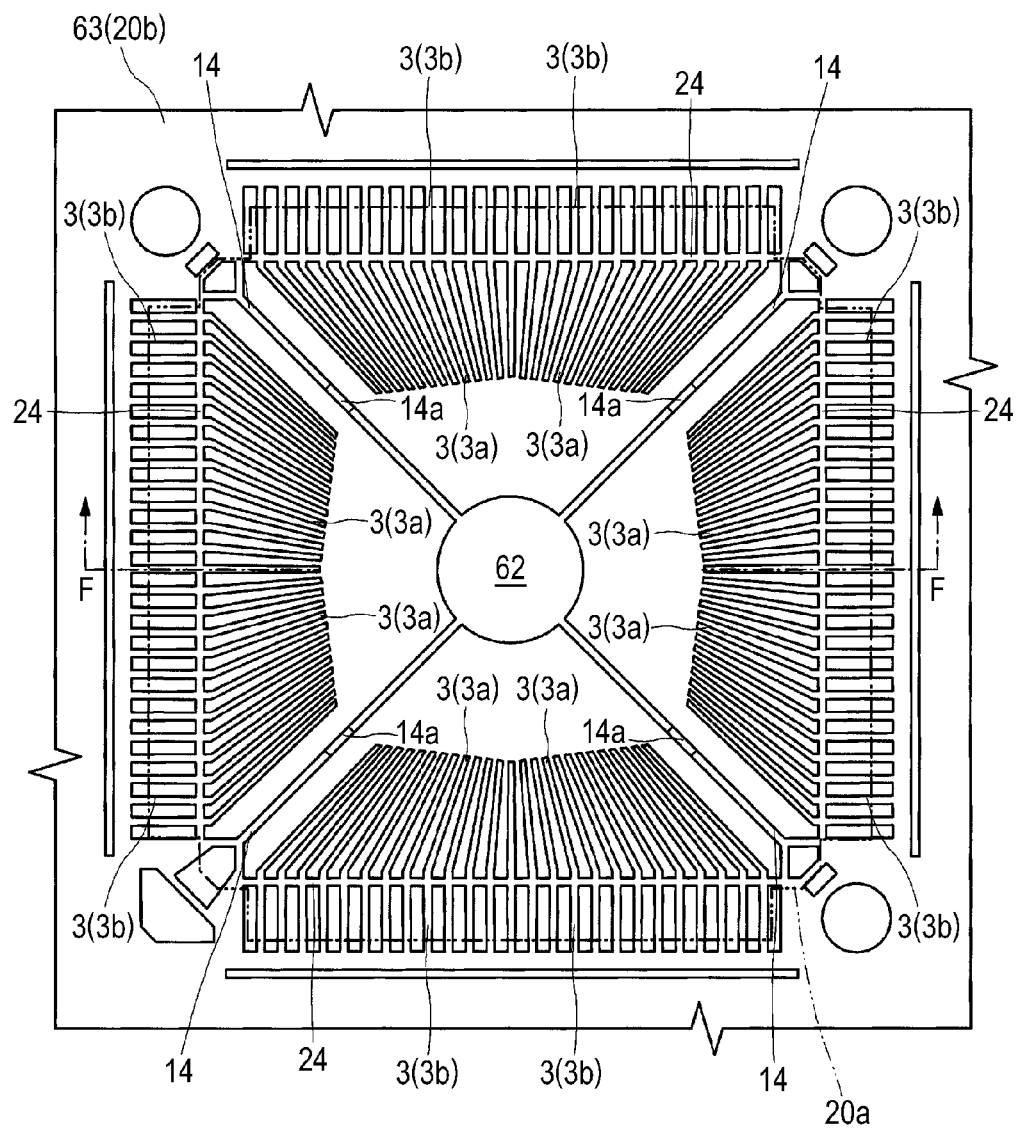
FIG. 38 is an enlarged plan view of a modified example corresponding to FIG. 12.
Figure 39:
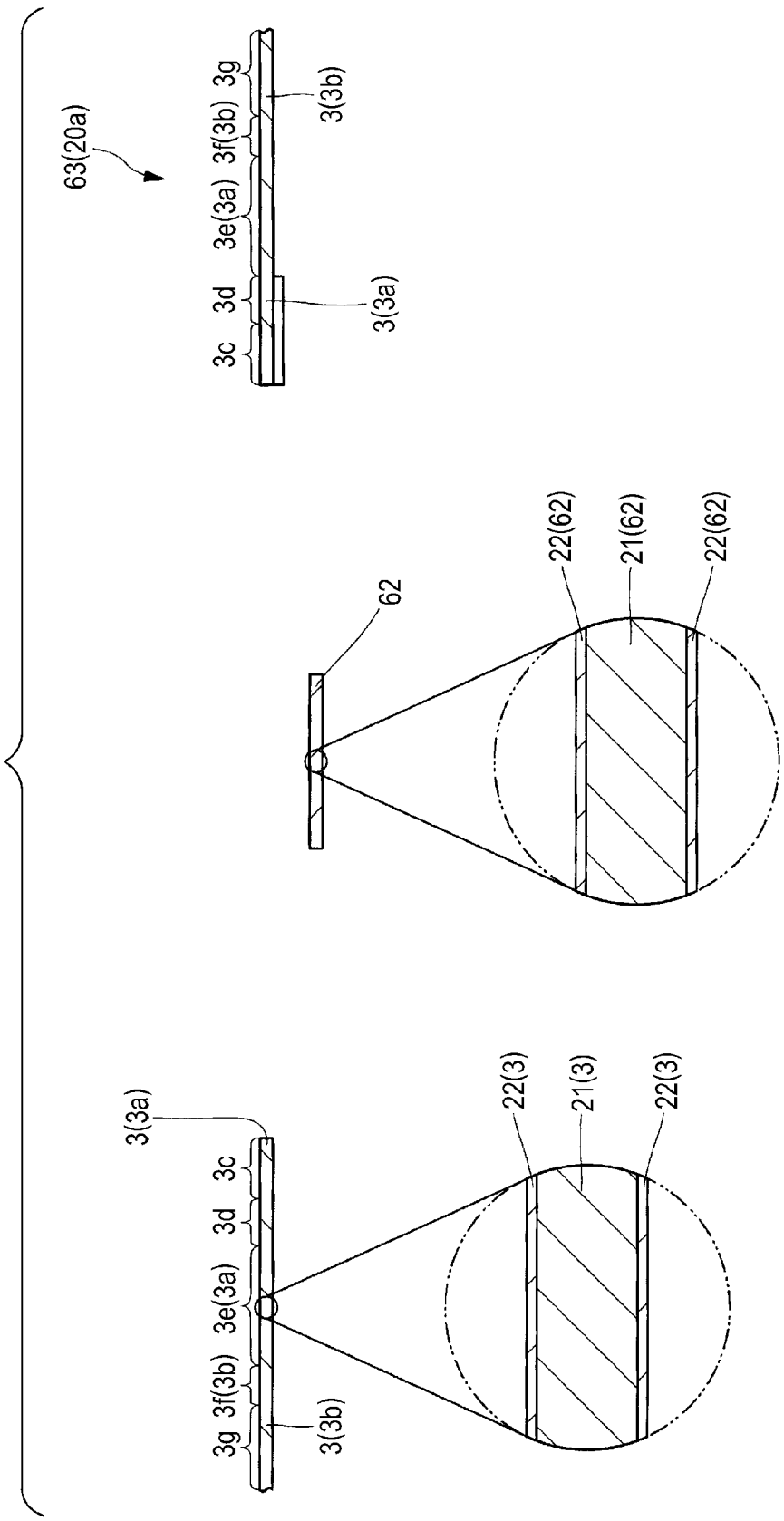
FIG. 39 is a cross-sectional view taken along the line F-F of FIG. 38.

The manufacturing process of the QFP 60 differs from the first embodiment in the lead frame provided in the lead frame providing step shown in FIG. 10 in view of the following points. This embodiment is the same as the first embodiment except for the above points. FIG. 38 is an enlarged plan view which is a modified example corresponding to FIG. 12, and FIG. 39 is a cross-sectional view taken along the line F-F of FIG. 38.

The lead frame 63 provided in this embodiment uses the tab 62 as a chip mounting portion instead of the cap 2 (see FIGS. 12 and 13) used as the chip mounting portion in the first embodiment. The tab 62 is integrally formed with the lead frame 63. A plated film (metal film) 22 is formed of, for example, nickel (Ni) or nickel.palladium (Ni/Pd), for example, over each surface of the base 21 comprised of copper (Cu) as shown in FIG. 39. The plated film 22 is not necessarily formed over the entire surface of each of the leads 3. When the plated film 22 is not formed over the entire surface, after forming the sealing member 9, a plated film (exterior plated film) comprised of solder material (containing a lead-free solder) is formed over the surface (upper surface, lower surface, and sides) of each of the outer lead parts 3b exposed from the sealing member 9. As shown in FIG. 38, the tab 62 is integrally formed with the suspension leads 14 each having the inclined part 14a. As shown in FIG. 39, the upper surface of the tab 62 is positioned under the upper surface of the leads 3. That is, the lead frame 63 provided in the lead frame providing step is previously subjected to the down-set processing (off set processing). At the time in this step, the cap 61 shown in FIGS. 33 to 36 is not attached. Like the cap 2 described in the first embodiment, the cap 61 can be previously attached to the lead frame 63. However, in this case, it is necessary to perform the semiconductor chip mounting step and the wire bonding step shown in FIG. 10 while the tab 62 is floating in a hollow space, which becomes a complicated operation.

Then, in each of the semiconductor chip mounting step and the wire bonding step described in this embodiment as shown in FIG. 10, the cap 2 can be used in place of the tab 62, and thus the illustration and description thereof will be omitted below.

Figure 40:
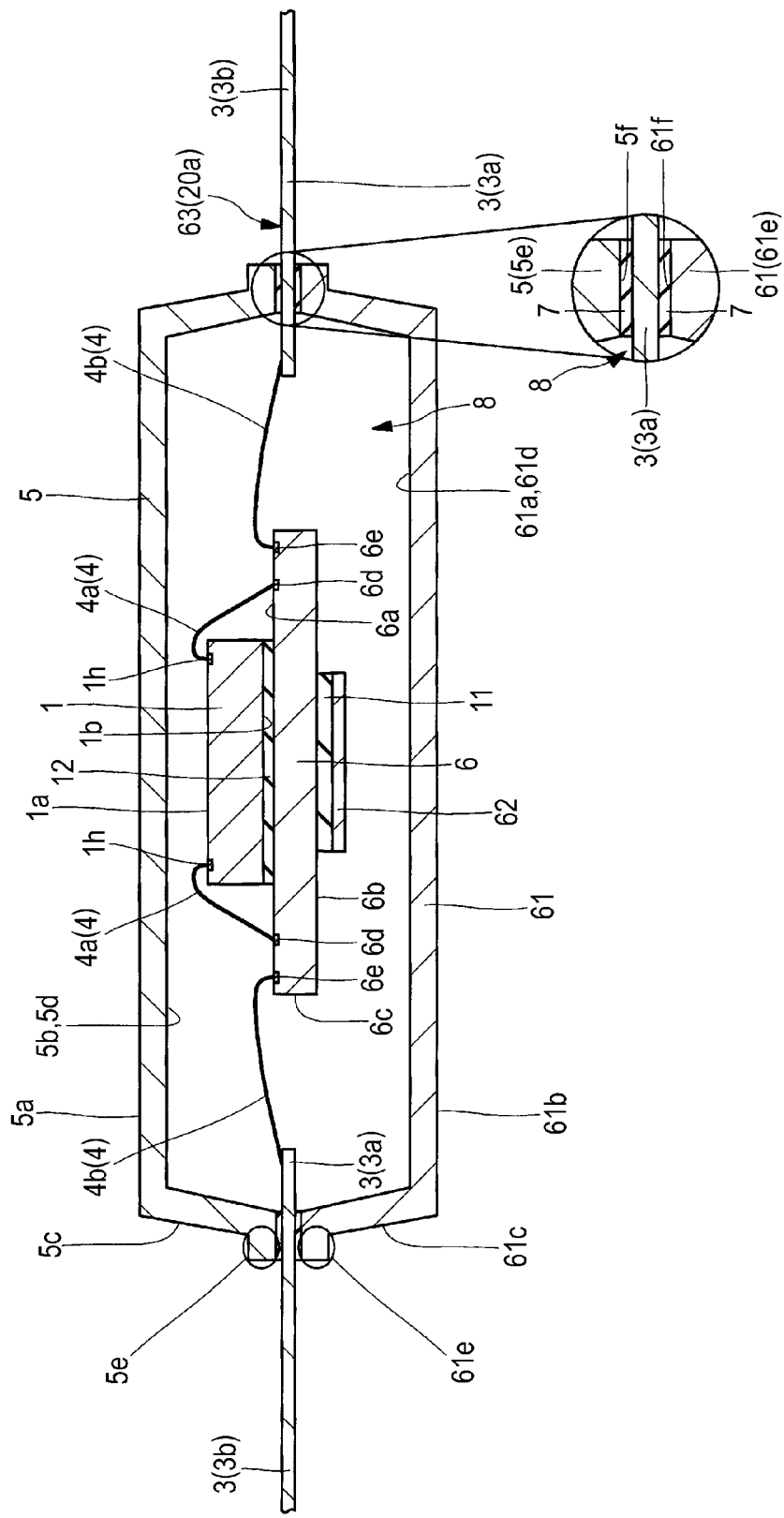
FIG. 40 is an enlarged cross-sectional view showing a modified example corresponding to FIG. 21.
Figure 41:
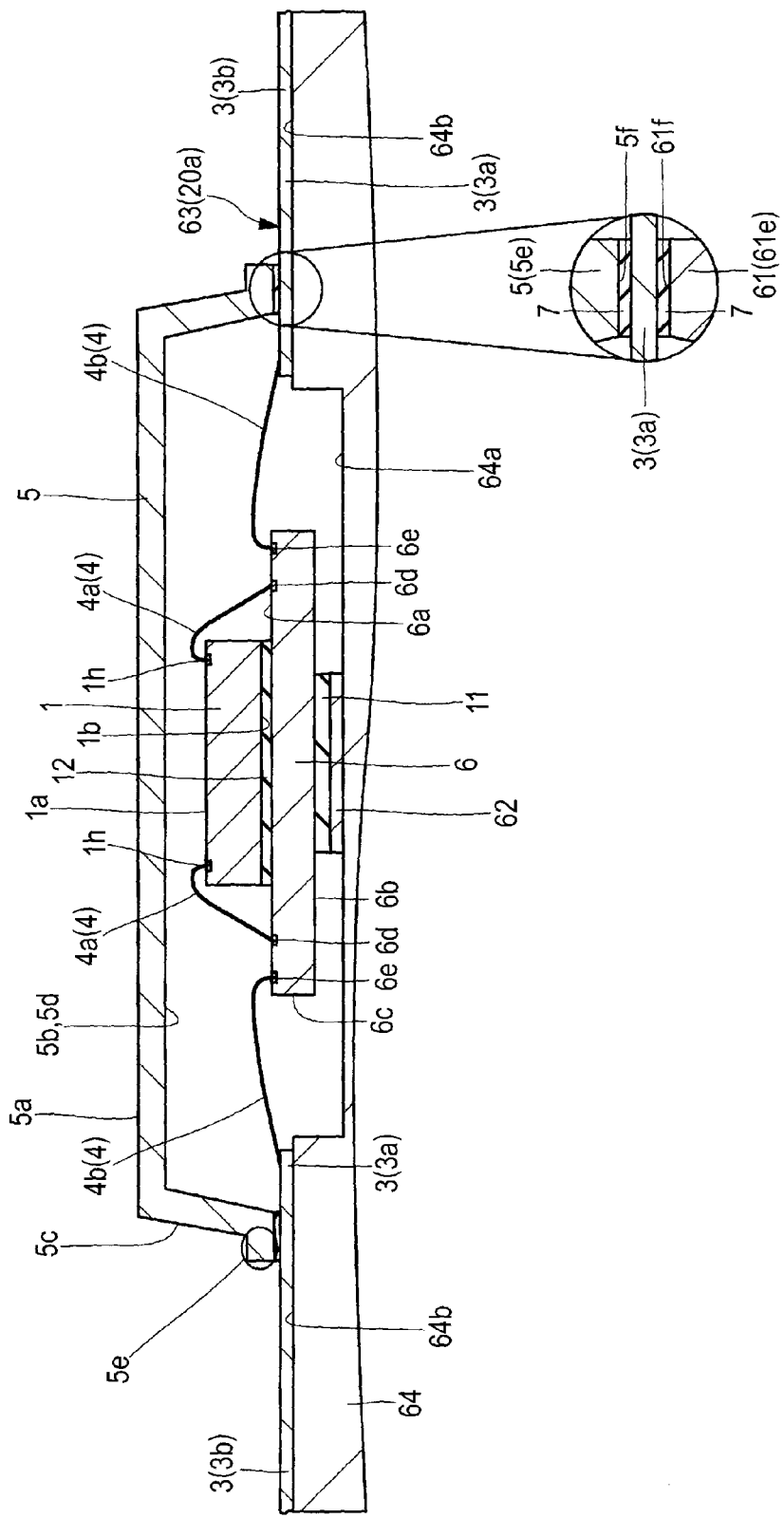
FIG. 41 is an enlarged cross-sectional view showing the state in which the front surface side can be attached to the lead frame after a wire bonding step shown in FIG. 10.
Figure 42:
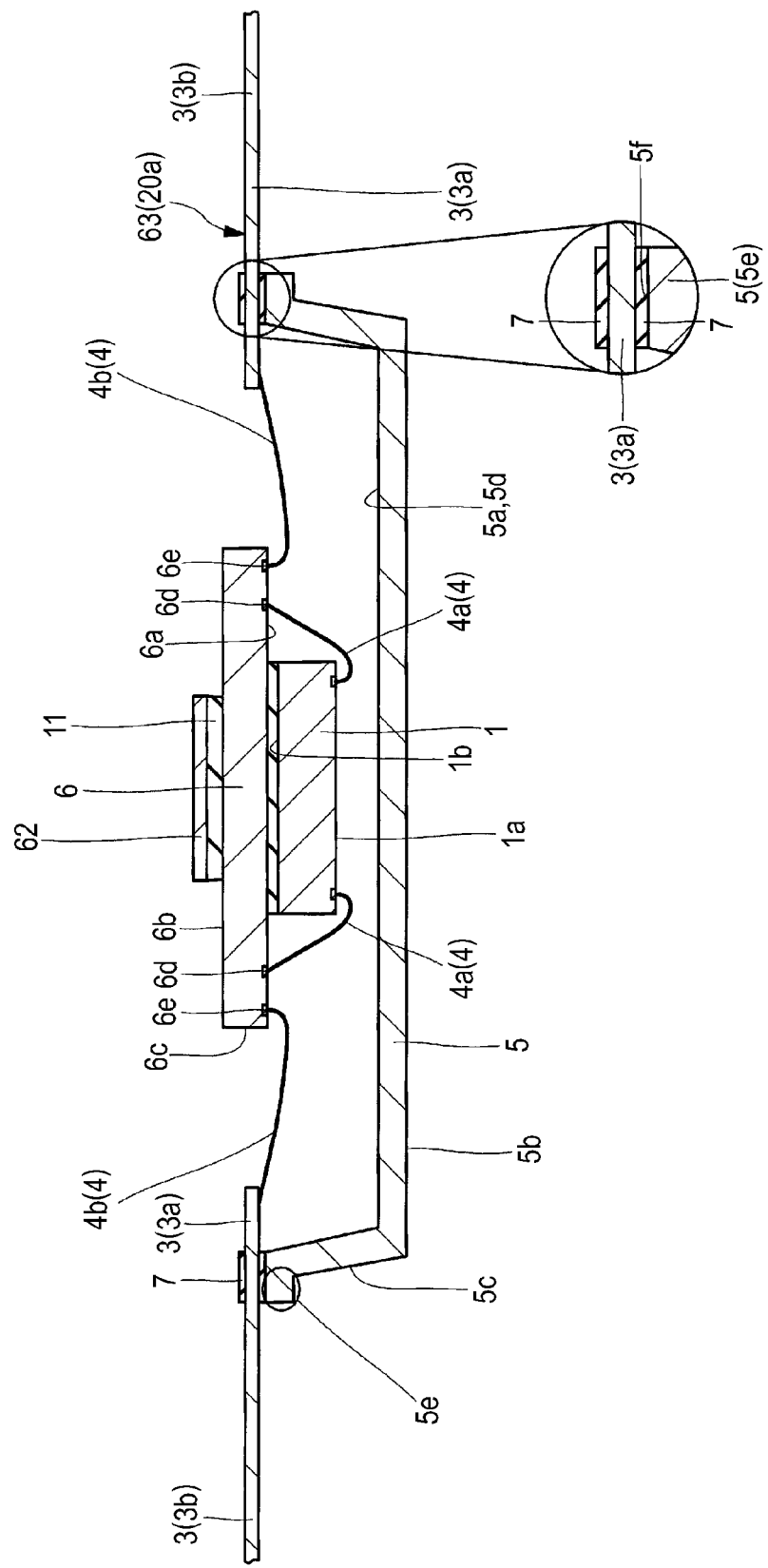
FIG. 42 is an enlarged cross-sectional view showing the state in which the lead frame shown in FIG. 41 is turned upside down.

This embodiment differs from the first embodiment in that in the cap bonding step shown in FIG. 10, the cap 5 and the cap 61 shown in FIG. 40 are provided, and that the cap 5 is mounted over the front surface 1a of the sensor chip 1, whereas the cap 61 is mounted over the back surface 1b of the sensor chip 1. This embodiment is the same as the first embodiment except for the above points. FIG. 40 is an enlarged cross-sectional view showing a modified example corresponding to FIG. 21. FIG. 41 shows an enlarged cross-sectional view of the state in which the cap on the front surface side is attached to the lead frame after the wire bonding step shown in FIG. 10. FIG. 42 shows an enlarged cross-sectional view of the state in which the lead frame shown in FIG. 41 is turned upside down.

In the cap bonding step of this embodiment, the order of mounting the cap 5 and the cap 61 is not limited to one described later. In order to mount the cap 61, while protecting the wires 4 coupled to the sensor chip 1 and the control chip 6, preferably, the cap 5 on the front surface 1a side is mounted in advance, and then the cap 61 on the back surface 1b side is mounted. Specifically, first, as shown in FIG. 41, a stage (support board) 64 including a concave portion (recessed portion) 64a, and a lead holder 64b arranged around the concave portion 64a is provided, and a lead frame 63 is arranged over the stage 64 such that the leads 3 are arranged over the lead holder 64b. The paste-like adhesive 7 is applied over the sealing region 3d of the leads 3 (see FIG. 39). Like the first embodiment, the cap 5 is arranged over the cap 2 such that the region with the adhesive 7 applied thereto is opposed to the adhesive surface 5f of the flange 5e of the cap 5. At this time, the control chip 6, the wires 4 of the sensor chip 1, the bonding region 3c (see FIG. 39) of the leads 3, and the tab 62 are arranged in the cavity 3d of the cap 5. Then, the sealing member 7 is spread over to fill the gap between the adjacent leads 3, for example, by pressing the cap 5 from the upper surface 5a side to the cap 2, for example, by a pressing jig (not shown) to push the adhesive surface 5f of the flange 5e into the upper surface 2b side of the cap 2. As a result, the adhesive surface 5f of the flange 5 is bonded to the upper surface 2a of the cap 2 by the sealing member 7. When the cap 5 has such an adhesive strength that the cap 5 does not fall from the lead frame 63 even upon the reverse of the lead frame 63 as shown in FIG. 42 in this state, the hardening step of the sealing material 7 can be collectively performed after mounting the cap 61. In contrast, when the adhesive strength of the sealing material 7 is low and the cap 5 would be dropped even upon the reverse of the lead frame, the sealing material 7 is heated and hardened before mounting the cap 61. The former which involves collectively hardening the sealing material 7 and other components is preferable from the viewpoint of improving the sealing of the space 8 shown in FIGS. 34 and 35.

Then, as shown in FIG. 42, the lead frame 63 is turned upside down. That is, the lead frame 63 is arranged such that the back side 1b of the sensor chip 1 is directed upward. And, the paste-like sealing material 7 is applied to the sealing region 3d (see FIG. 39) of the leads 3, in other words, to the adhesive surface 5f of the flange 5e of the cap 5. The cap 61 shown in FIG. 40 is mounted in the same procedure as the step of mounting the cap 5, and the sealing material 7 is heated, so that the sealing material 7 can be hardened. In the step of mounting the cap 5, the lower surface 5b of the cap 5 is arranged to be opposed to the upper surface 61a of the cap 61, and the adhesive surface 5f and the adhesive surface 61f are bonded together by the sealing material 7. After mounting the cap 61, the lead frame 63 is turned upside down. In this case, as shown in FIG. 40, the joint part between the cap 5 and the cap 61 is bonded and secured together, thus enabling formation of the sealed space 8.

Figure 43:
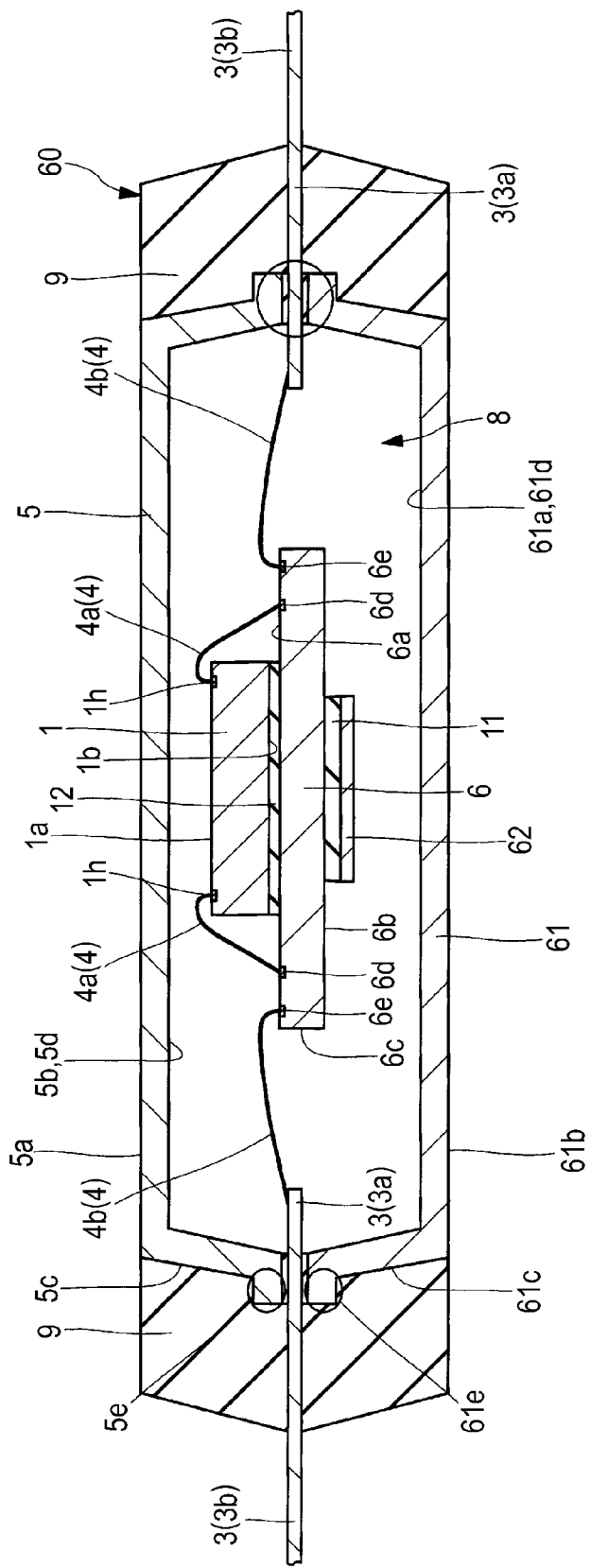
FIG. 43 is an enlarged cross-sectional view showing a modified example corresponding to FIG. 26.

This embodiment differs from the first embodiment in that in the sealing step shown in FIG. 10, the sealing member 9 is formed so as to seal the sides 5c of the cap 5 and the side 61c of the cap 61 as shown in FIG. 43. This embodiment is the same as the first embodiment except for the above points. FIG. 43 is an enlarged cross-sectional view showing a modified example corresponding to FIG. 26.

In the sealing step of this embodiment, as shown in FIG. 43, the sealing member 9 is formed so as to cover each of the sides 5c of the cap 5 and the sides 61c of the cap 61. In contrast, the sealing member 9 is not formed over the upper surface 5a of the cap 5 and under the lower surface 61b of the cap 61, so that the upper surface 5a of the cap 5 and the lower surface 61b of the cap 61 are exposed from the sealing member 9. As described in the first embodiment, this arrangement can reduce the pressure acting in the direction of crushing the caps 5 and 61 in the sealing step (in the direction toward the space 8), and thus can suppress the cap deformation phenomenon. In this embodiment, the sides 5c and 61c are inclined surfaces not perpendicular to the upper surfaces 5a and 6a. Thus, the adhesion between the sealing member 9 and the caps 5 and 61 can be improved. Since the caps 5 and 61 respectively have flanges 5e and 61e, the joint part between the caps 5 and 61 has a protruding shape toward the outside of the space 8 inside the sealing member 9. The joint part between the caps 5 and 61 has the protruding shape toward the outside of the space 8 inside the sealing member 9. The protruding part serves as an anchor, and thus can improve the adhesion between the sealing member 9 and the caps 5 and 61.

The semiconductor device and manufacturing method thereof of this embodiment is the same as those of the first embodiment except for the above different points. Thus, a redundant description will be omitted except for the above different points, and thus the invention described in the first embodiment can be applied.

Third Embodiment

This embodiment will describe a semiconductor device having an optical sensor chip mounted thereover as a modified example of the QFP 10 described in the first embodiment. This embodiment will mainly describe below different points from the semiconductor device and manufacturing method thereof described in the first embodiment, and will omit the description of parts common to the first embodiment. This embodiment will be described below using some drawings necessary for explaining the different points from the first embodiment while quoting the drawings used in the first embodiment if necessary.

Different Points in Semiconductor Device Structure

Figure 44:
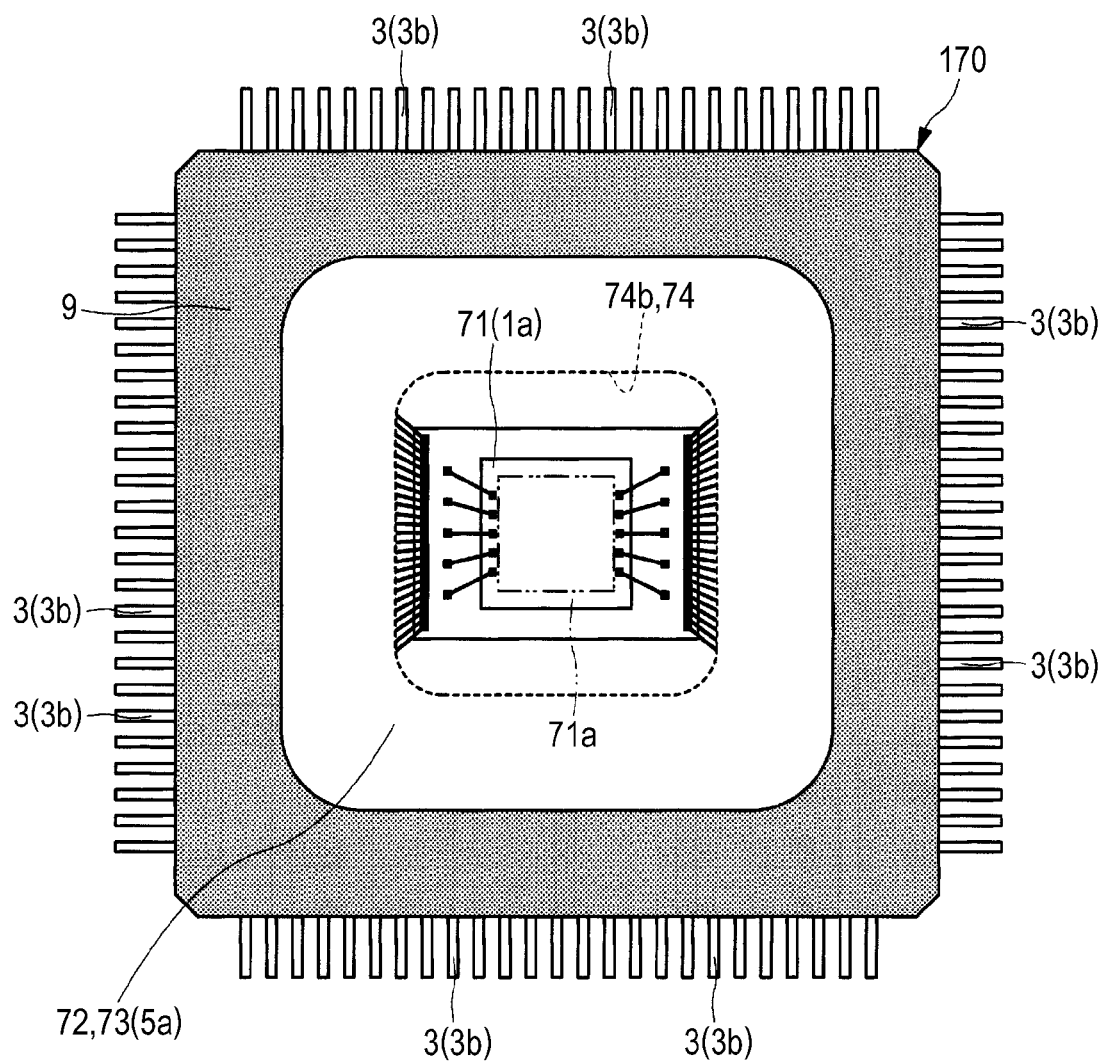
FIG. 44 is a plan view showing a semiconductor device in a modified example corresponding to FIG. 4.
Figure 45:
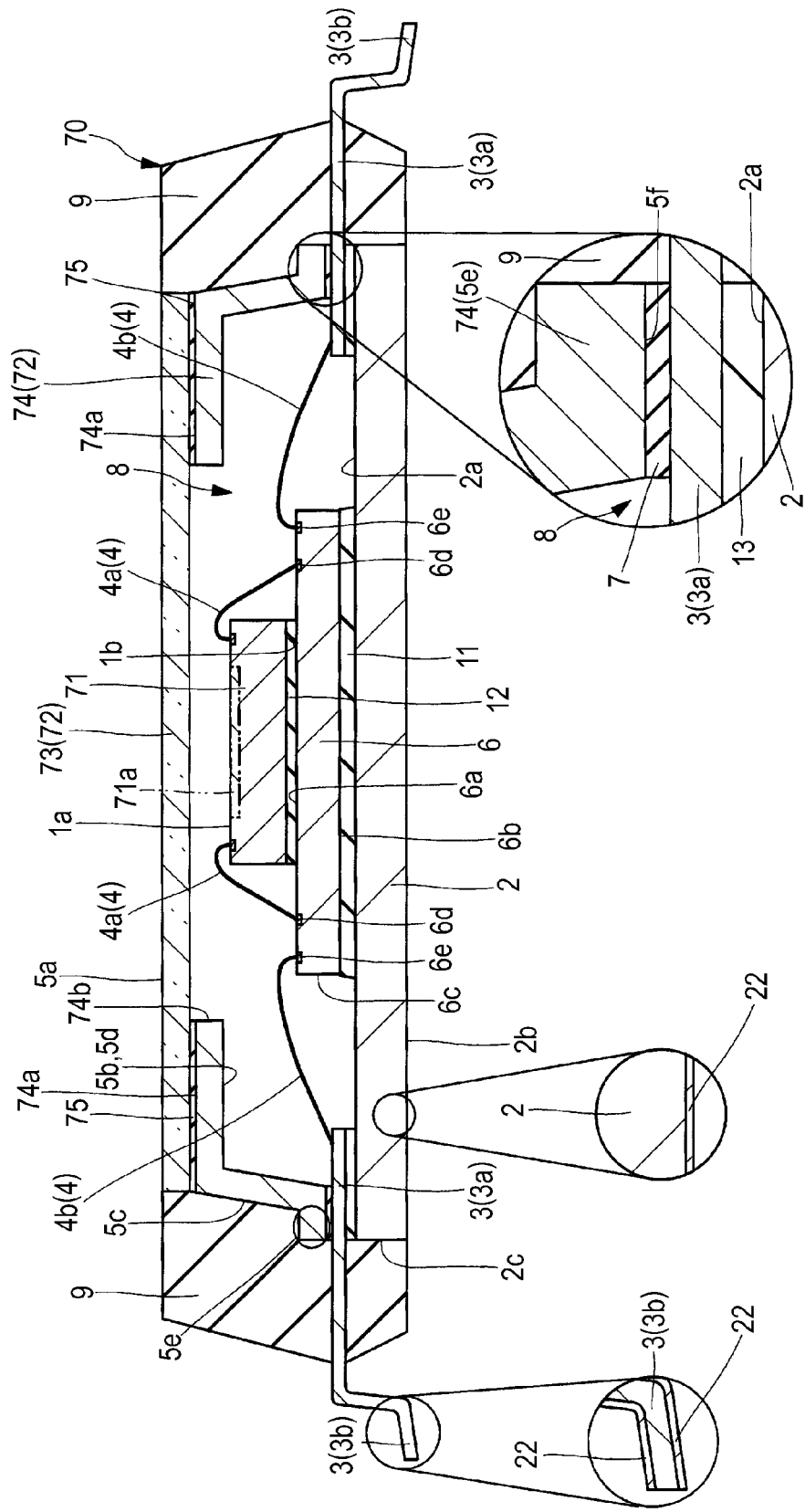
FIG. 45 is a cross-sectional view showing a semiconductor device in a modified example corresponding to FIG. 6.
Figure 46:
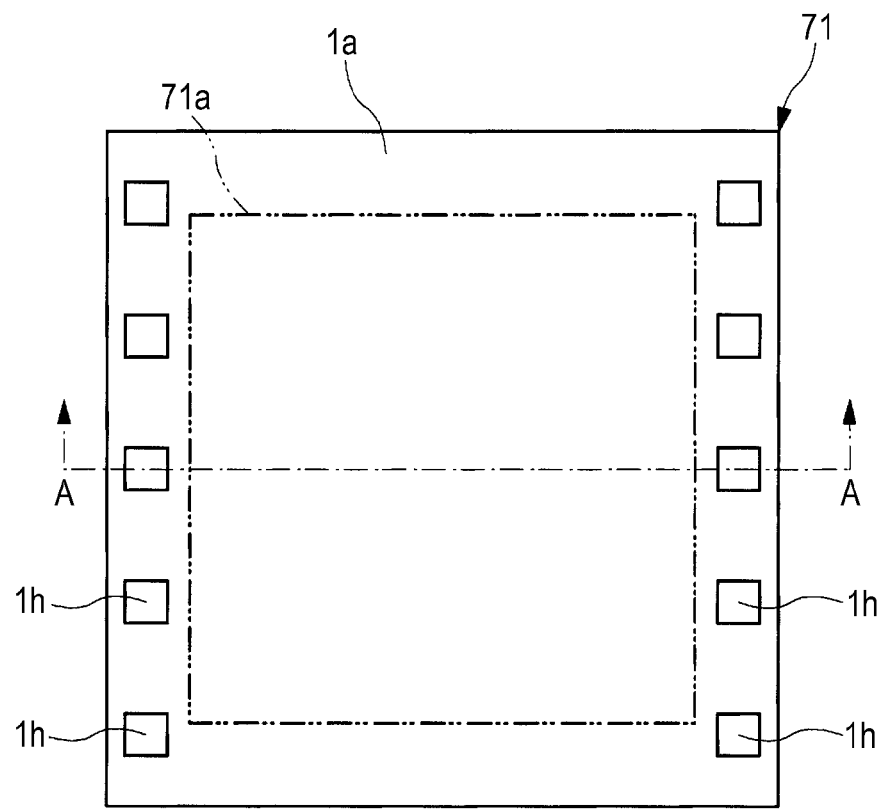
FIG. 46 is a plan view showing a front surface side of a sensor chip in a modified example corresponding to FIG. 1.
Figure 47:
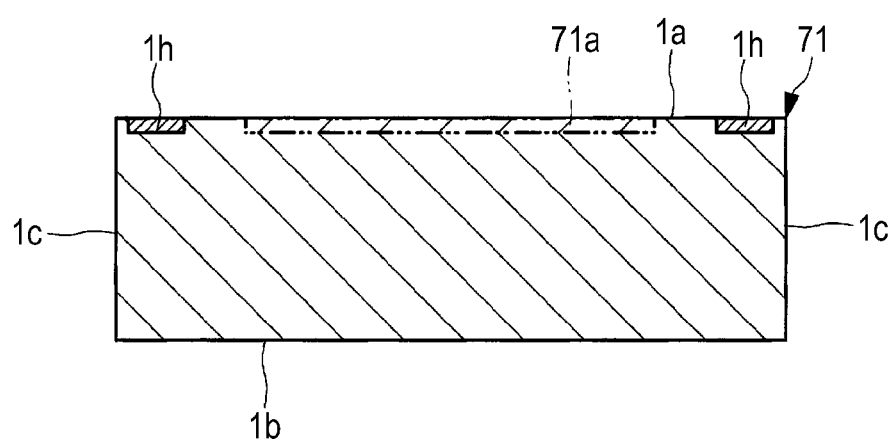
FIG. 47 is a cross-sectional view taken along the line A-A of FIG. 46.
Figure 58:
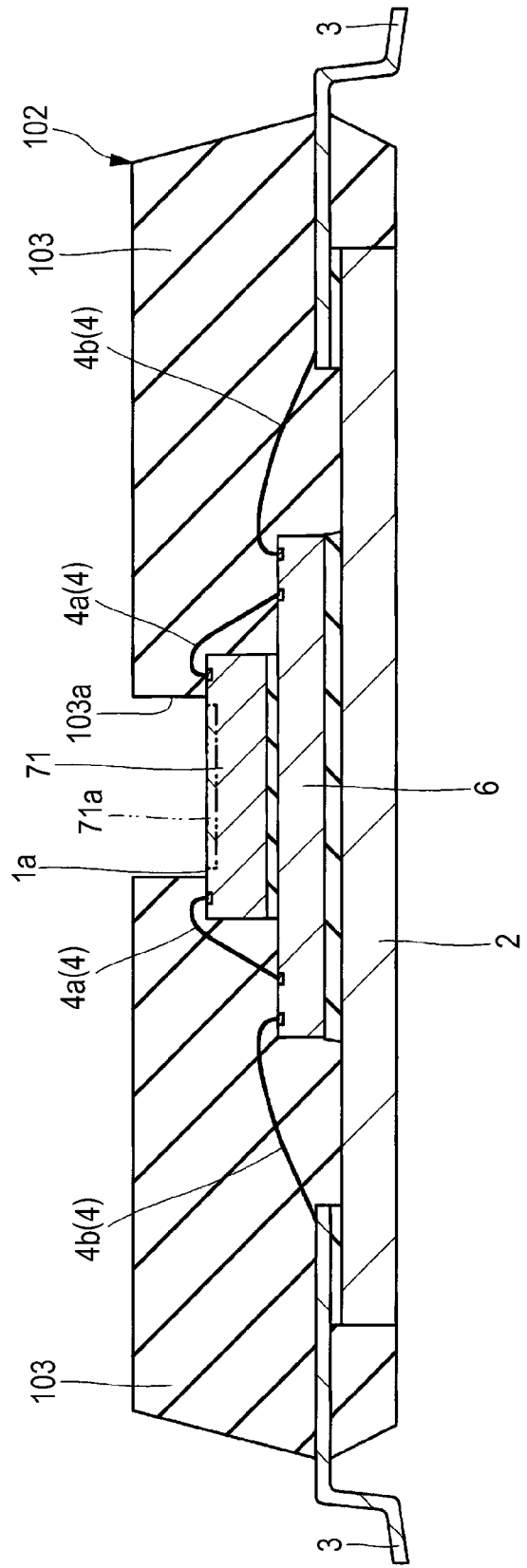
FIG. 58 is a cross-sectional view of a semiconductor device in another comparative example corresponding to FIG. 45.

FIG. 44 is a plan view showing a semiconductor device as a modified example corresponding to FIG. 4. FIG. 45 is a cross-sectional view of a semiconductor device as another modified example corresponding to FIG. 6. FIG. 46 is a plan view showing a front surface side of a sensor chip as a modified example shown in FIG. 1. FIG. 47 is a cross-sectional view taken along the line A-A of FIG. 46. FIG. 58 is a cross-sectional view of a semiconductor device in a comparative example corresponding to FIG. 45.

A QFP (semiconductor device) 70 shown in FIGS. 44 and 45 differs from the QFP 10 described in the first embodiment with reference to FIGS. 4 to 9 in that a sensor chip (optical sensor chip, or semiconductor chip) 71 is mounted over the cap 2 (specifically, over the control chip 6). Like the sensor chip 1 shown in FIG. 2, the sensor chip 71 includes a front surface (main surface) 1*a*, a back surface (main surface) 1*b* opposite to the front surface 1*a*, and sides 1*c* positioned between the front surface 1*a* and the back surface 1*b*. The sensor chip 71 is an optical sensor chip that detects light (for example, visible light) applied to the front surface 1*a* side with a light receiving surface and which then converts the applied light into an electric signal to output the signal. As shown in FIGS. 46 and 47, the sensor chip 71 has a light receiving region 71*a* having a plurality of light emitting elements (sensor circuit) for receiving the light of interest to be sensed on the front surface 1*a* side. The sensor chip 71 has a signal conversion circuit formed therein. The signal conversion circuit is electrically connected with the light receiving element, and adapted to convert a light signal into an electric signal to output the electric signal therefrom. The signal conversion circuit (sensor circuit) is electrically connected with a plurality of pads 1*h* formed on the front surface 1*a* side of the sensor chip 71. The sensor chip 71 is the optical sensor chip, and hence does not have any movable portion, such as a plumb part 1*g*, described using FIGS. 1 to 3.

The QFP (semiconductor device) 70 shown in FIGS. 44 and 45 has the sensor chip 71 mounted thereon as the optical sensor chip. Thus, a cap 72 arranged to cover the front surface 1*a* side of the sensor chip 71 differs from the cap 5 described in the first embodiment shown in FIGS. 4 to 7 in the following structural points. That is, as shown in FIG. 45, the cap 72 includes a transparent portion (transparent member) 73 which is transparent with respect to the light of interest to be sensed by the sensor chip 71, and a support portion (support member) 74 for supporting the transparent portion 73. The transparent portion 73 is arranged over the light receiving region 71*a* of the sensor chip 71. The transparent portion 73 is comprised of material having a low energy absorption rate with respect to the light of interest to be sensed (for example, visible light), as compared to the sealing member 9 (that is, having a high light transmission rate of the light of interest to be sensed as compared to the sealing member 9), for example, glass in this embodiment. In contrast, the support portion 74 has the same structure as that of the cap 5 described in the first embodiment except that an opening 74*b* is formed at the center of the cavity 5*d* (over the light receiving region 71*a* of the sensor chip 71). Thus, the parts of this embodiment common to those of the cap 5 in this embodiment are designated by the same reference characters, and its redundant description will be omitted below. An upper surface 74*a* of the support portion 74 corresponds to the upper surface 5*a* of the cap 5 shown in FIG. 6. In this embodiment, an assembly of the transparent portion 73 and the support portion 74 is defined as the cap 72, and hence the upper surface 74 is different from the upper surface 5*a* of the cap 72. Thus, in each drawing of this embodiment, the upper surface of the transparent portion 73 is defined as the upper surface 5*a*. As shown in FIG. 44, the opening 74*b* of the support portion 74 is arranged at the center of the upper surface 5*a*, and has a planar size that is wider than that of the light receiving region 71*a* of the sensor chip 71. In this embodiment, the planar size of the opening 74*b* is wider or larger than that of the surface 1*a* of the sensor chip 1. Thus, the entire surface 1*a* of the sensor chip 71 can be viewed within the opening 74*b* via the transparent portion 73. The cap 72 with the above structure permits the light applied to the upper surface 5*a* side of the cap 72 to reach the light receiving region of the sensor chip 71 via the transparent portion 73 and the space 8 (see FIG. 45). By way of example, referring to FIGS. 44 and 45, the transparent portion 73 as a flat plate member and the support portion 74 are formed separately from each other so as to enable the easy process of the transparent portion 73 made of a glass plate. On the other hand, in a modified example, the transparent portion 73 and the support portion 74 can be formed integrally with each other.

When the light of interest to be sensed reaches the light receiving region 71*a* via the transparent portion 73 and the space 8 shown in FIG. 45, the light is refracted because of a difference in refractive index between the transparent portion 73 and the gas (for example, air) inside the space 8. A way to suppress the refraction of the light involves not positioning any member over the light receiving region 71*a*. When the wires 4 are coupled to the sensor chip 71, it is necessary to protect the wires 4. Like the QFP 102 as the comparative example shown in FIG. 58 has an opening 103*a* formed at the center of a sealing member 103. From the opening 103*a*, a light receiving region 71*a* of the sensor chip 71 is exposed. In this case, the wires 4 are sealed with the sealing member 103 which is a resin member, and thus can be protected. In the QFP 102, however, a part of the sealing member 103 around the opening 103*a* interrupts or reflects a part of the light of interest to be detected. From the viewpoint of stably supplying much light to the light receiving region 71*a*, the sealing material 103 becomes an inhibitor.

In contrast, the cap 72 of the QFP 70 of this embodiment is arranged over the cap 2 so as to cover the sensor chip 71, the control chip 6, and the wires 4, and thus serves as a protective member for protecting the wires 4. In the QFP 70, the entire surface 1*a* of the sensor chip 71 can be viewed through the opening 74*b* of the support portion 74, so that the amount of light received by the light receiving region 71*a* can be increased as compared to the QFP 102 shown in FIG. 58. The light receiving region 71*a* of the QFP 70 can be spaced apart from the sealing member 9, which can reduce the influence of reflection from the sealing member 9. The light receiving region 71*a* is spaced apart from the support portion 74 by widening the opening 74*b*, so that the influence of reflection of the support portion 74 can be reduced. The entire surface 1a of the sensor chip 71 can be viewed in the QFP 70, which can easily observe the coupling state of the wires 4. The cap 72 is formed separately from the sensor chip 71, which can easily attach functional members, such as a lens. For example, the attachment of a lens (not shown) (light collecting member) to the transparent portion 73 shown in FIG. 45 can further increase the amount of light received by the light receiving region 71a. The attachment of an optical filter film (photoselective member)(not shown) to the transparent portion 73 can easily remove light other than the light of interest to be sensed before the light reaches the light receiving region 71a.

Different Points in Manufacturing Method of Semiconductor Device Structure

Now, a manufacturing method of the QFP 70 shown in FIGS. 44 and 45 will be described below. Also in this section, different points from the manufacturing method of the semiconductor device described in the first embodiment will be mainly described, and the description of parts common to those of the first embodiment will be omitted below. In the cap bonding step described in the first embodiment, the QFP 70 can be manufactured in the same way as the first embodiment by previously forming the cap 72 by the assembly of the transparent portion 73 and the support portion 74 as shown in FIG. 45. In this case, in the manufacturing method of the QFP 10 described in the first embodiment, the sensor chip 1 can be replaced by the sensor chip 71, and the cap 5 can be replaced by the cap 72, and thus a description thereof will be omitted below. This embodiment will describe an illustrative embodiment in which the cap 72 is assembled over the lead frame, as a modified example of the above-mentioned manufacturing method.

Figure 48:
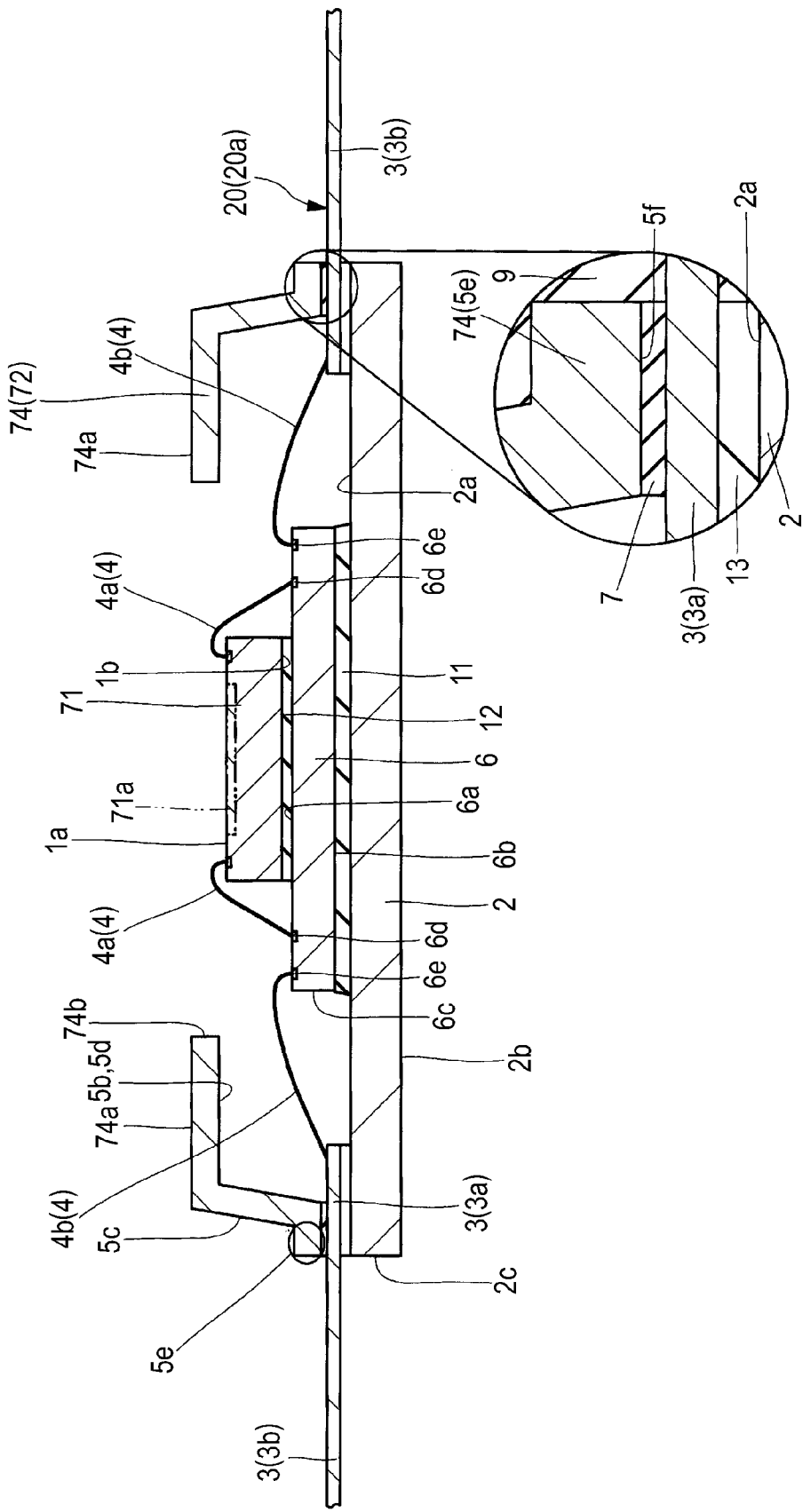
FIG. 48 is an enlarged cross-sectional view showing the state in which a support portion is mounted on the cap in a modified example corresponding to FIG. 21.
Figure 49:
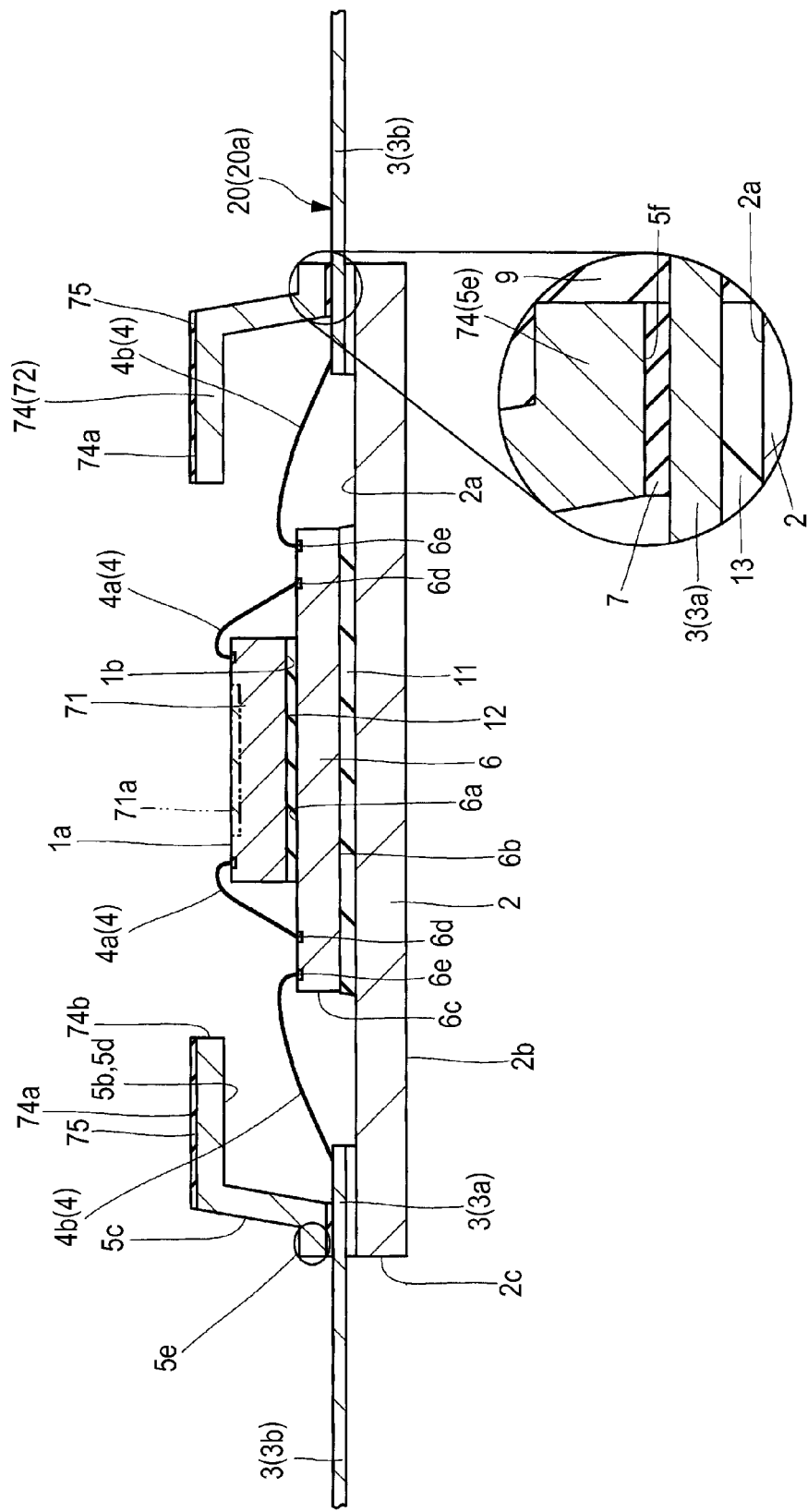
FIG. 49 is an enlarged cross-sectional view showing the state in which an adhesive is applied to the support portion shown in FIG. 48.
Figure 50:
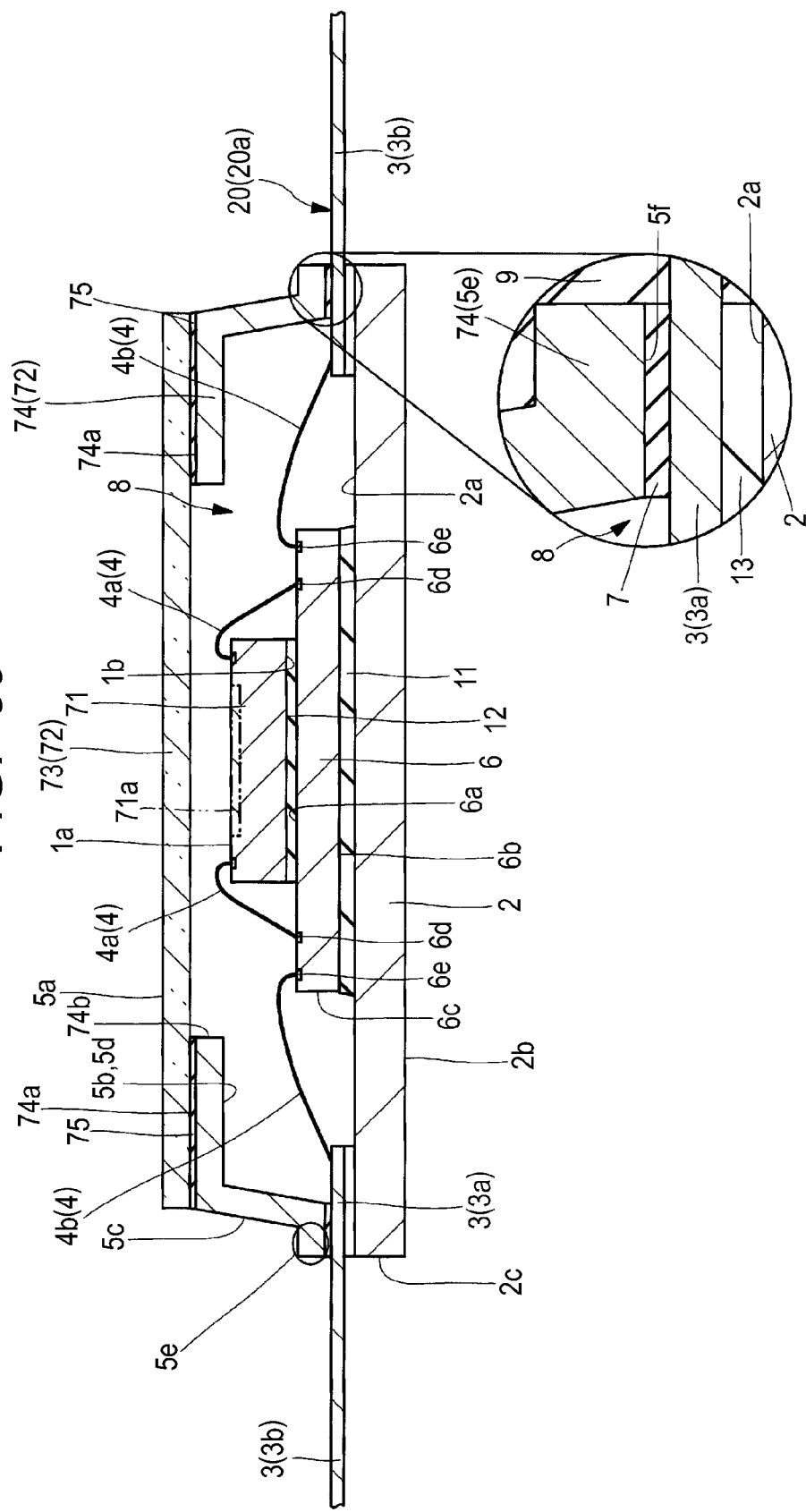
FIG. 50 is an enlarged cross-sectional view showing the state in which a transparent portion is mounted on the support portion shown in FIG. 49.

The manufacturing process of the QFP 70 in embodiment differs from the first embodiment in the following point of the cap bonding step shown in FIG. 10. That is, as shown in FIGS. 48 to 50, in the cap bonding step of this embodiment, the support portion 74 and the transparent portion 73 are laminated and mounted in that order to assemble the cap 72 over the lead frame 20. This embodiment is the same as the first embodiment except for the above points. FIGS. 48 to 50 are enlarged cross-sectional views of a modified example corresponding to FIG. 21. FIG. 48 is an enlarged cross-sectional view showing the state in which the support portion is mounted. FIG. 49 is an enlarged cross-sectional view showing the state in which the adhesive is applied over the support portion shown in FIG. 48. FIG. 50 is an enlarged cross-sectional view showing the state in which a transparent portion is mounted over the support portion shown in FIG. 49.

In the cap bonding step of this embodiment, first, as shown in FIG. 48, a support portion 74 foaming the cap 72 is mounted over the cap 2. A method for mounting the support portion 74 is the same as a method for mounting the cap 5 as described in the first embodiment, and thus a repeated description thereof will be omitted below. Then, as shown in FIG. 49, an adhesive 75 is applied (arranged) over an upper surface 74a of the support portion 74. The adhesive 75 is a fixing member for fixing the support portion 74 to the transparent portion 73 shown in FIG. 45. The adhesive member 75 is not limited to a specific one as long as the adhesive member has enough strength to fix the transparent portion 73 to the support portion 74. Then, as shown in FIG. 50, the transparent portion 73 is arranged over the support member 74, and bonded and secured to the support portion 74 via the adhesive 75. Thus, the support portion 74 is integral with the transparent portion 73 to thereby form the space 8 which is a sealed space incorporating therein the sensor chip 71, the control chip 6, and the wires 4.

In this embodiment, the support portion 74 is provided separately from the transparent portion 73, whereby the transparent portion 73 can be comprised of a plate-like member. Thus, the transparent portion 73 made of glass can also be easily processed. The support portion 74 is comprised of, for example, kovar. The support portion 74 can be formed, for example, by the press process, like the cap 5 described in the first embodiment. The opening 74b of the support portion 74 can also be formed by the press process. Like this embodiment, the illustrative embodiment in which the cap 72 is assembled over the lead frame enables the assembly using an existing bonding equipment. This embodiment is preferable because the cap 72 can be manufactured without introducing a new manufacturing equipment. Although FIGS. 48 to 50 show the embodiment in which the paste-like adhesive 75 is applied over the support portion 74, various modified examples can be applied. For example, the film-like adhesive can be previously bonded to one or both of the upper surface 74a of the support member 74 and the lower surface of the transparent portion 73.

The semiconductor device and the manufacturing method thereof in this embodiment is the same as those described in the first embodiment except for the above different points. Thus, a redundant description thereof will be omitted below, and the aspects of the invention described in the first embodiment except for the above different points can be applied. This embodiment has described a modified example of the first embodiment, and can be applied in combination with the second embodiment.

Other Modified Examples

Although the invention made by the inventors has been specifically described based on the embodiments, it is apparent that the invention is not limited to the disclosed embodiments, and that various modifications can be made without departing from the scope of the invention.

Figure 51:
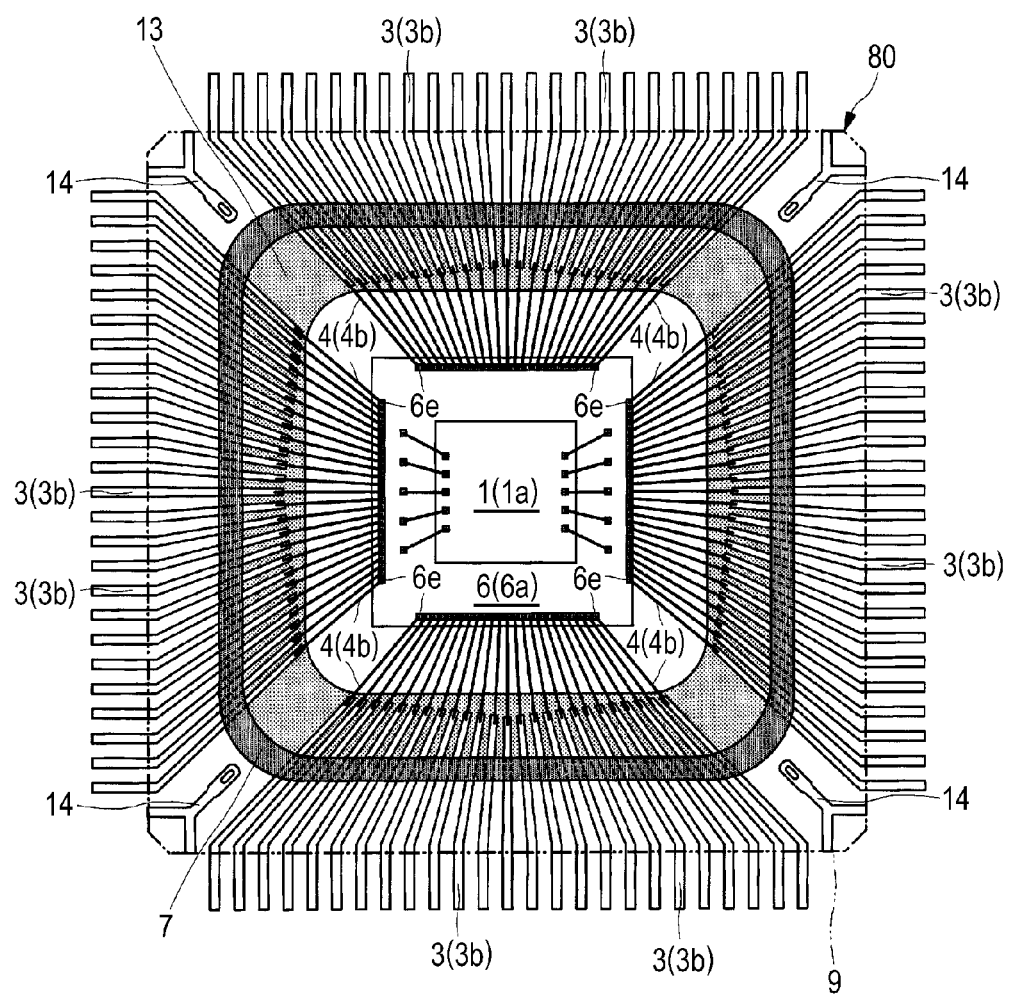
FIG. 51 is a cross-sectional view showing a semiconductor device in a modified example corresponding to FIG. 8.

For example, the first embodiment has described the wiring layout. Specifically, as shown in FIGS. 8 and 9, the pads 6e (see FIG. 9) are arranged along two sides opposed to each other among four sides included in the control chip 6, and the leads 3 located in positions opposed to the pads 6e are coupled to the wires 4b. The number of wires 4 and the wiring layout, however, can be appropriately changed according to the number of necessary external terminals. For example, like a QFP (semiconductor device) 80 shown in FIG. 51 as a modified example corresponding to FIG. 8, when the pads 6e are respectively arranged on the four sides of the control chip 6, each pad 6e can be coupled to the corresponding lead 3 opposed to the pad 6e via the wire 4. The above modified example can be applied in combination with the second or third embodiment.

The above embodiments and the respective modified examples have described the QFP as one example of a semiconductor device package type including the semiconductor chip arranged in the space formed inside the sealing member, and various modified examples can be applied. For example, like a semiconductor device 81 shown in FIG. 52 as a comparative example corresponding to FIG. 6, the so-called quad flat non-leaded package (QFN) type semiconductor device can be applied in which the outer lead parts 3b of the leads 3 are exposed from the lower surface of the sealing member 9. The semiconductor device 81 is the same as the QFP 10 described in the first embodiment except that the outer lead parts 3b of the leads 3 are respectively exposed from the lower surface of the sealing member 9. The QFN-type semiconductor device causes the outer lead parts 3b to be exposed from the lower surface of the sealing member 9, so that the semiconductor device can be mounted without protruding the outer lead part from the side of the sealing member 9, like the QFP. Thus, the QFN-type semiconductor device can decrease a mounting area as compared to that of the QFP-type semiconductor device.

Figure 53:
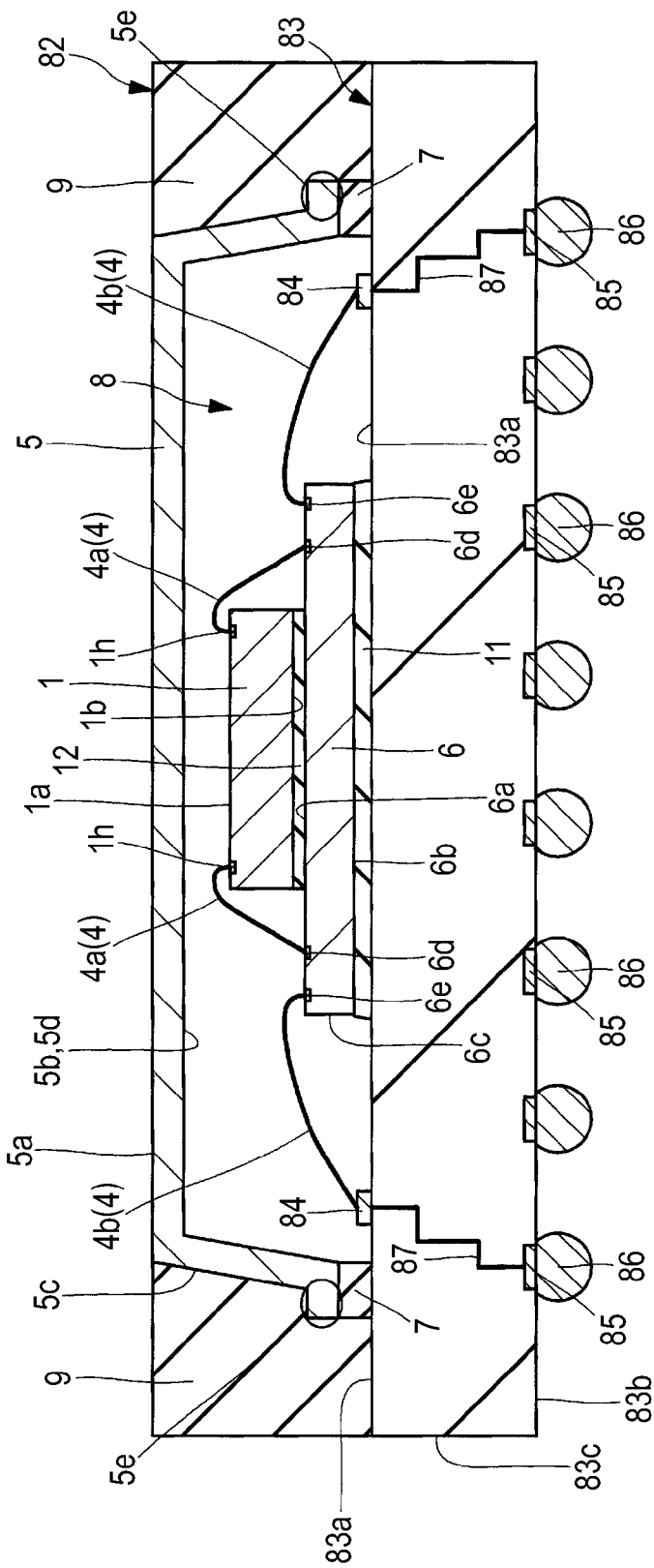
FIG. 53 is a cross-sectional view showing a semiconductor device in another modified example corresponding to FIG. 6.

For example, the lead frame type semiconductor device using the lead frame as a base for mounting the semiconductor chip has been described in the above embodiments and the respective modified examples. However, like a semiconductor device 82 shown in FIG. 53 as another modified example corresponding to FIG. 6, a wiring board type semiconductor device can be applied in which the sensor chip 1 is mounted over a wiring board 83. The wiring board 83 includes an upper surface (chip mounting surface) 83a, a lower surface (mounting surface) 83b opposite to the upper surface 83a, and sides 83c positioned between the upper surface 83a and the lower surface 83b. The control chip 6 and the sensor chip 1 are mounted over the upper surface 83a of the wiring board 83. Over the upper surface 83a, bonding leads (terminals) 84 are arranged to be electrically connected with the control chip 6 and the sensor chip 1 via the wires 4. The bonding leads 84 are arranged around the sensor chip 1 (and control chip 6). A plurality of lands (external terminals) 85 serving as an external terminal of the semiconductor device 82 is provided at the lower surface 83b of the wiring board 83. Each of the lands 85 is coupled to a solder ball (external terminal, or protruding electrode) 86. The lands 85 are electrically connected with the bonding leads 84 on the upper surface 83a side via a plurality of wirings 87 included in the wiring board 83. The wiring board type semiconductor device can effectively use the lower surface 83b of the wiring board 83 as an arrangement space of the external terminal. Thus, even when the number of external terminals is increased, the increase in mounting area can be suppressed. For example, the semiconductor device including the lands 85 arranged as the external terminal in a matrix over the lower surface 83b of the wiring board 83 is called especially, an "area array type semiconductor device." As shown in FIG. 53, a semiconductor device 82 including a plurality of lands 85 joined to solder balls 86 is called a "ball grid array (BGA) type semiconductor device 82". A semiconductor device not including the solder balls 86 bonded to the respective lands 85, or having a solder material the used amount of which is smaller than that of the solder ball 86 is called a "land grid array (LGA) type semiconductor device". In application of the wiring board type semiconductor device shown in FIG. 53, the cap 5 is mounted over the upper surface 83a which is a chip mounting surface. Specifically, the joint part between the flange 5e of the cap 5 and the upper surface 83a of the wiring board 83 is sealed and bonded together by the sealing material 7.

In the manufacturing method of the wiring board type semiconductor device 82, the sealing member 9 is formed such that each of the upper surface 5a of the cap 5 and the lower surface 83b of the wiring board 83 is not exposed from the sealing member 9 in the sealing step of forming the sealing member 9, which can prevent or suppress the cap deformation phenomenon described in the first embodiment. The cap 5 is arranged over the wiring board 83. The exposure of the upper surface 5a of the cap 5 and the lower surface 83b of the wiring board 83 can decrease the pressure acting in the direction of crushing the cap 5 (in the direction toward the space 8). The modified examples described in FIGS. 52 and 53 have been explained as a modified example of the QFP 10 described in the first embodiment, and can be applied in combination with the third embodiment.

For example, although the QFP 65 having only one sensor chip 1 mounted in the package has been explained as the modified example of the second embodiment, the invention can be applied to a semiconductor device having only one sensor chip 1 or 71 mounted thereon as a modified example of the first or third embodiment. In this way, when the semiconductor device having only the sensor chip mounted thereon is driven, another semiconductor device (control chip or package having a control chip mounted thereon) having a control circuit for controlling the sensor chip formed thereat is provided, and the semiconductor device with the sensor chip can be driven by electrically connecting the sensor chip with the control circuit. From the viewpoint of a decrease in mounting area, a semiconductor device including a laminate of semiconductor chips is preferably used.

Figure 54:
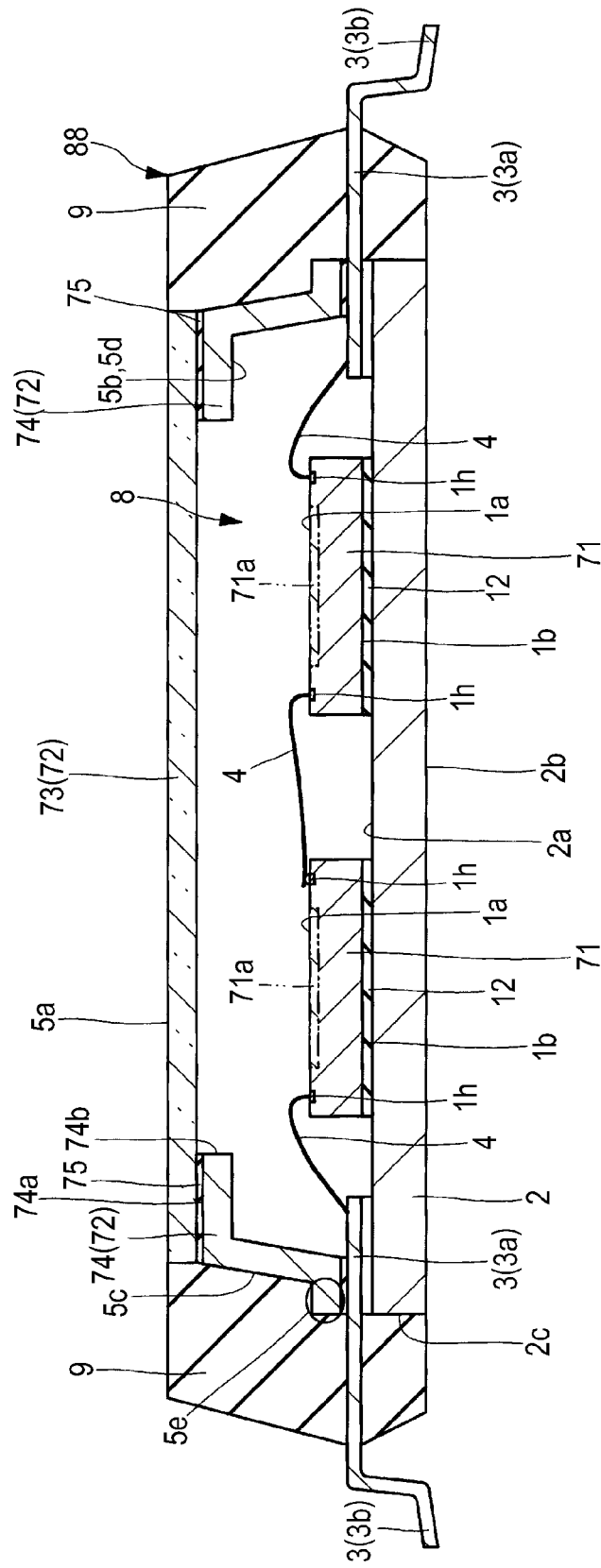
FIG. 54 is a cross-sectional view showing a semiconductor device in a modified example corresponding to FIG. 45.

For example, although the first to third embodiments have described the semiconductor device having a laminate of semiconductor chips mounted thereover, a plurality of semiconductor chips (sensor chips 71 shown in FIG. 54) can be arranged in parallel over the chip mounting portion inside the cavity 5d, like a semiconductor device 88 shown in FIG. 54 which is a modified example corresponding to FIG. 45. In particular, when the optical sensor chips (sensor chips 71) are arranged in parallel as shown in FIG. 54, an opening 74b whose width is more than the total width of the surfaces 1a of the sensor chips 71 can be formed, so that the amount of light received by the light receiving region 71a of each sensor chip 71 can be increased.

Figure 52:
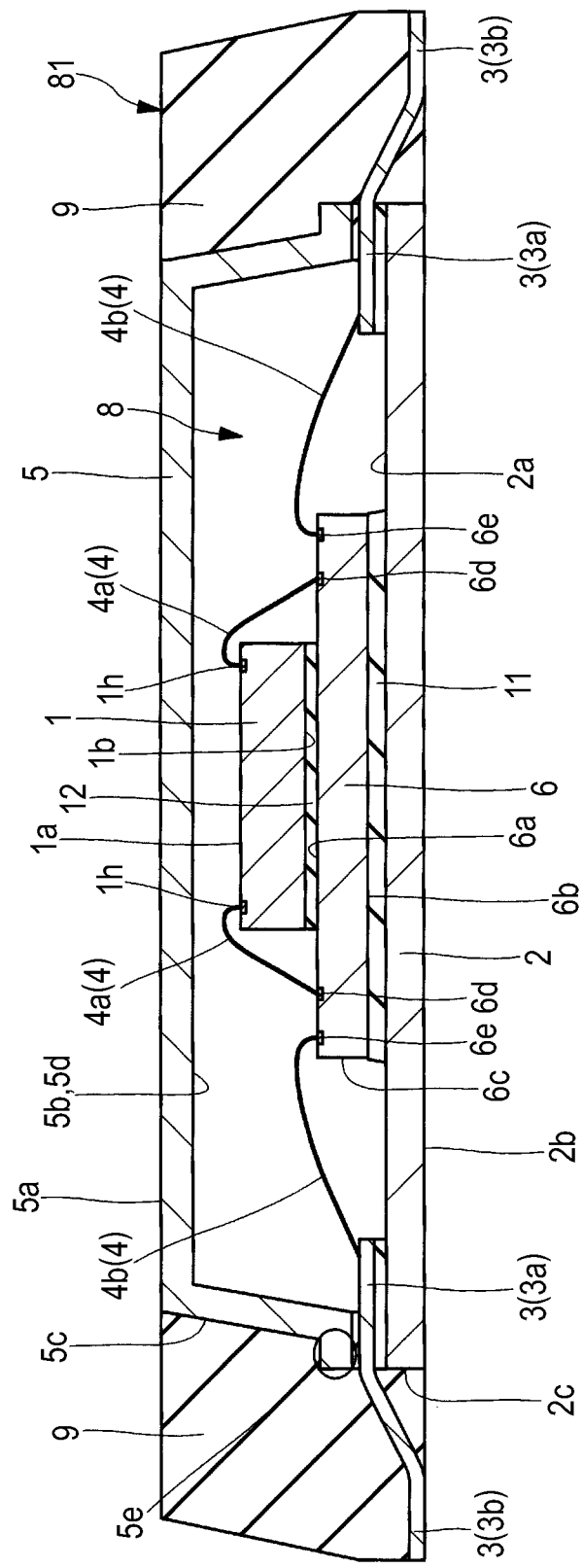
FIG. 52 is a cross-sectional view showing a semiconductor device in a modified example corresponding to FIG. 6.
Figure 55:
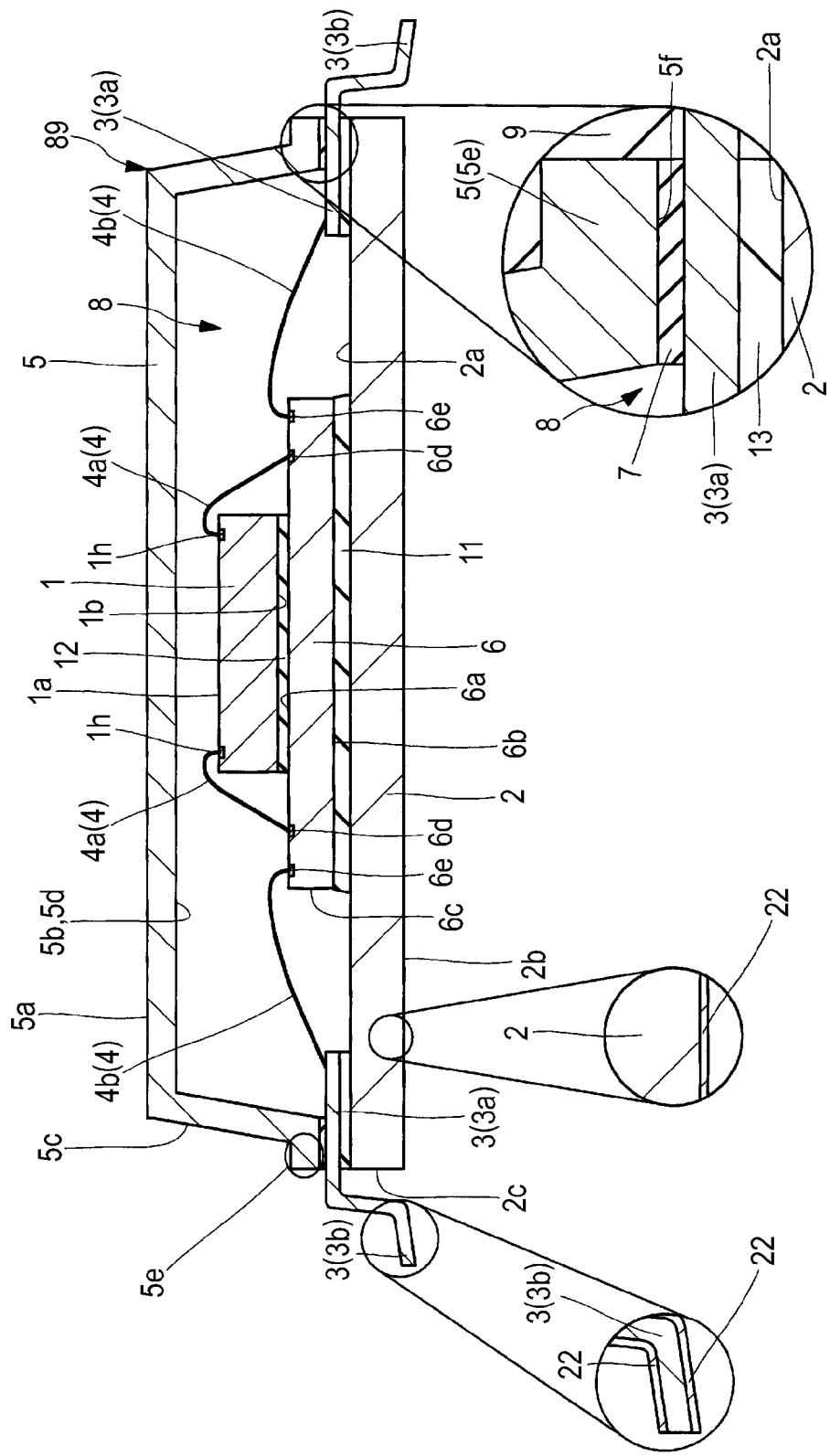
FIG. 55 is a cross-sectional view showing a semiconductor device in a modified example corresponding to FIG. 6, FIG. 45, FIG. 52, FIG. 53 and FIG. 54.
Figure 56:
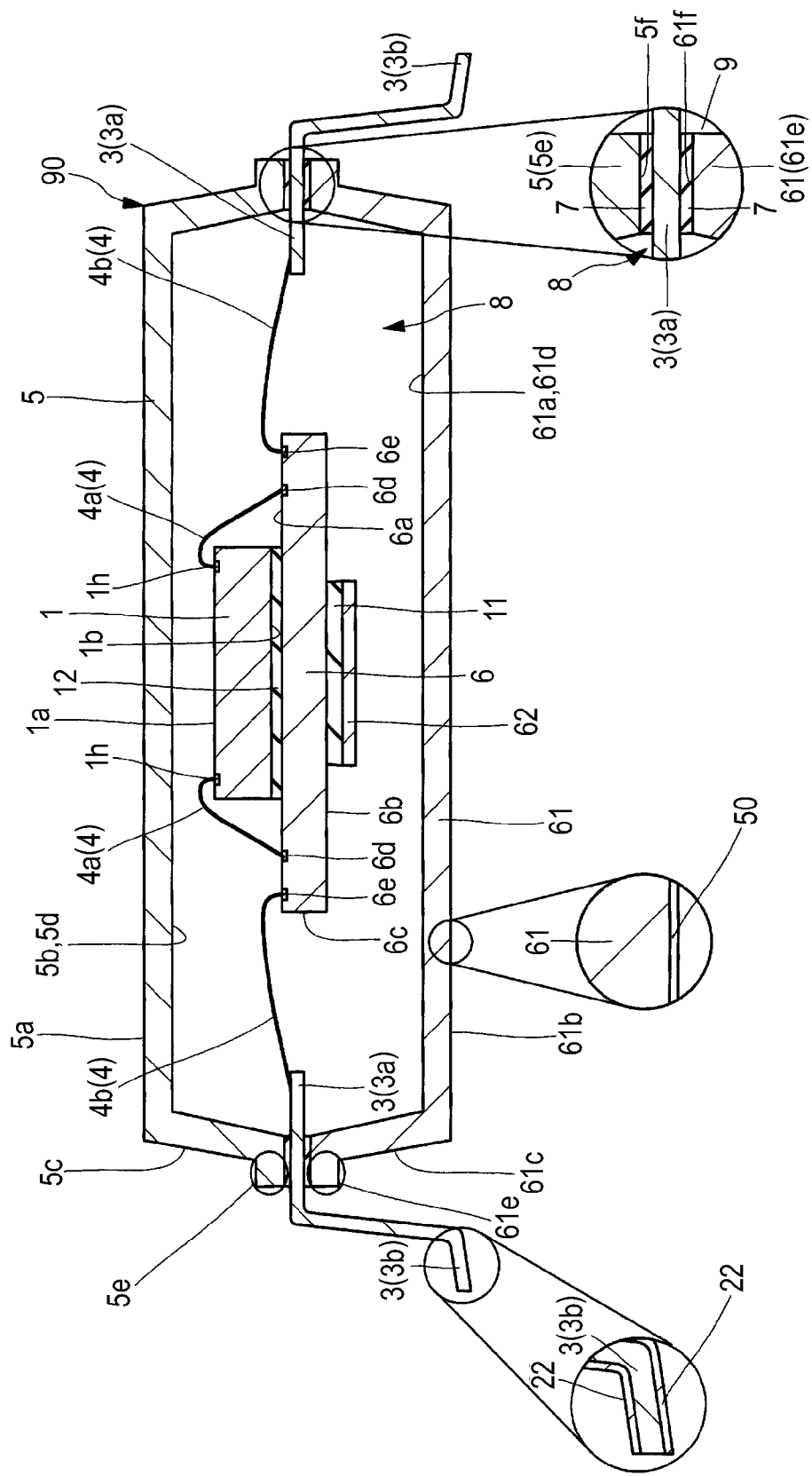
FIG. 56 is a cross-sectional view showing a semiconductor device in a modified example corresponding to FIG. 34.

For example, the first to third embodiments, and the modified examples respectively shown in FIGS. 52 to 54 have described the semiconductor devices including the joint part between the base (cap 2, cap 61, and wiring board 83) and the cap 5 sealed with resin (sealing member 9). On the other hand, the invention can provide a semiconductor device 89 shown in FIG. 55 which is the modified example corresponding to each of FIGS. 6, 45, 52, 53, and 54, and the semiconductor device 90 shown in FIG. 56 which is the modified example corresponding to FIG. 34. In the semiconductor devices 89 and 90 shown in FIGS. 55 and 56, the space 8 is formed by superimposing the cap 2 (or cap 5) on the cap 5 (or cap 61) without forming the sealing member 9 (see FIGS. 6 and 34), and the space 8 is sealed with the sealing material 7 (and adhesive 13). The joint part between the caps 2 and 5 (or caps 5 and 61) is bonded and secured together by the sealing material 7 (and adhesive 13). In other words, the joint part (for example, flanges 5e and 61e) between the caps 2 and 5 (or caps 5 and 61) is sealed with the sealing material 7 (and adhesive 13) comprised of resin. When the embodiments is structured without having the sealing member 9 (see FIGS. 6 and 34), like the semiconductor device 89 and 90, the length of the lead 3 can be shortened as shown in FIGS. 55 and 56. For example, the package (semiconductor device) can reduce its planar size as compared to, for example, the QFP 10 shown in FIG. 6 and the QFP 60 shown in FIG. 34. That is, the mounting area of the package (semiconductor device) can be decreased.

The joint strength between the caps 2 and 5 (or caps 5 and 61) without having the sealing member 9 is lower than that of the QFP 10 shown in FIG. 6 and the QFP 60 shown in FIG. 34. In order to suppress the break of the joint part, an increase in strength of the sealing material 7 and the adhesive 13 would degrade the sealing properties between (in a gap between) the caps 2 and 5 (or caps 5 and 61). From the viewpoint of improving the joint strength between the caps 2 and 5 (or caps 5 and 61), or securely filling a space between (gap between) the caps 2 and 5 (or caps 5 and 61), the joint part between the cap 5 and the base is preferably sealed with resin (sealing member 9), like the modified examples described in the first to third embodiments and shown in each of FIGS. 52 to 54.

The invention can be applied to a semiconductor device including a semiconductor chip, such as a sensor chip, arranged in a space formed in a sealing material comprised of resin.

What is claimed is:

1. A manufacturing method of a semiconductor device, comprising the steps of:
    (a) providing a first member including a first upper surface, and a first lower surface opposite to the first upper surface;
    (b) mounting a semiconductor chip including a front surface, a plurality of electrode pads formed on the front surface, and a back surface opposite to the front surface, over the first upper surface of the first member;
    (c) electrically connecting the electrode pads of the semiconductor chip with a plurality of terminals arranged around the semiconductor chip via a plurality of wires;
    (d) after the step (c), arranging a second member including a second upper surface, a second lower surface opposite to the second upper surface, and a space formation portion formed on the second lower surface side, over the first upper surface of the first member, and bonding the first upper surface of the first member to an adhesive surface provided outside the space formation portion of the second member via a sealing material, and forming a space so as to house the semiconductor chip and the wires in between the first member and the second member; and
    (e) after the step (d), sealing a joint part between the first member and the second member with resin such that essentially an entirety of the second upper surface of the second member and essentially an entirety of the first lower surface of the first member are respectively exposed, wherein the space is not filled with the resin.

2. The manufacturing method of a semiconductor device according to claim 1, wherein the step (e) includes the step of supplying a resin for sealing to the first member and the second member arranged in a molding die type cavity, and applying a pressure to the resin for sealing.

3. The manufacturing method of a semiconductor device according to claim 2,
    wherein in the step (c), the wires are respectively bonded to bonding regions of the terminals, and
    wherein the bonding regions of the terminals are arranged over the first upper surface of the first member.

4. The manufacturing method of a semiconductor device according to claim 3,
    wherein the second member has a flange arranged to enclose the space formation portion and having the adhesive surface, and
    wherein the flange protrudes toward an outside of the space formation portion.

5. The manufacturing method of a semiconductor device according to claim 4, wherein the step (b) comprises the steps of:
    (b1) respectively providing a first semiconductor chip and a second semiconductor chip, said first semiconductor chip including a sensor circuit formed therein, and having a first front surface, a plurality of first electrode pads formed at the first front surface, and a first back surface opposite to the first front surface, said second semiconductor chip including a control circuit formed therein for controlling the first semiconductor chip, and having a second front surface, a plurality of second electrode pads formed at the second front surface, and a second back surface opposite to the second front surface;
    (b2) mounting the second semiconductor chip over the first member via a first adhesive; and
    (b3) mounting the first semiconductor chip over the second front surface of the second semiconductor chip via a second adhesive.

6. The manufacturing method of a semiconductor device according to claim 5, wherein the first member is a plate-like member comprised of a plate-like metal material, and the terminals are bonded to the first upper surface of the first member via an insulating adhesive.

7. The manufacturing method of a semiconductor device according to claim 6,
    wherein the step (d) includes the steps of:
    (d1) arranging the second member such that each of the terminals extends from an inner side of the space of the second member toward an outside of the space; and
    (d2) embedding the sealing material in between the adjacent terminals,
    wherein the sealing material and the first adhesive respectively have paste-like properties, and a viscosity of the sealing material is lower than that of the first adhesive.

8. The manufacturing method of a semiconductor device according to claim 2, wherein the semiconductor chip includes a movable portion, and a sensor circuit electrically connected with the movable portion.

9. The manufacturing method of a semiconductor device according to claim 2,
    wherein the semiconductor chip includes a light receiving region with a plurality of light receiving elements formed therein, and a sensor circuit electrically connected with the light receiving elements, and
    wherein the second member includes a transparent portion arranged over the light receiving region of the semiconductor chip, and a support portion for supporting the transparent portion.

10. The manufacturing method of a semiconductor device according to claim 9,
    wherein the support portion is formed of metal material, and includes an upper surface for supporting the transparent portion, and an opening formed over the light receiving region of the semiconductor chip, and
    wherein the opening is formed widely than the front surface of the semiconductor chip.

* * * * *